(12) United States Patent
Horie

(10) Patent No.: US 6,980,693 B2
(45) Date of Patent: Dec. 27, 2005

(54) METHOD AND APPARATUS FOR IMAGE CODING

(75) Inventor: Hitoshi Horie, Ageo (JP)

(73) Assignee: Panasonic Communications Co., Ltd., Fukuoka (JP)

(*) Notice: Subject to any disclaimer, the term of this patent is extended or adjusted under 35 U.S.C. 154(b) by 694 days.

(21) Appl. No.: 10/046,827

(22) Filed: Jan. 17, 2002

(65) Prior Publication Data

US 2002/0114527 A1  Aug. 22, 2002

(30) Foreign Application Priority Data

Feb. 22, 2001  (JP) .............................. 2001-047068

(51) Int. Cl.[7] .............................................. G06K 9/36
(52) U.S. Cl. ...................... 382/232; 382/237; 382/239; 382/240
(58) Field of Search ................ 382/240, 232, 382/237, 239; 348/395.1; 375/240.19; 358/443; 345/419, 538, 537, 557, 539, 572

(56) References Cited

U.S. PATENT DOCUMENTS

| 4,965,751 | A | * | 10/1990 | Thayer et al. .............. 345/572 |
| 5,029,105 | A | * | 7/1991 | Coleman et al. ............ 345/539 |
| 5,131,080 | A | * | 7/1992 | Fredrickson et al. ........ 345/557 |
| 5,170,468 | A | * | 12/1992 | Shah et al. ................. 345/537 |
| 5,263,136 | A | * | 11/1993 | DeAguiar et al. ........... 345/538 |
| 5,335,088 | A | * | 8/1994 | Fan ............................. 382/237 |
| RE36,145 | E | * | 3/1999 | DeAguiar et al. ........... 345/538 |
| 6,343,155 | B1 | * | 1/2002 | Chui et al. .................. 382/240 |
| 6,347,157 | B2 | * | 2/2002 | Chui ........................... 382/240 |
| 6,717,576 | B1 | * | 4/2004 | Duluk et al. ................ 345/419 |
| 6,778,709 | B1 | * | 8/2004 | Taubman ..................... 382/240 |

FOREIGN PATENT DOCUMENTS

| JP | 8-51537 | 2/1996 | ............ H04N 1/40 |
| JP | 11289461 | 10/1999 | ............ H04N 1/41 |

OTHER PUBLICATIONS

English Language Abstract of JP 11-289461.
English Language Abstract of JP 8-51537.

* cited by examiner

*Primary Examiner*—Anh Hong Do
(74) *Attorney, Agent, or Firm*—Greenblum & Bernstein, P.L.C.

(57) ABSTRACT

An image coding method that compresses an image read through an optical system. An image separation section carries out image area decisions in tile (macro block) units to separate the image into photographic image tiles and character image tiles. A layer separation section performs layer separation pixel by pixel to separate each pixel into pixels belonging to a background and pixels belonging to a foreground. Approximation processors alleviate an increase of entropy, due to layer separation through approximation processing, and carry out JPEG-like processing on photographic images.

13 Claims, 37 Drawing Sheets

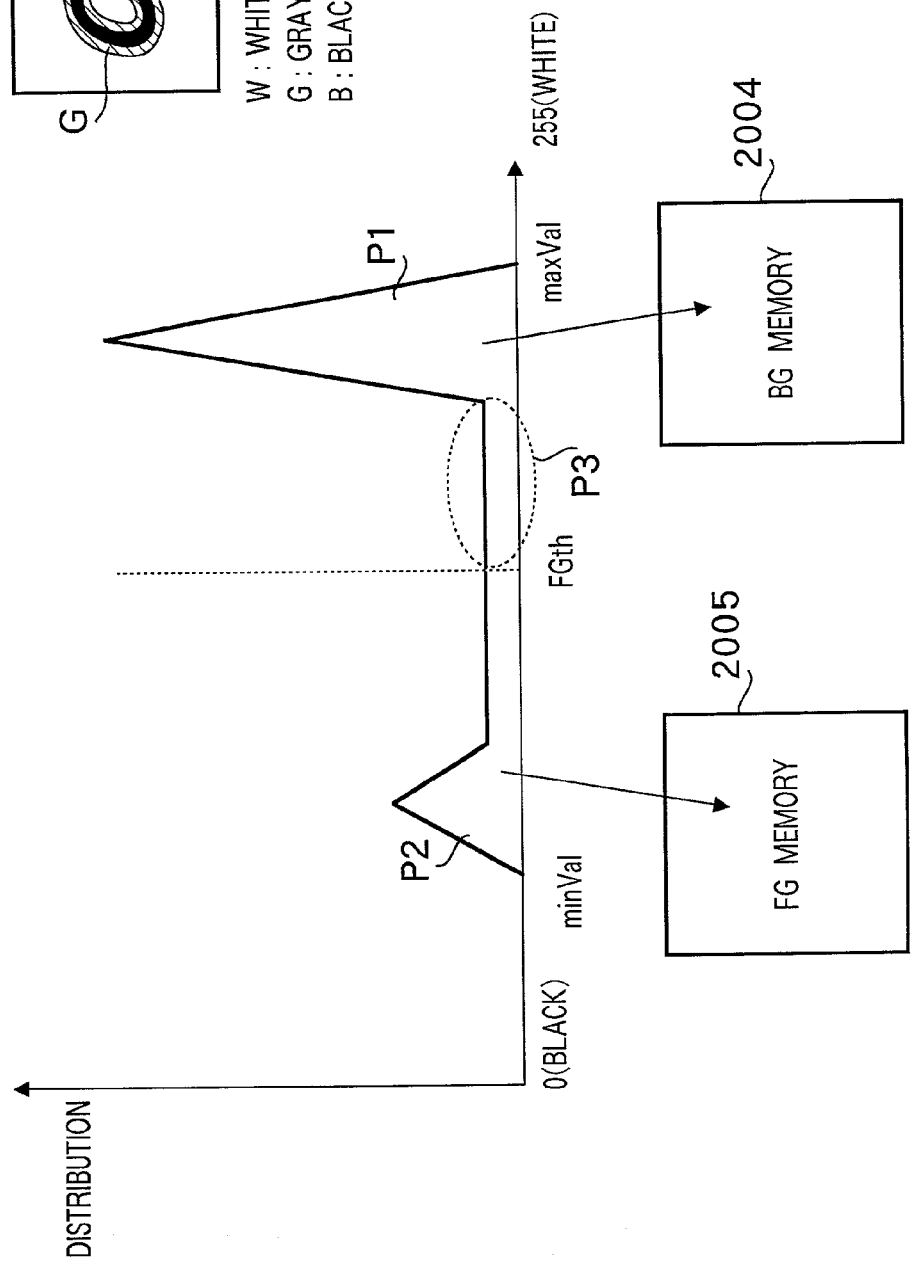
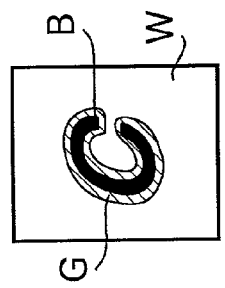
W: WHITE AREA OF BACKGROUND (P1)
G: GRAY AREA OF CHARACTER EDGES (P3)
B: BLACK AREA OF CHARACTER (P2)
FIG. 19B
FIG. 19A

FIG. 37

METHOD AND APPARATUS FOR IMAGE CODING

BACKGROUND OF THE INVENTION

1. Field of the Invention

The present invention relates to a method and apparatus for coding continuous-tone still images.

2. Description of the Related Art

A copier or facsimile apparatus having a copy function converts the content of a document to be copied or transmitted to an electrical signal using an optical reader.

Images to be input are broadly grouped into photographic images, bi-level images and multi-valued images.

Multi-valued images are further grouped into a set of local multi-valued images and also locally multi-valued images.

The first refers to an image of part of a binary image which is locally so blurred that it appears to be a multi-valued image such as edges of a character image (binary image) read through an optical system, and the latter refers to an image, any part of which is completely multi-valued in a microscopic view such as a photographic image This specification will regard photographic images and multi-valued images as photographic images. Moreover, since a typical example of a bi-level image is a character image, this specification will express a bi-level image as a character image (synonymous with a line drawing image) hereafter.

When a mixed image of character images and photographic images is coded, making drastic improvement of the quality of reproduced images compatible with improvement of compressibility involves various kinds of difficulty.

One of efficient and high accuracy methods for coding a mixed image is a method consisting of segmentation (determining) of an image area using a small block as a unit and carrying out coding that matches the type of the image based on the result of this image area decision (Unexamined Japanese Patent Publication No. HEI 8-51537 and Unexamined Japanese Patent Publication No. HEI 11-289461).

The Unexamined Japanese Patent Publication No. HEI 11-289461 describes the technology previously proposed by the inventor of this patent application. FIG. 38 shows the drawing included in the Unexamined Japanese Patent Publication No. HEI 11-289461.

As shown in FIG. 38, one stripe (ST: a zone which extends in a horizontal direction) of an input image is divided into a plurality of blocks (the size of each block is 8 pixels×8 pixels) and it is decided for each block whether the image block is a photographic image or bi-level image.

Then, a bi-level image is subjected to coding based on JBIG (Joint Bi-level Image Coding Experts Group) and a photographic image is subjected to coding based on JPEG (Joint Photographic Coding Experts Group).

However, carrying out block-by-block image area decision may sometimes deteriorate the quality of a reconstructed image.

For example, in image data captured using an optical system such as a scanner, the edges of a character image (line drawing image) or dot image become duller (that is, concentration distribution becomes sluggish) due to an MTF characteristic of the optical system, and gray-scale components are thereby produced.

It is generally difficult to apply image area decision to such an area. For example, a distribution of pixel level at the edges of a character becomes sluggish and it happens with considerable frequency that some blocks are recognized as photographic images, while adjacent blocks are recognized as bi-level images.

Since different coding systems are adopted according to the image area decision result, the reconstructed pixel level varies depending on the coding system used.

Thus, at the edges of a character image that should originally have a sharp outline, an area which is reproduced as a photographic image area is unnaturally mixed into a bi-level image area, producing mottling (whitish area mixed into a black area), which in turn blurs the reconstructed image.

When a gray-scale image such as a photograph and a clear black character are mixed in one image, it is visually very important that the outline of the character be sharply reproduced.

Or, for example, in the field of calligraphy or ink painting which is one of Japanese traditional arts, it is often the case that the outline of a character or part of a background has extremely natural gradation. In such a case, it is important to reproduce the natural gradation as is.

On the other hand, attempting to encode using a sophisticated segmentation technique with primary importance attached to the quality of a reproduced image inevitably will cause an increase of entropy (amount of information) and inevitably reduce compressibility.

Furthermore, an actual problem in realizing a coding apparatus is the problem associated with cost of image memory.

A digital multi-functional peripheral (MFP) that integrates a copier function and printer function temporarily stores an input image in memory, then reconstructs, applies image processing and prints the image. When high resolution is used, the volume of image data per page becomes enormous and therefore the image data is normally compressed and stored in memory.

This memory is required to have a capacity enough to store at least one-page coded data. For example, when image data is compressed using JPEG, the code data size varies a great deal according to the complexity of the image data.

Therefore, it is necessary to install one-page of image memory taking into account the worst case of the image pattern.

To reduce the memory cost, fixed-length coding is often used whose code length remains constant regardless of the complexity of the image, but fixed-length coding has poor compressibility and the quality of a reproduced image deteriorates.

On the other hand, applying variable-length coding with primary importance attached to the image quality may cause the code size to exceed the pre-defined memory capacity in the case of a complicated gray-scale image.

That is, as far as there is a possibility that memory will overflow, aiming at ultimate high resolution of the reproduced image may be unrealistic.

Thus, it is difficult to find out a point of harmony among a drastic improvement of image quality, compressibility, memory capacity and cost. This problem becomes more conspicuous as the image quality and compressibility are pursued further.

SUMMARY OF THE INVENTION

It is one of objects of the present invention to implement realistic and stable coding processing by pursuing ultimate image quality irrespective of the types of images, reducing the coded data through highly efficient compression and exploiting the capacity of the apparatus to the full.

The most outstanding feature of the image coding of the present invention is to precisely acquire brightness information of an original image not in block (micro block) units but in pixel units and perform coding using an optimal coding format pixel by pixel.

According to the image coding method of the present invention, image area decision processing is performed using a large unit called "tile" (also referred to as "macro block": its size is, for example, 32 pixels×32 pixels) first and it is decided whether the tile is a character tile or photographic tile.

Then, layering processing is performed on one tile. That is, with regard to preferably a character tile (however, the tile is not limited to the character tile, and may also be a photographic tile), all pixels that belong to the tile are examined as to whether each pixel is a photographic pixel or bi-level pixel.

Since photograpic pixels in a character tile constitute a background, the photographic pixels in this case are grouped into a background image (BG). On the other hand, since bi-level pixels in the character tile constitute a foreground (character), bi-level pixels are grouped into a foreground image (FG).

All pixels in the character tile are layered as BG and FG in this way. This makes it possible to precisely group the brightness information of a multi-valued image to be coded pixel by pixel efficiently and accurately.

That is, using a large block called "tile" (macro block) as a unit of segmentation, it is decided from a large view how pixels of different levels of brightness are distributed in the tile and layering is performed pixel by pixel, which makes it possible to determine attributes of the image accurately.

When segmentation is performed using a small block (micro block) as a unit, the type of an image is decided only based on brightness values of pixels that belong to the small block. Thus, a wrong decision would cause unnatural reproduction variations. However, since the present invention precisely grasps the brightness information pixel by pixel, saves and codes the information accurately, such a risk is minimized.

That is, the present invention examines brightness values for every minimum unit that makes up an image and saves the information, and can thereby decide the local nature of an input image quite precisely.

Furthermore, by adaptively deciding the number of layers and types of layers in one tile according to an objective to be focused (e.g., an objective of reproducing edges of a character in a beautiful manner), the present invention can decide information of a gray-scale image from a broad view and acquire information meticulously layer by layer. Thus, the present invention can improve the quality of a reproduced image effectively.

However, since layering increases an amount of information (entropy), a preferred mode of the present invention suppresses an increase of code size using approximation processing wherever possible.

That is, suppose a character tile is layered into a black area of the character (foreground: FG) and a white area in the background of the black area (background area including a photographic area of edges: BG).

Here, the foreground area is completely black and the human visual system about this area is not sensitive, and therefore even if brightness values of all pixels of the foreground area are represented by one approximate value, the image quality does not decrease significantly.

This approximation reduces the amount of information to be coded at a stretch and alleviates the increase of entropy resulting from layering.

Furthermore, even in the case of a tile decided as photographic tile, if the brightness distribution of the image is extremely limited, approximation is still applicable and approximation processing is extremely effective in the sense that it suppresses the increase of entropy.

For brightness information to which approximation processing is not applicable, a discrete cosine transformation (DCT) is performed to obtain a DCT coefficient as in the case of JPEG. Then, the approximate value, DCT coefficient and a flag indicating whether bi-level approximation is applicable or not, etc. are coded using a variable-length coder with high compressibility.

The explanations so far have discussed only from the standpoint of the quality of a gray-scale image and the code size. However, by definition, the code size changes by a large margin depending on the complexity and attributes of the gray-scale image, and the consistency with the performance of the apparatus (memory capacity and the ability to prevent disturbance in pipeline processing, etc.) is naturally brought up as a problem.

That is, even if above-described high precision coding is performed, if an event like memory overflow occurs, such a technology is not applicable to actual products.

Thus, in addition to the above-described aspect of improvement of image quality by layering and suppression of the amount of coding through approximation, another preferred mode of the present invention provides a kind of feedback control which forcibly suppresses the coding rate (total code size produced when one tile is coded) within a certain range.

The code size can be forcibly increased or decreased, for example, by changing the quantization step size in quantization after DCT (discrete cosine transformation). The quantization step size can be changed by updating a scaling factor value.

In the case where the code size is adjusted by adaptively changing the scaling factor value, decoding of the image requires the scaling factor value, and therefore the information indicating the scaling factor value also needs to be coded. An actual scaling factor is a real number and contains a large amount of information.

However, since the increase of entropy must be avoided wherever possible, another preferred mode of the present invention adopts a method of performing predetermined calculations (known calculations) on the scaling factor with an integer value and thereby producing a scaling factor with a real number.

Then, only those scaling factors of an integer value are coded. This contributes to reduction of the code size.

Furthermore, to change scaling factors of an integer value according to the variation of the amount of coding and thereby efficiently correct scaling factors with a real number value, it is necessary to simplify the relationship between the coding rate and each scaling factor wherever possible.

Thus, another preferred mode of the present invention sets so that a differentiation value of a function showing a relationship between the coding rate and scaling factor with an integer value becomes an inverse number of differentiation of a function showing a relationship between the scaling factor with an integer value and a scaling factor with a real number value.

This makes the amount of change of the scaling factor with an integer value corresponding to the amount of change of the coding rate constant irrespective of the area of the dynamic range in which the scaling factor is, making adjustment quite simple.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 19A illustrates a brightness histogram (for layer processing in a tile) with one tile;

FIG. 19B illustrates one tile image;

FIG. 37 illustrates generation of a context when bitmap information is subjected to arithmetic coding;

DETAILED DESCRIPTION OF THE PREFERRED EMBODIMENTS

With reference to FIG. 1 to FIG. 10 and FIG. 39, an overview of features of the present invention will be explained and then specific embodiments will be explained.

Figure 39:
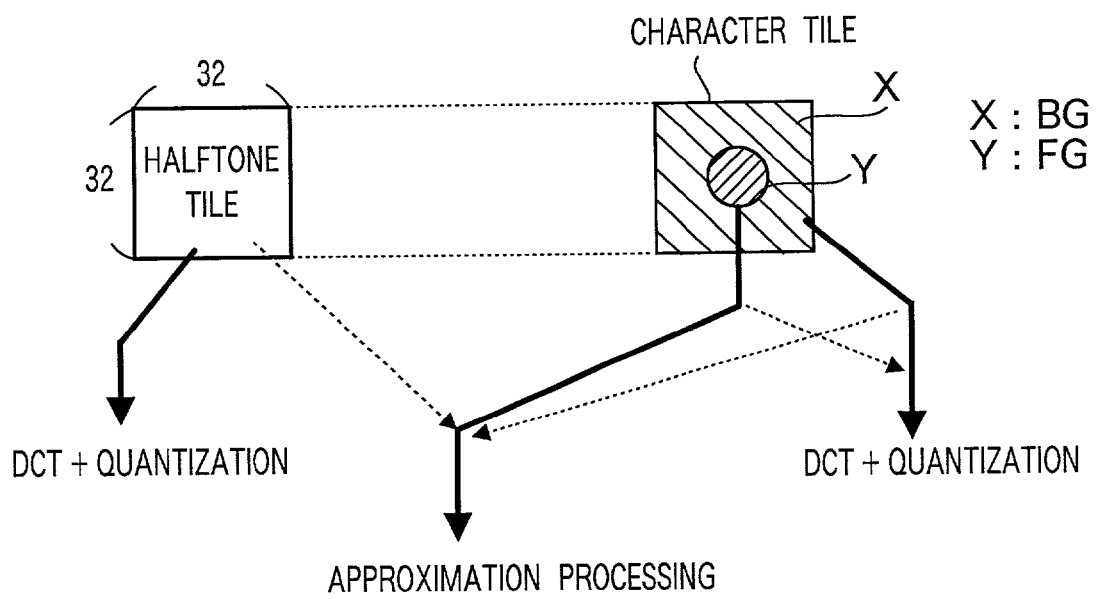
FIG. 39 illustrates basic features of an image coding method of the present invention.

FIG. 39 illustrates basic features of the present invention.

Figure 38:
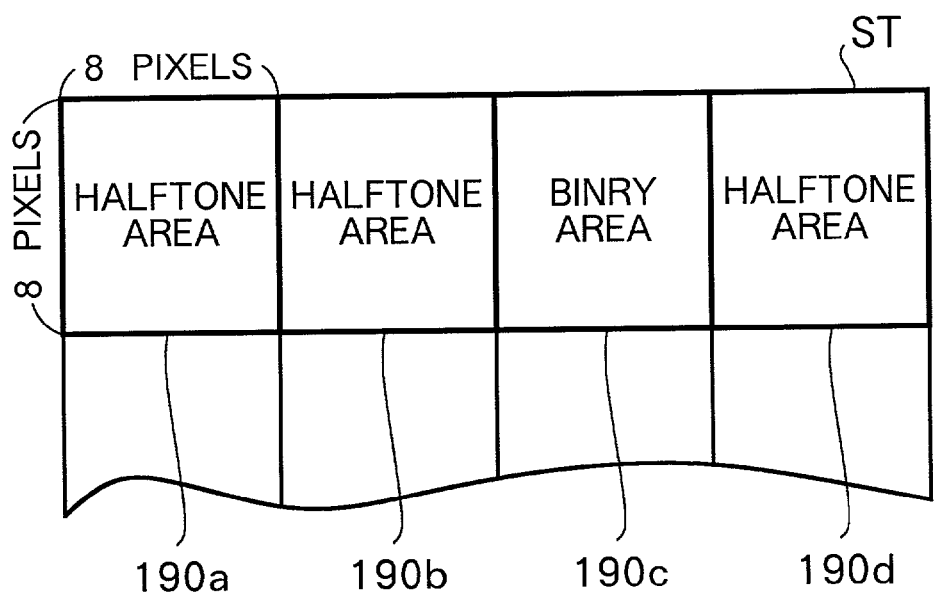
FIG. 38 illustrates a publicly known technology about image area decision of an input image.

Unlike the conventional example shown in FIG. 38, the present invention decides the type of an image using a tile (macro block: e.g., 32 pixels×32 pixels) as a unit, which is larger than a block (micro block: 8 pixels×8 pixels), which is the unit of discrete cosine transformation (DCT).

As a result of this decision, tiles are grouped into photographic tiles and character tiles, for example.

Then, all pixels included in, for example, a character tile are examined pixel by pixel to decide to which of a plurality of predetermined layers each pixel belongs to (layering processing).

In FIG. 39, pixels included in the character tile are grouped into a foreground (FG) and a background (BG).

Then, the backgrounds (BG) in the photographic tile and character tile are subjected to DCT and quantization processing (processing indicated by the solid arrow in FIG. 39) in principle as in the case of JPEG.

On the other hand, the foreground (FG) in the character tile is subjected to approximation processing (processing indicated by the solid arrow in FIG. 39) in principle.

However, deciding pixel by pixel to which layer each pixel belongs will increase entropy significantly. To reduce entropy wherever possible, approximation processing (processing indicated by the dotted arrow in FIG. 39) is exceptionally carried out, if possible, on the backgrounds (BG) in the photographic tile and character tile, too.

On the other hand, when it is not possible to apply approximation with a typical value to pixels that belong to the foreground (FG) in the character tile, DCT and quantization processing (processing indicated by the dotted arrow in FIG. 39) is exceptionally carried out to accurately save information of a subtle brightness distribution.

Figure 1:
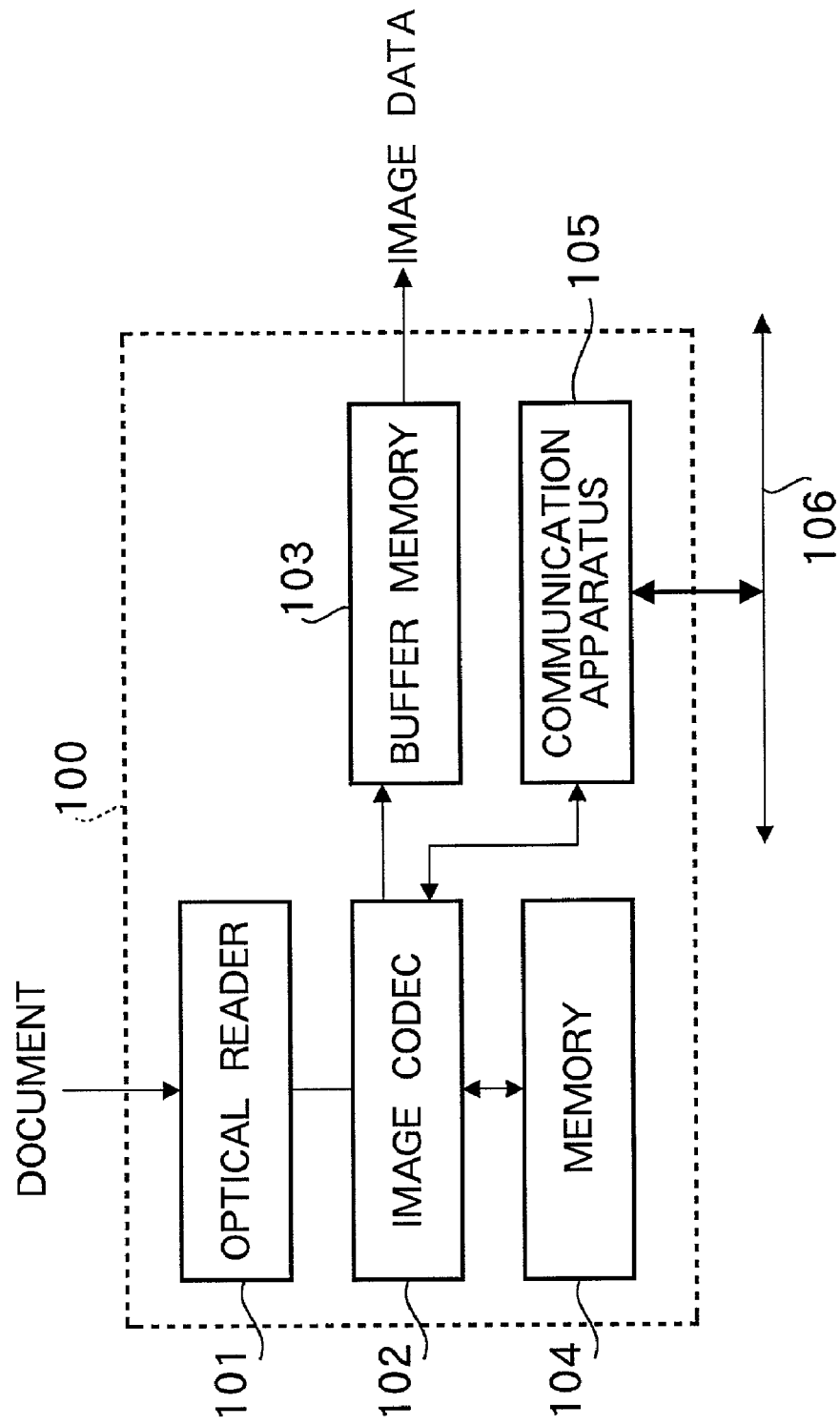
FIG. 1 is a block diagram showing an overall configuration of a multi-functional peripheral (MFP) having both a facsimile function and a copier function.

FIG. 1 shows a configuration of a MFP provided with both a copier function and facsimile communication function. This MFP reads a document using optical reader 101.

The image CODEC 102 then codes the read image or decodes the coded image data received via communication channel 105 and communication apparatus 105.

Memory 104 is used for coding or decoding of images if necessary. The coded or decoded image data is temporarily stored in buffer memory 103 and then output.

Figure 2:
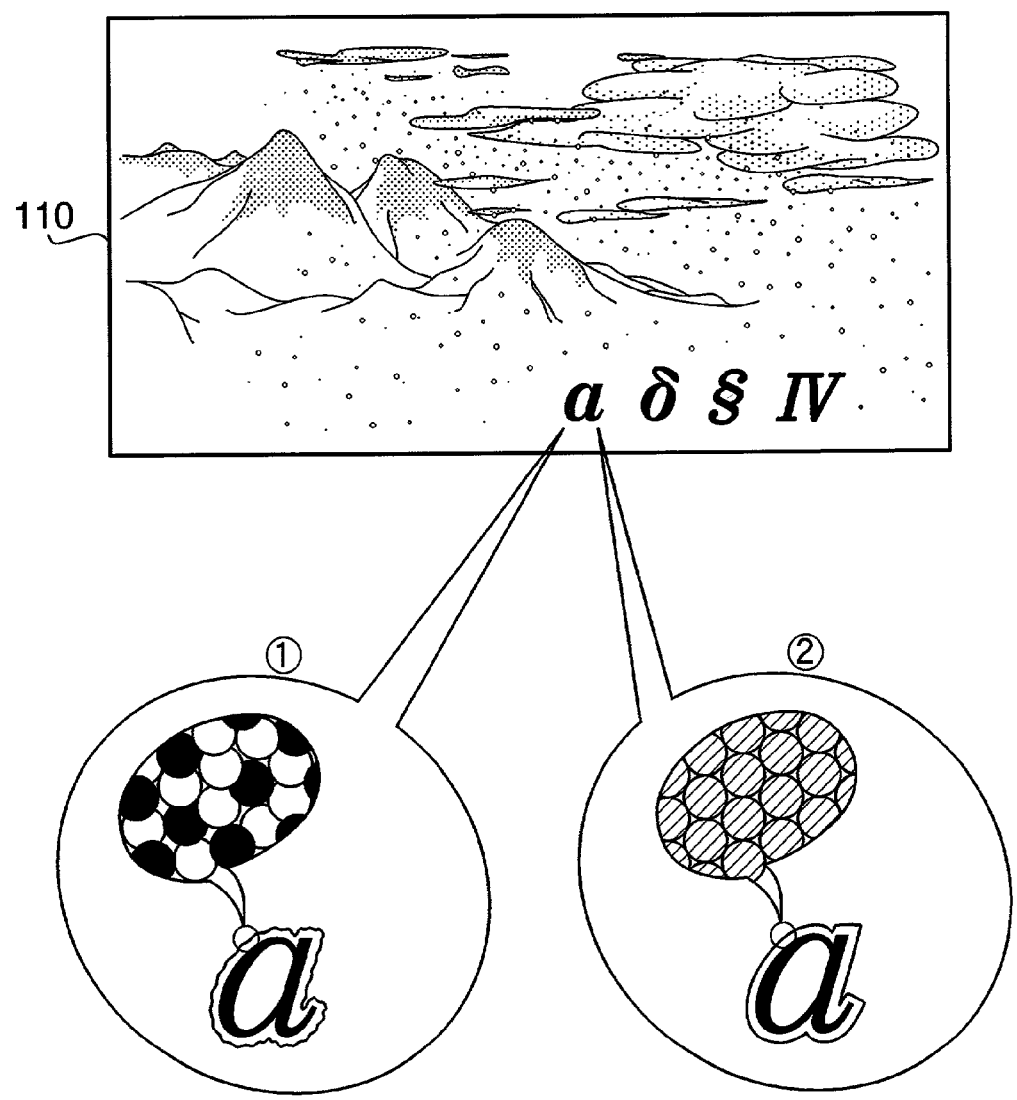
FIG. 2 illustrates a problem related to reproduction of edges of a character image in a mixed image.

The image coding apparatus of the present invention is mounted on image CODEC 102. As shown in FIG. 2, images to be coded are broadly grouped into photographs, bi-level images (character images) and multi-valued images. Multi-valued images can be grouped further into a set of local multi-valued images and also locally multi-valued images.

Since blurred parts are introduced to images read through optical reader 101, it is difficult for the conventional technology to reconstruct ultra-fine images for all types of images shown in FIG. 2.

The present invention solves this problem and realizes ultimately high image quality for all types of images (reconstructed images).

Figure 3:
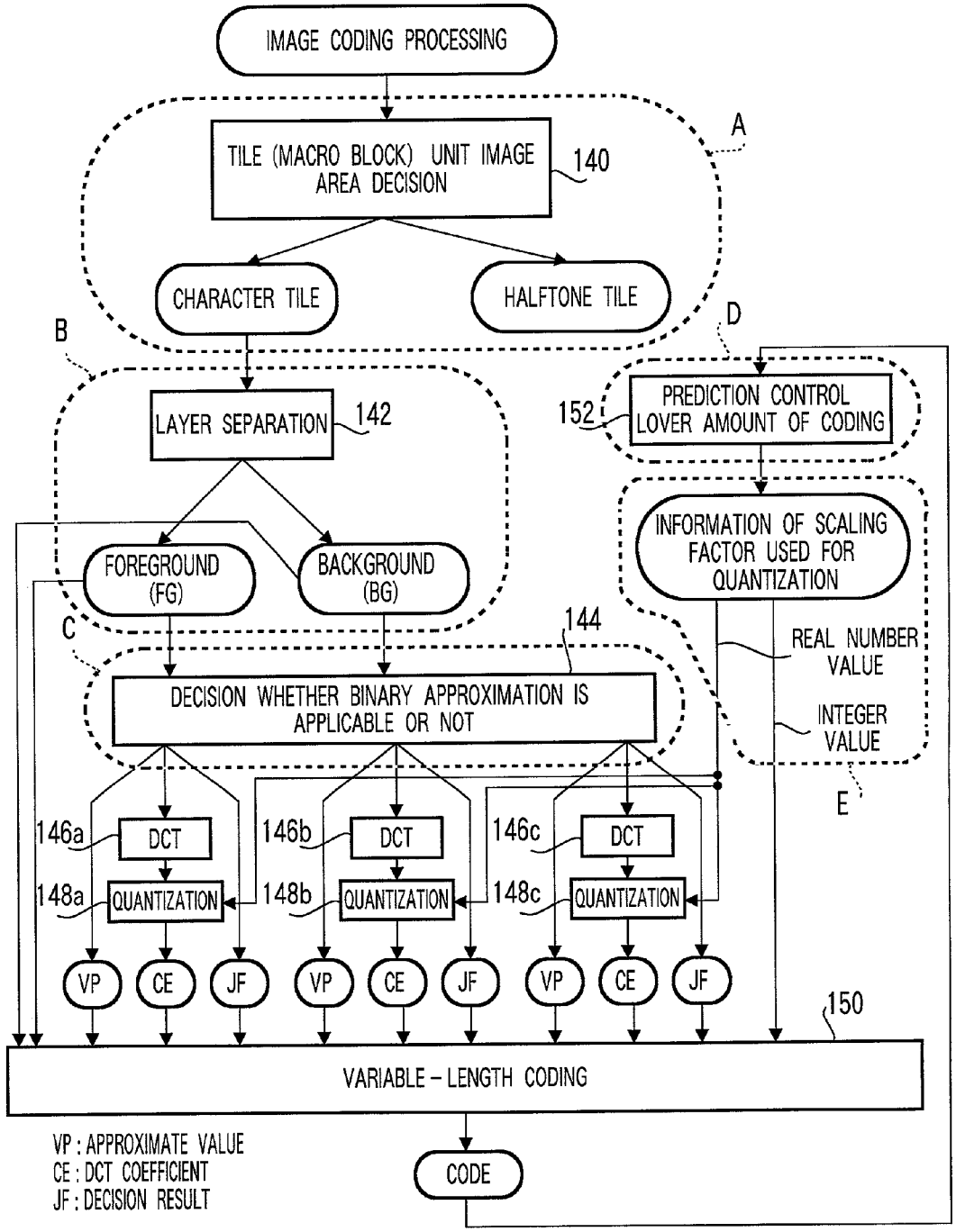
FIG. 3 illustrates features of image coding processing according to the present invention.

As shown in FIG. 3, the present invention ultimately improves the quality of character images especially when photographic images and character images are mixed.

As shown in the lower part of FIG. 3, edges of a character may become unnatural in the case of the conventional technology (sample ①). In contrast, edges of a character are also reproduced extremely naturally according to the present invention (sample ②).

Figure 4:
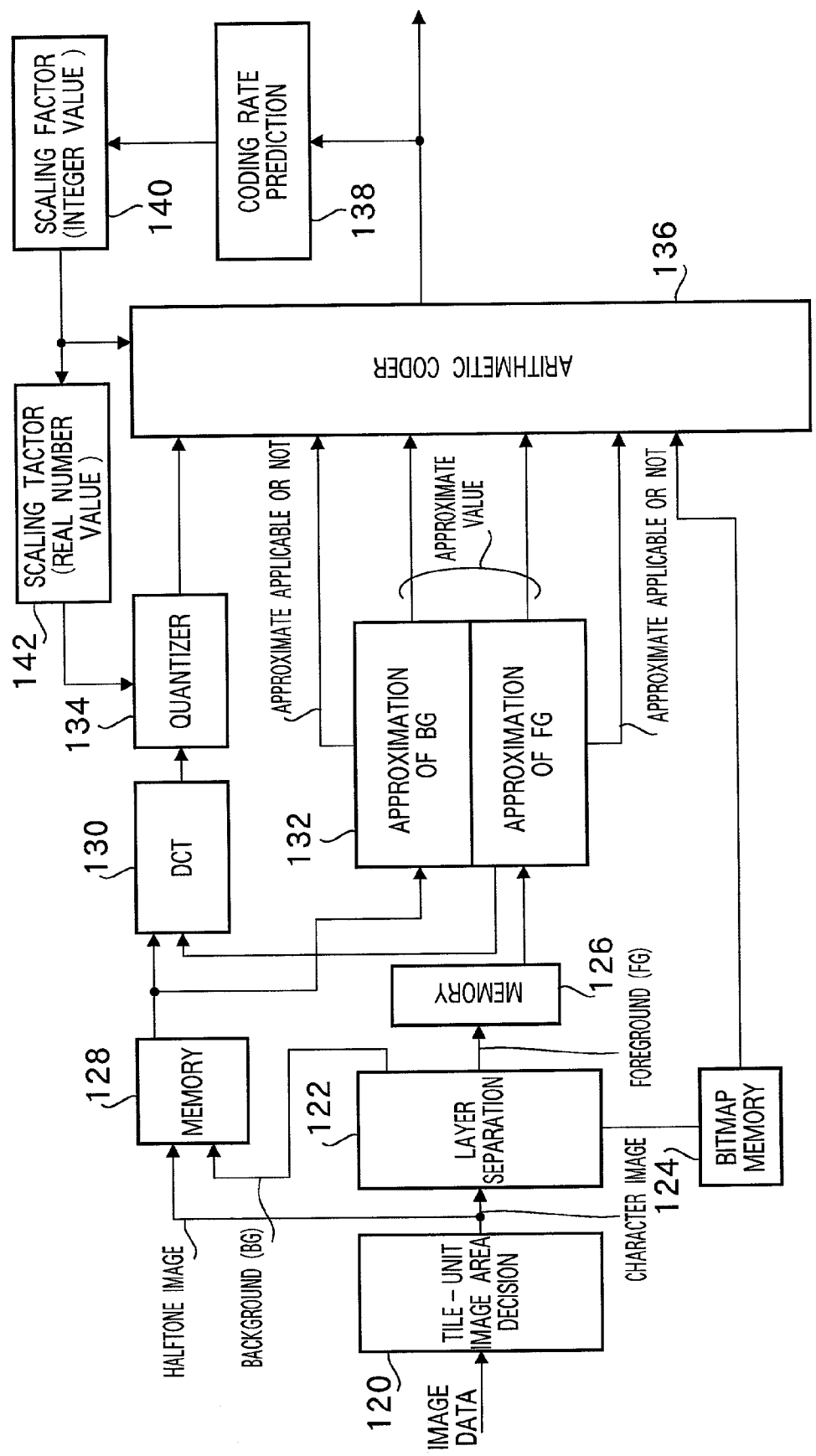
FIG. 4 is a block diagram showing a specific configuration of an image coding apparatus according to the present invention.

FIG. 4 shows a main procedure of the image coding method of the present invention and five major features.

That is, the features of the image coding method of the present invention are summarized as follows.

① An image is divided into a character tile and photographic tile through image area decision in tile (macro block) units (step 140: feature (A)).

② All pixels included in one tile (preferably character tile) are grouped into photographic pixels (constituting a background) and bi-level pixels (constituting a foreground), that is, subjected to layer separation (step 142: feature (B)). Since information is collected pixel by pixel, it is possible to extremely precisely grasp information of the image.

③ To reduce entropy (volume of information), binarization processing is performed wherever possible (step 144: feature (C)).

④ To further keep the volume of information within an appropriate range, the amount of coding is subjected to prediction control (negative feedback control) (step 152: feature (D)).

⑤ When a scaling factor used for quantization is calculated, a factor of an integer value is calculated first, then a factor with a real number value in a one-to-one correspondence with the factor of an integer value is calculated. Only the factor of an integer value is coded to suppress an increase in the amount of coding (feature (E)).

Each of an approximate value, DCT coefficients, information indicating whether approximation is applicable or not and bitmap information indicating to which of a foreground or background each pixel belongs is coded using a variable-length code with high compressibility (preferably arithmetic coding).

FIG. 4 shows a basic configuration of the image coding apparatus of the present invention.

In order to realize high accuracy coding, the image coding apparatus of the present invention includes image area determinator 120 that carries out tile-unit image area decision, layer separator 122, memories 126 and 128, discrete cosine transformer 130, quantizer 134, approximator 132 and arithmetic coder 136.

Furthermore, the image coding apparatus of the present invention also includes coding rate estimator 138 to control the coding rate, calculator 140 to calculate scaling factors of an integer value and calculator 142 to calculate scaling factors with a real number value.

Figure 5:
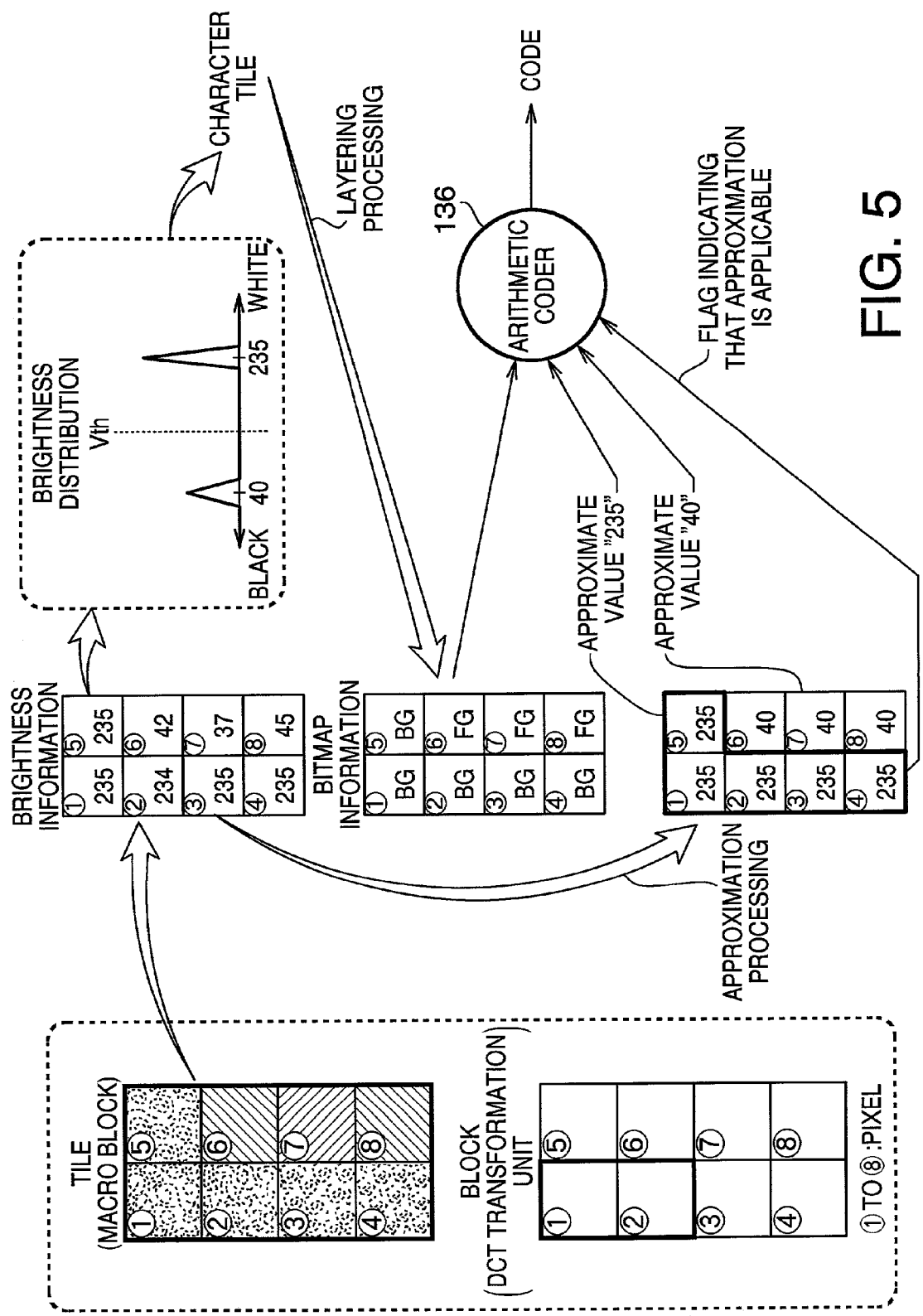
FIG. 5 illustrates an example of contents of the image coding processing according to the present invention.
Figure 6:
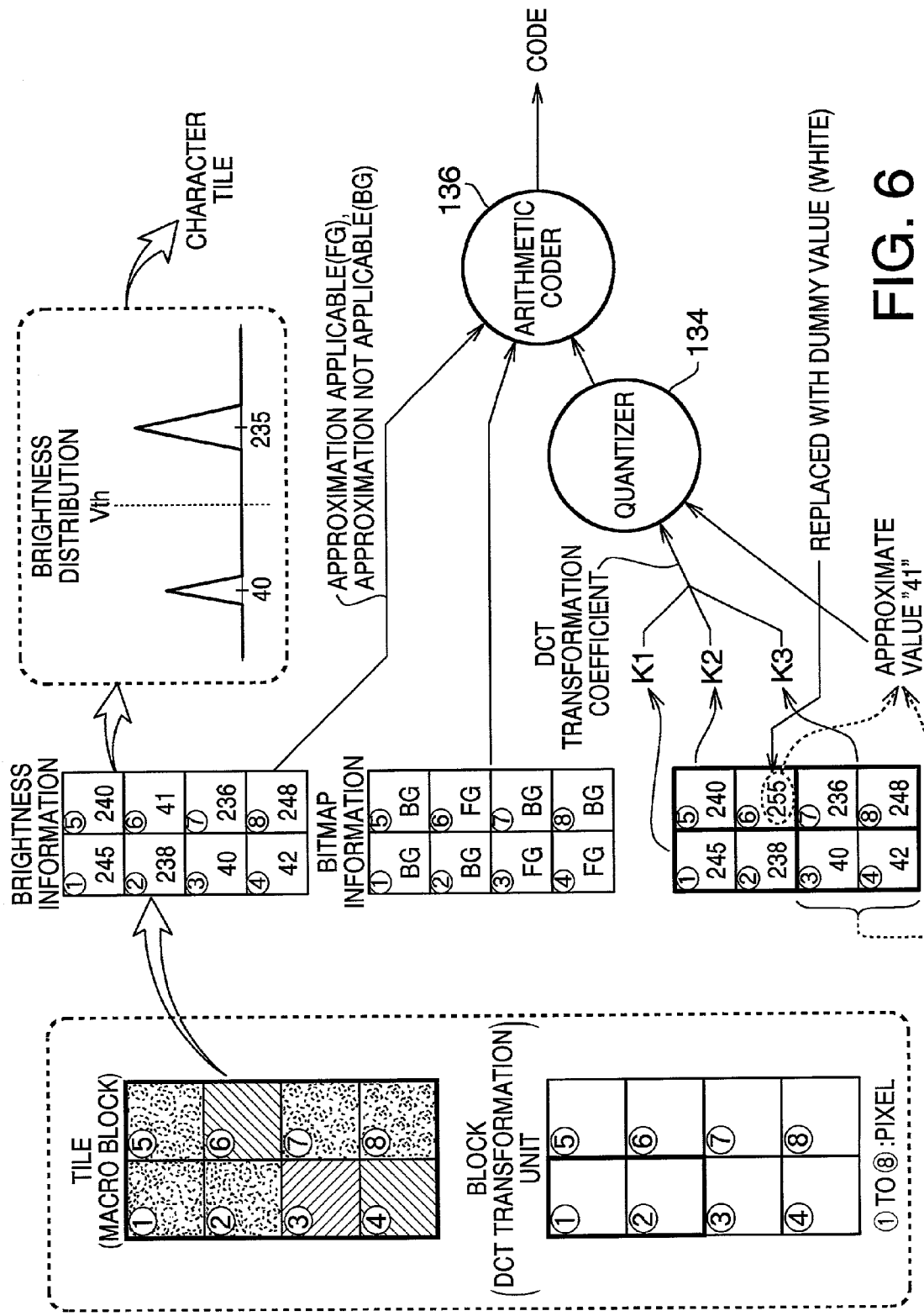
FIG. 6 illustrates another example of contents of the image coding processing according to the present invention.
Figure 7:
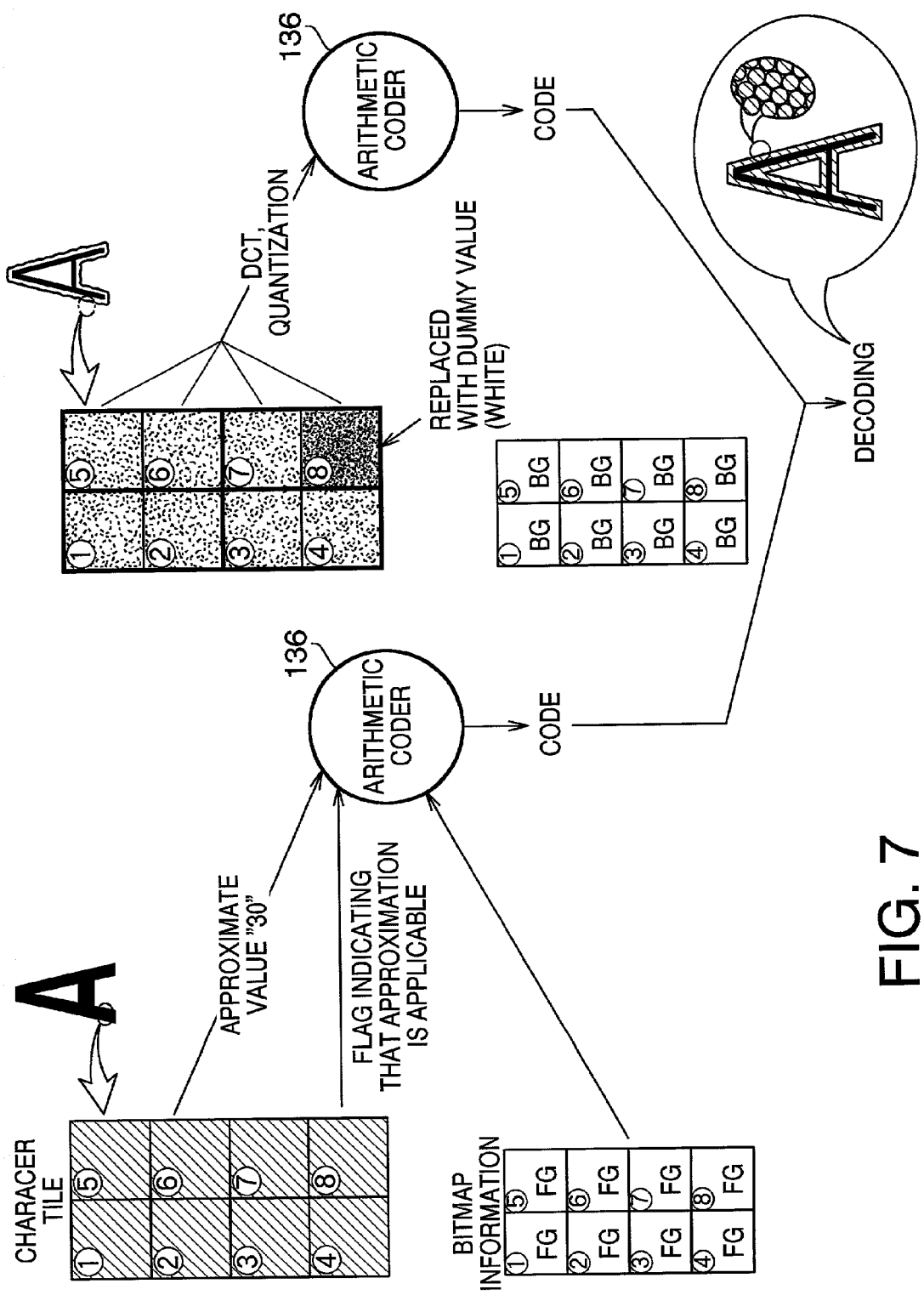
FIG. 7 illustrates an example of effects of the image coding processing according to the present invention.

FIG. 5 to FIG. 7 show specific examples of the coding processing of the present invention.

At the top left of FIG. 5 is a tile (macro block). Though one tile actually consists of 1024 pixels (32×32), in FIG. 5, one tile consists of 8 pixels (pixels ① to ⑧) for convenience of explanations.

As shown at the bottom left of FIG. 5, a block (micro block) is a block which is used as a unit for discrete cosine transformation. In FIG. 5, pixels ① and ② constitute one block, and likewise pixels ③ and ④ constitute one block, pixels ⑤ and ⑥ constitute one block and pixels ⑦ and ⑧ constitute one block.

As shown at the center top of FIG. 5, in terms of a brightness distribution of each pixel, pixels ① to ⑤ are close to white, while pixels ⑥ to ⑧ are close to black. The brightness distribution is divided into one group close to white and the other group close to black relative to a certain threshold Vth. Thus, as a result of image area decision, this tile is determined to be a character tile.

Each pixel that constitutes this character tile is examined as to whether each pixel belongs to the background (BG) or foreground (FG) and subjected to layering. Then, bitmap information indicating to which layer pixels ① to ⑧ belong is obtained.

As shown at the center bottom of FIG. 5, as a result of determining whether approximation is applicable or not with typical values about the background (BG) and foreground (FG) in this tile, it is observed that both can be approximated.

Therefore, the background (BG) is approximated with approximate value "235" and the foreground (FG) is approximated with approximate value "40".

Then, arithmetic coder 136 codes the bitmap information, two approximate values and a flag indicating that approximation is applicable.

Then, an example in FIG. 6 will be explained.

The tile shown in FIG. 6 also has a brightness distribution of a character tile. However, since the brightness values of pixels ①, ②, ⑤, ⑦ and ⑧ included in the background (BG) are subtly different from one another and it is not possible to apply approximation processing to those brightness values. On the other hand, brightness values of pixels ③, ④ and ⑥ included in the foreground (FG) can be approximated with approximate value "41".

Thus, the background (BG) is subjected to discrete cosine transformation and quantization processing. On the other hand, the foreground (FG) is subjected to approximation processing.

What should be noted here is a block made up of pixel ⑤ and pixel ⑥. Since pixel ⑤ belongs to the background (BG), it is necessary to perform discrete cosine transformation using the block (micro block) including of pixel ⑤ and pixel ⑥.

However, pixel ⑥ is a pixel which belongs to the foreground (FG) and performing discrete cosine transformation in this condition may cause part of the background (BG) to become blackish under the influence of pixel ⑥ making it isolate from the other whitish background, which may deteriorate the quality of the reproduced image.

Therefore, when discrete cosine transformation (DCT) is performed, a dummy value (that is, white brightness value "255") is forcibly used instead of the actual brightness value of pixel ⑥. This allows natural whitishness of the background (BG) to be saved.

The reconstructing side performs inverse DCT to reproduce the brightness values of pixels ⑤ and ⑥. At this time, from the bitmap information it is known that the pixel ⑥ belongs to the foreground (FG). In this case, pixel ⑥ is reconstructed as brightness value "41" (approximate value of the FG) consequently. Thus, the foreground (FG) can also be reproduced accurately.

FIG. 7 shows the coding effects of the present invention.

As shown on the left side of FIG. 7, the brightness value of the bi-level part of character "A" is represented by an approximate value and coded.

On the other hand, as shown on the right side of FIG. 7, the brightness information of the photographic part of the edges of character "A" is analyzed pixel by pixel accurately, subjected to discrete cosine transformation and quantization and coded.

Thus, the edges of the decoded image are also naturally reconstructed as shown at the bottom right of FIG. 7. That is, these edges are not unnatural as in the case of sample ① in FIG. 3. This by far improves the quality of the reproduced image.

However, adopting such a system of selecting a coding format pixel by pixel makes entropy increase by a large margin.

Figure 8:
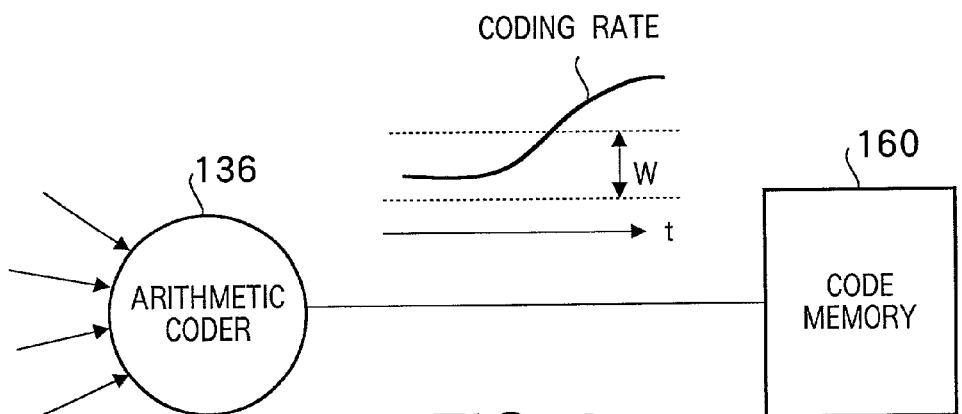
FIG. 8 illustrates causes of overflow of code memory.

Therefore, as shown in FIG. 8, the coding rate increases in process of the coding processing to finally go beyond appropriate range w. In this case, code memory 160 overflows.

Figure 9:
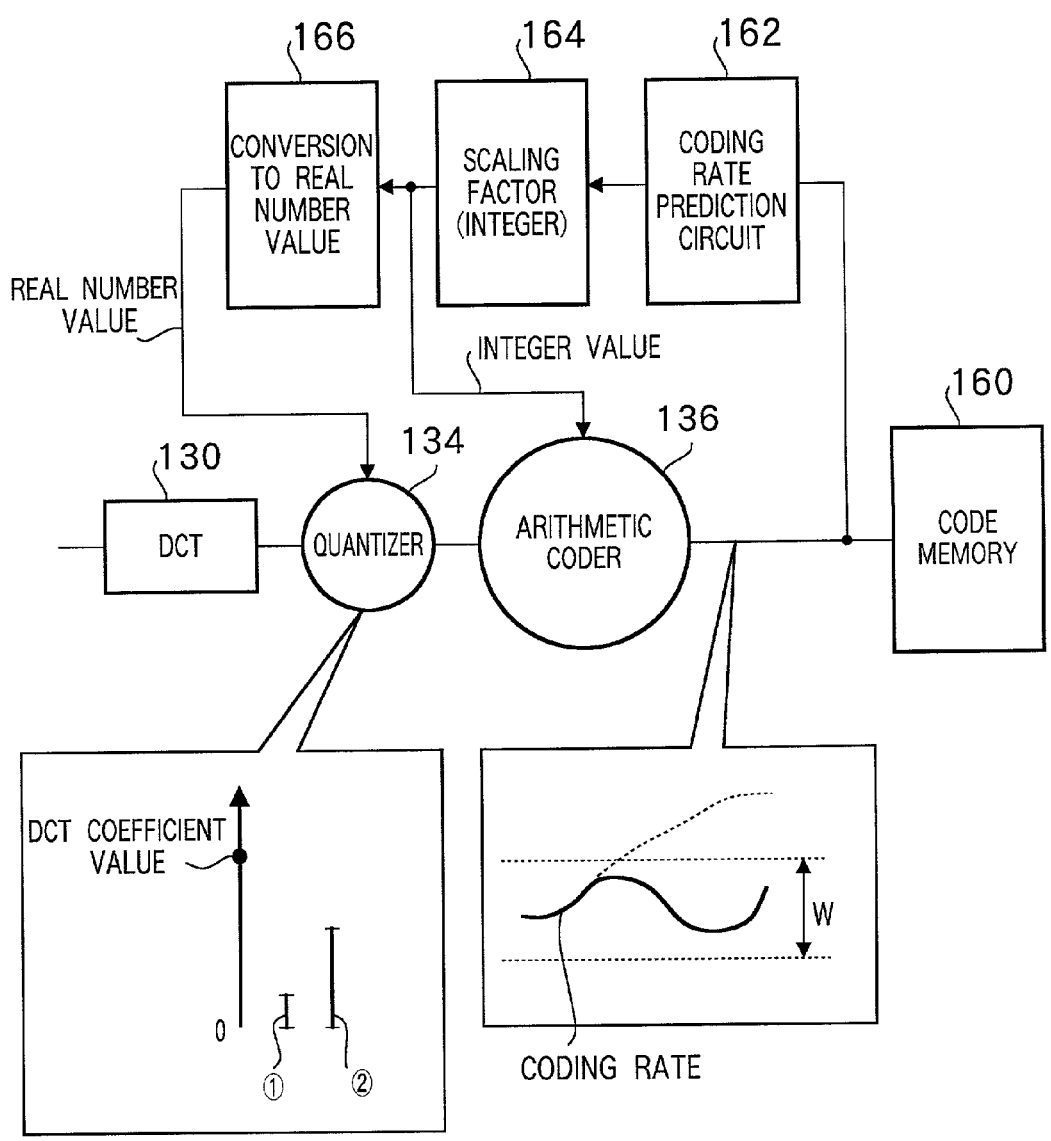
FIG. 9 is a block diagram showing a configuration for performing negative feedback control over the code size of an image coding apparatus according to the present invention.

Therefore, the coding apparatus of the present invention performs negative feedback control over the coding rate as shown in FIG. 9.

That is, coding rate prediction circuit 162 predicts the coding rate and adaptively changes the value of a scaling factor to be used for quantization.

As the scaling factor used for quantization is reduced (sample ① shown at the bottom left of FIG. 9), the amount of coding increases and the quality of the reproduced image improves. On the contrary, as the scaling factor used for quantization is increased (sample ② shown at the bottom left of FIG. 9), the amount of coding decreases, whereas the quality of the reproduced image deteriorates.

By adaptively changing the value of the scaling factor, the actual coding rate always falls within predetermined range W as shown by solid line at the bottom right of FIG. 9. This eliminates the possibility that code memory 160 will overflow.

Figure 10:
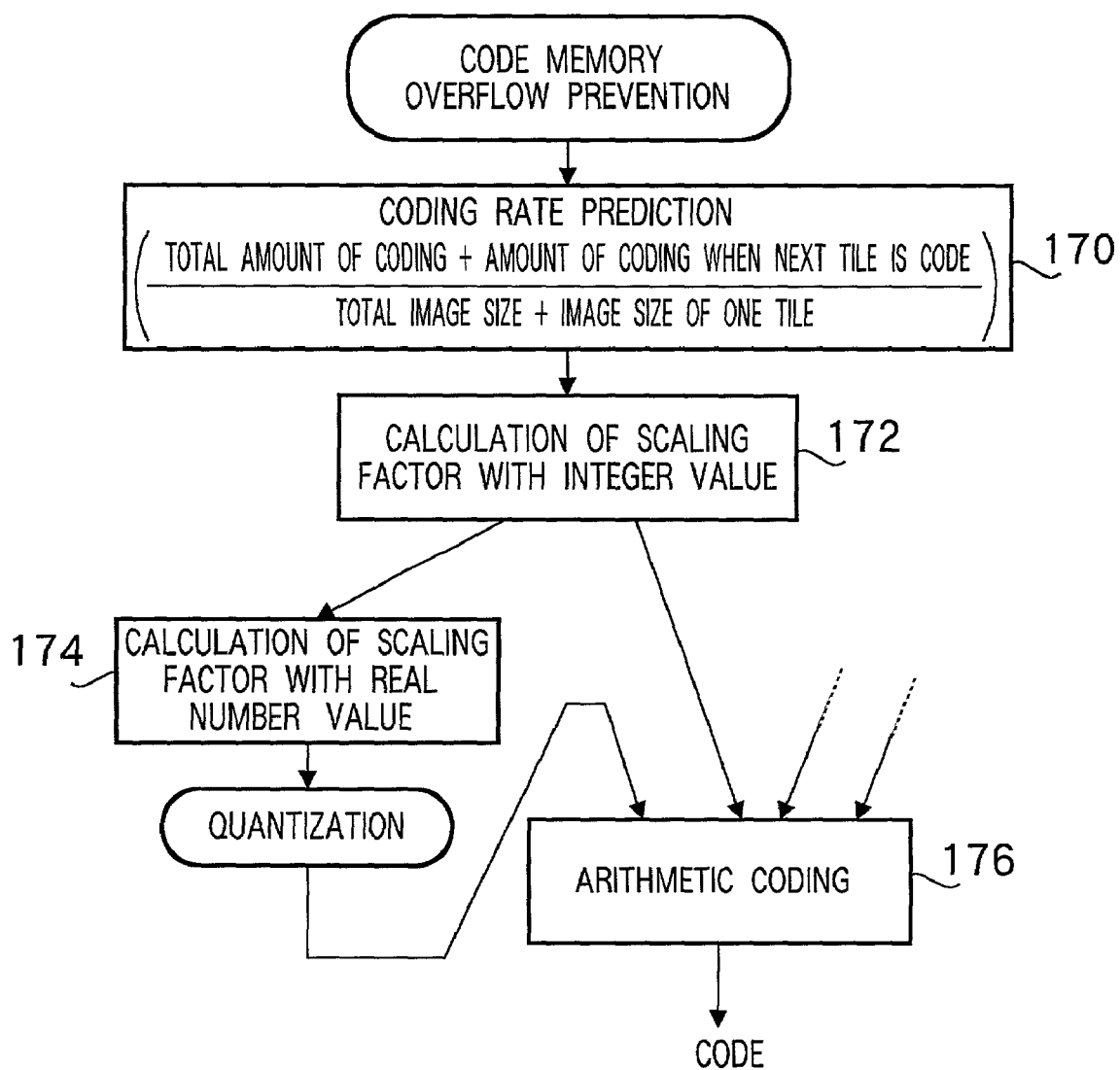
FIG. 10 illustrates a procedure for performing negative feedback control over the code size of the image coding apparatus according to the present invention.

The predicted value of the coding rate is obtained by carrying out a division as shown in step 170 in FIG. 10.

That is, an estimated amount of coding when the next tile is coded is added to the current total amount of coding (numerator). On the other hand, the image size of one tile is added to the current total image size (denominator).

Based on the predicted value of the coding rate, a scaling factor with an integer value is calculated (step 172). Then, a scaling factor with a real number value is calculated (step 174). Then, only the scaling factor with an integer value is coded.

This is an overview of the present invention.

Next, embodiments of the present invention will be explained more specifically with reference to the attached drawings.

Figure 11:
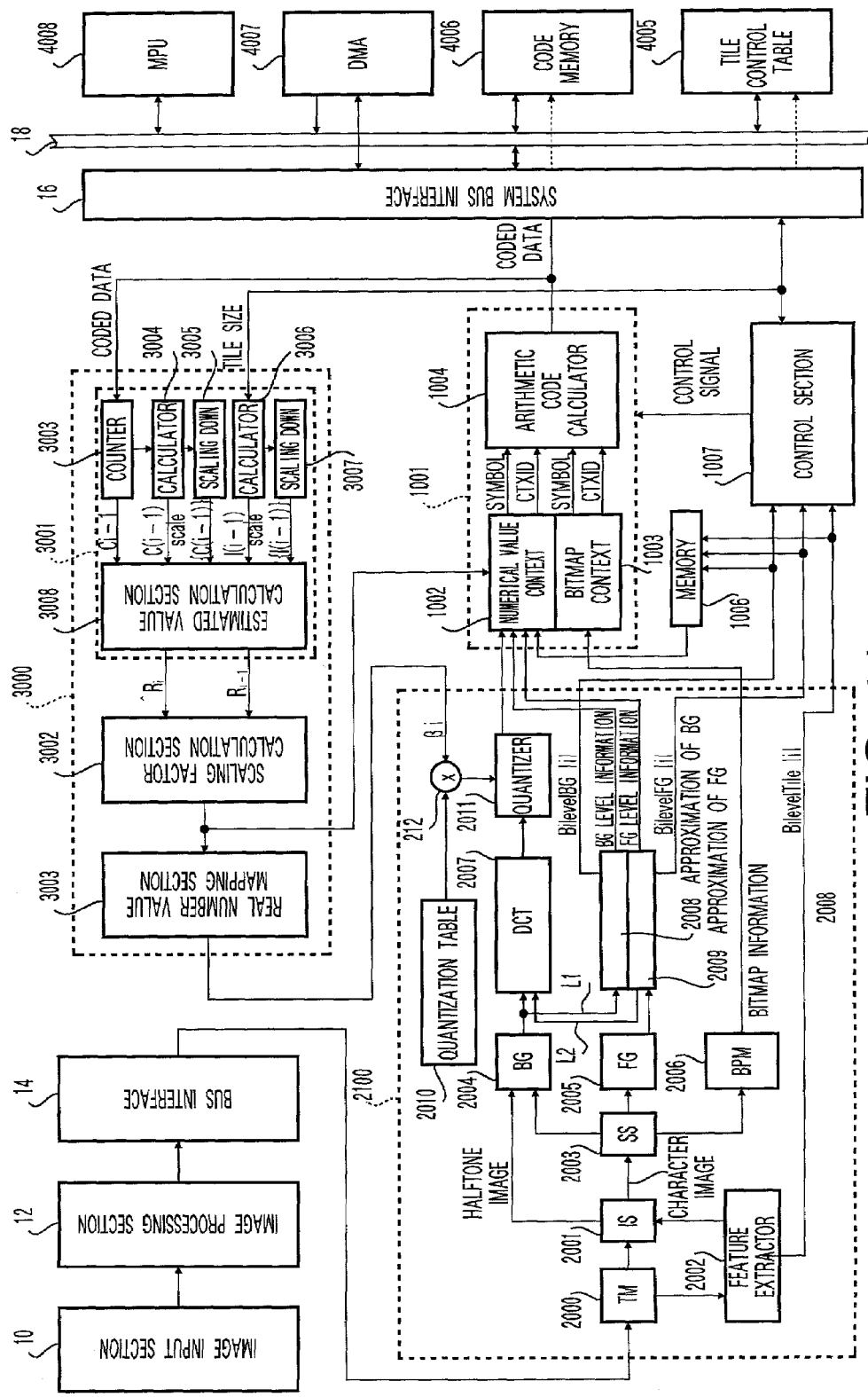
FIG. 11 is a block diagram showing a specific configuration example of main components of a image coding apparatus according to the present invention.

FIG. 11 is a block diagram showing a configuration of a MFP(apparatus combining a facsimile function and copier function) incorporating the coding apparatus of the present invention.

In the apparatus in FIG. 11, optical system image input section 10 such as a scanner reads an image and input image processing section 12 carries out processing such as noise elimination and edge enhancement.

The image data is sent to a section (layer separation/approximation processing section) 2100 that carries out layer separation, approximation, orthogonal transformation or quantization via image bus interface 14.

Layer separation/approximation processing section 2100 includes tile memory 2000, image area separation section 2001, feature extractor 2002, layer separation section 2003, BG (background) memory 2004, FG (foreground) memory 2005, bitmap memory 2006, orthogonal transformer (DCT) 2007, BG approximation processor 2008, FG approximation processor 2009, quantization table 2010, multiplier 212 and quantizer 2011.

The image data approximated or quantized by layer separation/approximation processing section 2100, flag information indicating a tile image area decision result, bitmap data indicating to which of the background (BG) and foreground (FG) each pixel in the tile belongs and flag information indicating whether approximation processing is applicable or not are coded by arithmetic coder (variable-length coder) 1001.

Memory 1006 is a memory to temporarily store flag information indicating the tile image area decision result and flag information indicating whether approximation processing is applicable or not.

Furthermore, the operation of arithmetic coder 1001 is controlled by control section 1007 in a centralized manner.

The data (coded data) coded by arithmetic coder 1001 is temporarily stored in code memory 4006 via system bus interface 16 and system bus 18.

Reference numeral 4008 is an MPU; 4007, a DMA controller; 4005, a tile control table.

System bus interface 16 is characterized by incorporating a DMA port to transfer coded data and a DMA port to transfer data to tile information control table 4005. Once data is transferred according to these DMA request signals, a tile control table as shown in FIG. 4 is created when one-page coding is completed (which will be described later).

On the other hand, coding rate control section 3000 performs negative feedback control taking into account the performance of the apparatus so that the coding rate (amount of coding generated together with coding of one tile) falls within a predetermined range.

The coding rate is increased or decreased by changing the width of a quantization step (basic unit of quantization) in quantizer 2011.

For example, when there is a possibility that code memory 4006 will overflow, the width of the quantization step is increased and quantization roughened up to decrease the amount of coding.

On the other hand, when there is a large empty area in code memory 4006, the width of the quantization step is decreased and the accuracy of quantization improved to increase the amount of coding (that is, to increase the image quality) thus using code memory 4006 to the full.

Furthermore, performing feedback control to keep the amount of coding within a predetermined range also contributes to preventing disturbance in the pipeline of entire coding processing.

FIG. 11 only describes the configuration of the section carrying out coding.

Figure 12:
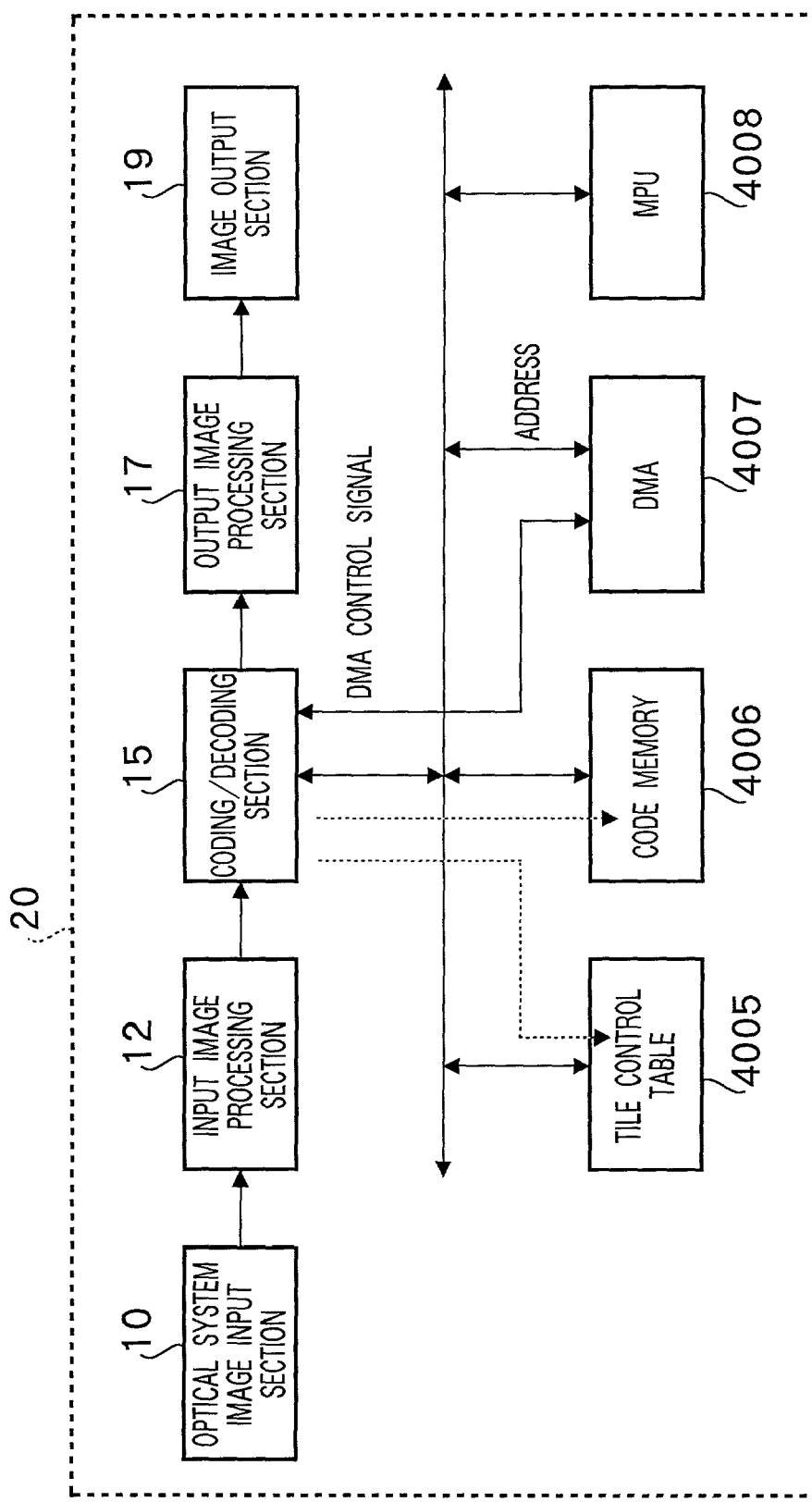
FIG. 12 is a block diagram showing an overall configuration of the system of the MFP.

FIG. 12 shows an overall configuration of the MFP 20. The data decoded by coding/decoding section 15 is output (printed) via output image processing section 17 and image output section 19.

The coded data and tile control data are transferred from the coding/decoding section to memory 4006 and memory 4005 respectively by DMA control circuit 4007 as indicated by dotted line.

DMA control circuit 4007 and MPU 4008 control coding/decoding apparatus 15.

Figure 13A:
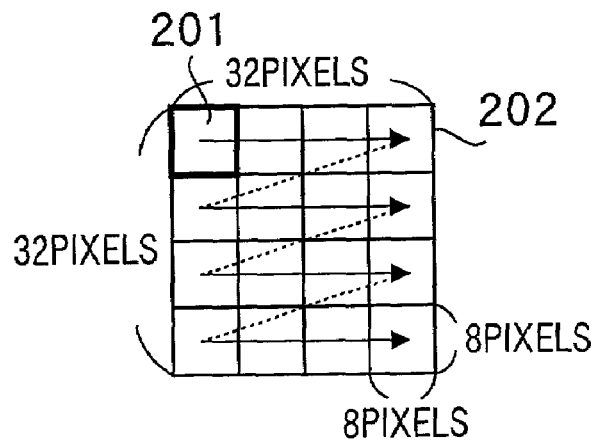
FIG. 13A illustrates a tile (macro block)

In the present invention, one page of an input multi-valued image is divided using a tile (macro block) shown in FIG. 13A as a unit and coded tile by tile.

That is, coding processing is initialized at the start of every tile. This allows each tile to be reconstructed independently.

In this embodiment, tile (macro block) 201 is an area as large as 32 pixels×32 pixels as shown in FIG. 13A.

Tile 201 is a set of 16 blocks (micro block made up of 8 pixels×8 pixels).

This block (micro block) 202 is a block which becomes a unit of DCT (discrete cosine transformation) by orthogonal transformer 2007. The arrow in FIG. 13A shows the coding order.

Figure 13B:
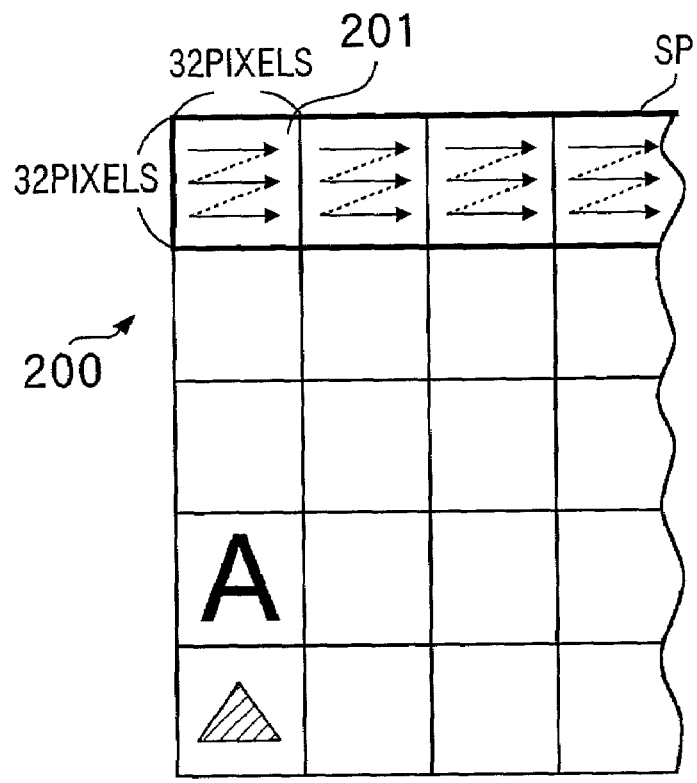
FIG. 13B illustrates an image divided into a plurality of tiles.

As shown in FIG. 13B, one multi-valued image 200 is divided into tiles 201. A series of bands in transversal direction is called a "stripe (SP)" in this embodiment.

Figure 14:
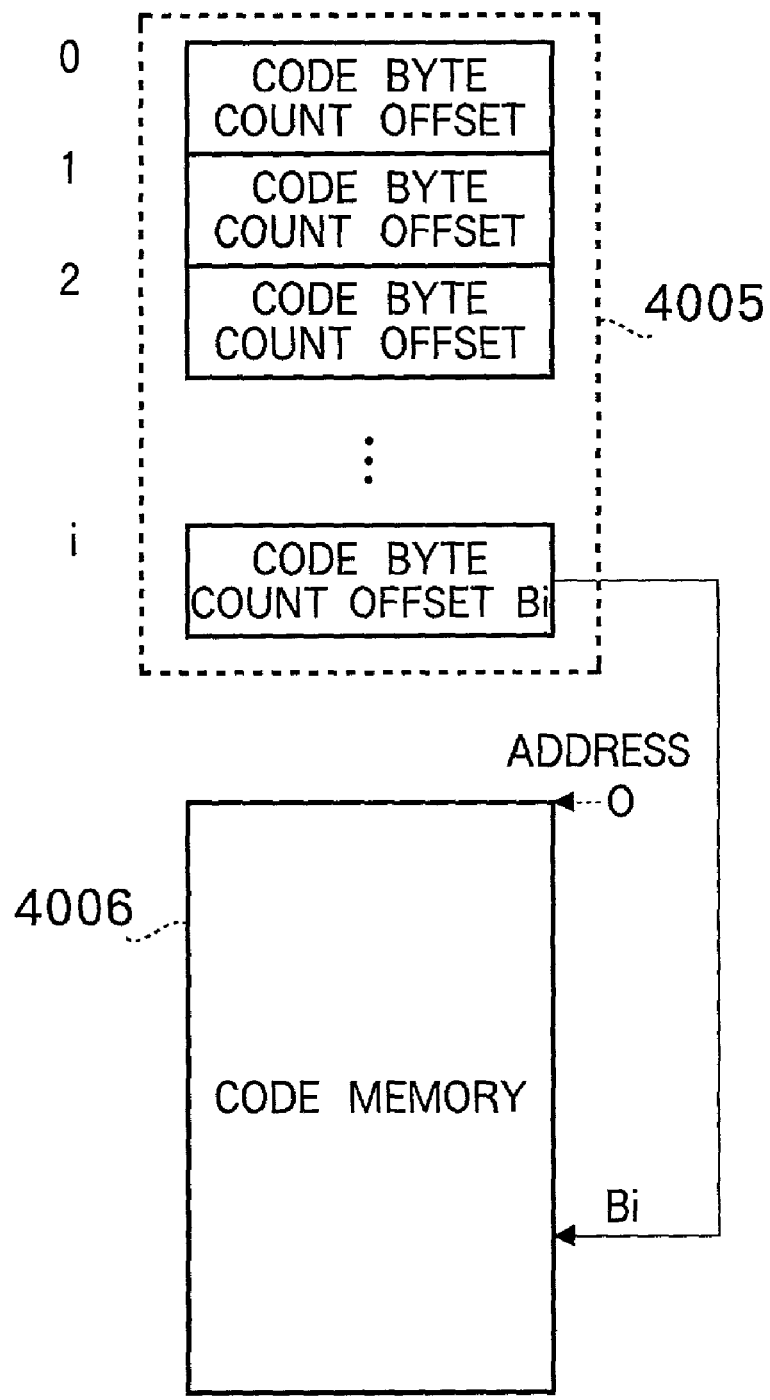
FIG. 14 illustrates contents of a tile control table.

FIG. 14 shows a configuration example of tile control table 4005 shown in FIG. 1 and FIG. 2.

In the case where tiles are not decoded independently, such a control table is not necessary. One merit of coding tile by tile is the ability to freely expand, compress or rotate a tile image independently of other tiles.

When the tile decoding sequence is different from the tile coding sequence, it is necessary to know the location of the code memory where the start code of the tile is written.

For this reason, tile control table 4005 stores the amount of offset of the start of each tile from the start of the page. The offset value is a count value indicating the number of code bytes.

When coded data and tile information are transferred to memory through the two DMA ports, information to reconstruct any tile can be constructed naturally at the end of one page.

To allow the decoder to decode, for example, the ith tile, address Bi2000 of the start code of the tile is written at an address of memory 4006 which is offset by i words from the start of the tile control table.

MPU 4008 can read this value, set it in a predetermined register provided in coding/decoding section 15 in FIG. 2 and issue a decoding command.

Thus, it is possible to easily perform configuration of the coding/decoding section as well as counting of the number of code bytes and DMA output.

The features of image area decision, layering, approximation processing, DCT or quantization processing in the apparatus shown in FIG. 1 will be explained below.

Figure 15:
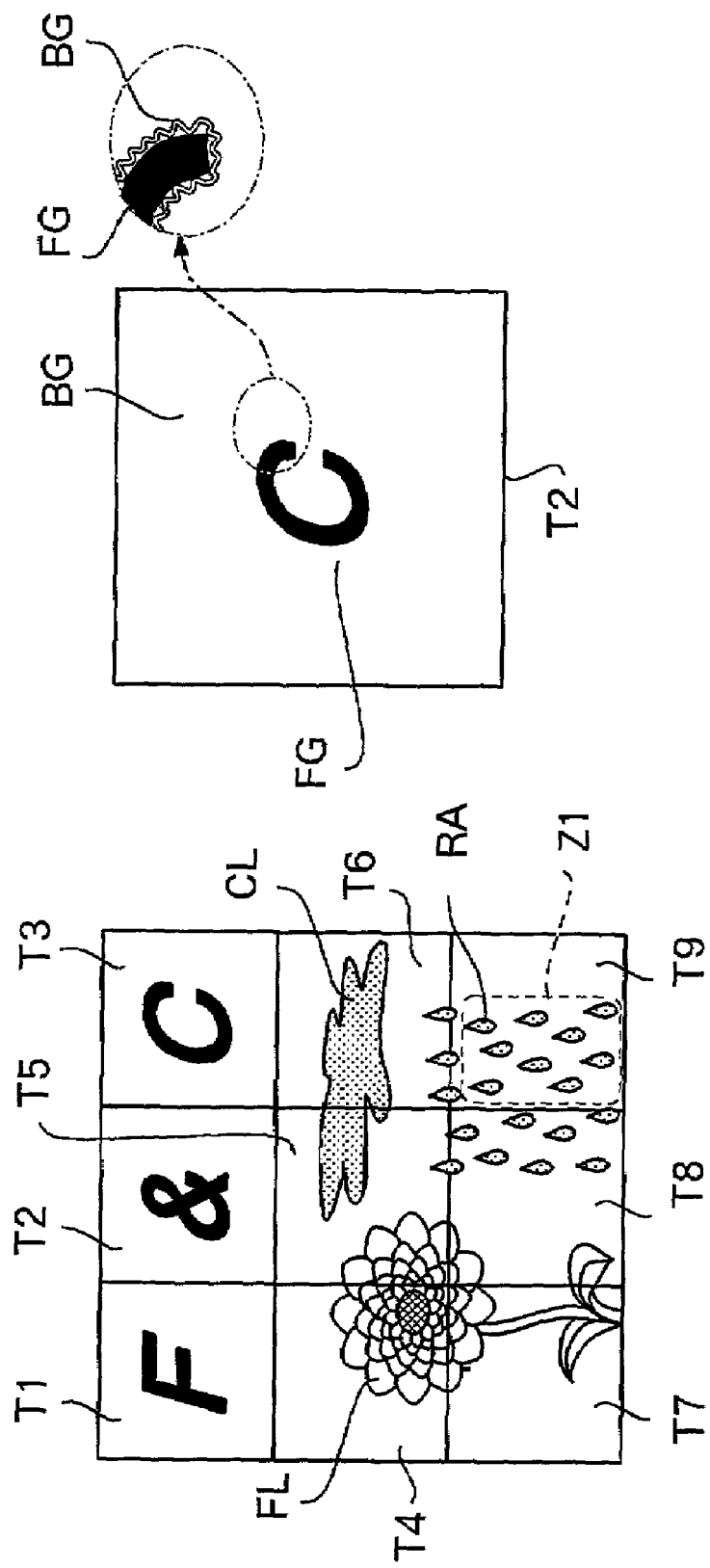
FIG. 15A illustrates an example of a mixed image.
FIG. 15B illustrates a tile image.

Now, suppose a case where a mixed image (multi-valued image) in which bi-level images and photographic images are mixed as shown in FIG. 15A is coded. This one image is divided into 9 tiles (macro blocks) T1 to T9.

Tiles T1 to T3 are character (line drawing) tiles and tiles T4 to T9 are photographic tiles. In the present invention, image area decision is performed using a tile (macro block) as a unit to determine whether each tile is a character (line drawing) tile or a photographic tile.

Then, the present invention carries out layering within a tile.

FIG. 15B shows only tile T2 (character tile) extracted.

Though tile T2 is a character tile, it is an image read by an optical system and therefore the edges contains areas including gray-scale components. The photographic areas of these edges have considerable influences on the visual characteristic and cannot be ignored.

As in the case of conventional arts, performing image area decision shortsightedly using a small micro block as a unit will increase erroneous determinations. Therefore, this embodiment examines brightness distributions of all pixels within a large unit called a tile (macroblock) and groups each pixel into a foreground (FG) and background (BG).

That is, character tile T2 is separated into layers of a completely black area (FG) and a white area (area including a photographic area of character edges: BG) surrounding the FG.

Layer separation is not limited to separation into FG and BG and it goes without saying that character tile T2 can be separated into more layers.

This embodiment applies layer separation between FG and BG only to character tiles, but there are also cases where such layer separation can be applied to photographic tiles, too.

For example, when attention is focused on photographic tiles T4 to T9 in FIG. 15A, the raindrop area (area Z1) in tile T9 has a limited concentration distribution compared to images such as flower and cloud with complicated shading in other photographic tiles and has a simpler image.

In such a case, the raindrop may also be brought to the foreground (FG) apart from the background (BG).

Taking into account the special characteristics of multi-valued images to be coded, selectively applying layer separation to every target feature will greatly contribute to improvement of the image quality.

Carrying out such layer separation (processing which eventually switches between coding systems pixel by pixel) will increase entropy, and therefore it is necessary to suppress this. Thus, the present invention uses approximation processing together.

Furthermore, the present invention applies feedback control considering the performance of the apparatus so that the amount of coding does not vary depending solely on the complexity of the image and thereby stabilizes the amount of coding.

That is, one major feature of the present invention is the simultaneous use of image area separation, layer separation and approximation processing thereof.

Separating all tile images into layers without image area decision will result in one photographic image separated into two layers, which will cause entropy to increase extremely and the amount of coded data to increase.

Moreover, since bitmap information (flag information indicating to which of FG and BG each image in one layered tile belongs) is also added to this, it is not possible to increase compressibility.

If there is an ideal mixed image such as an image obtained by combining a computer-created bi-level image and a photo, it might be possible to compress the image with high accuracy using such a method, but such an attempt fails with an image read by a scanner.

To solve this problem, image area decision is introduced in the first stage. In the case of a document image, information is concentrated on bitmap images, and in the case of a photo or dot image, information is concentrated on a BG memory.

These photographic images, for example, dull edges of a character image, are coded in two separate layers. Then, an increase in entropy caused by separation into two pieces of gradation information will be reduced by subsequent approximation processing.

Moreover, the overall code size is forcibly controlled taking into account the performance of the apparatus and pipeline matching. This is the basic concept of the coding system of the present invention.

Figure 16:
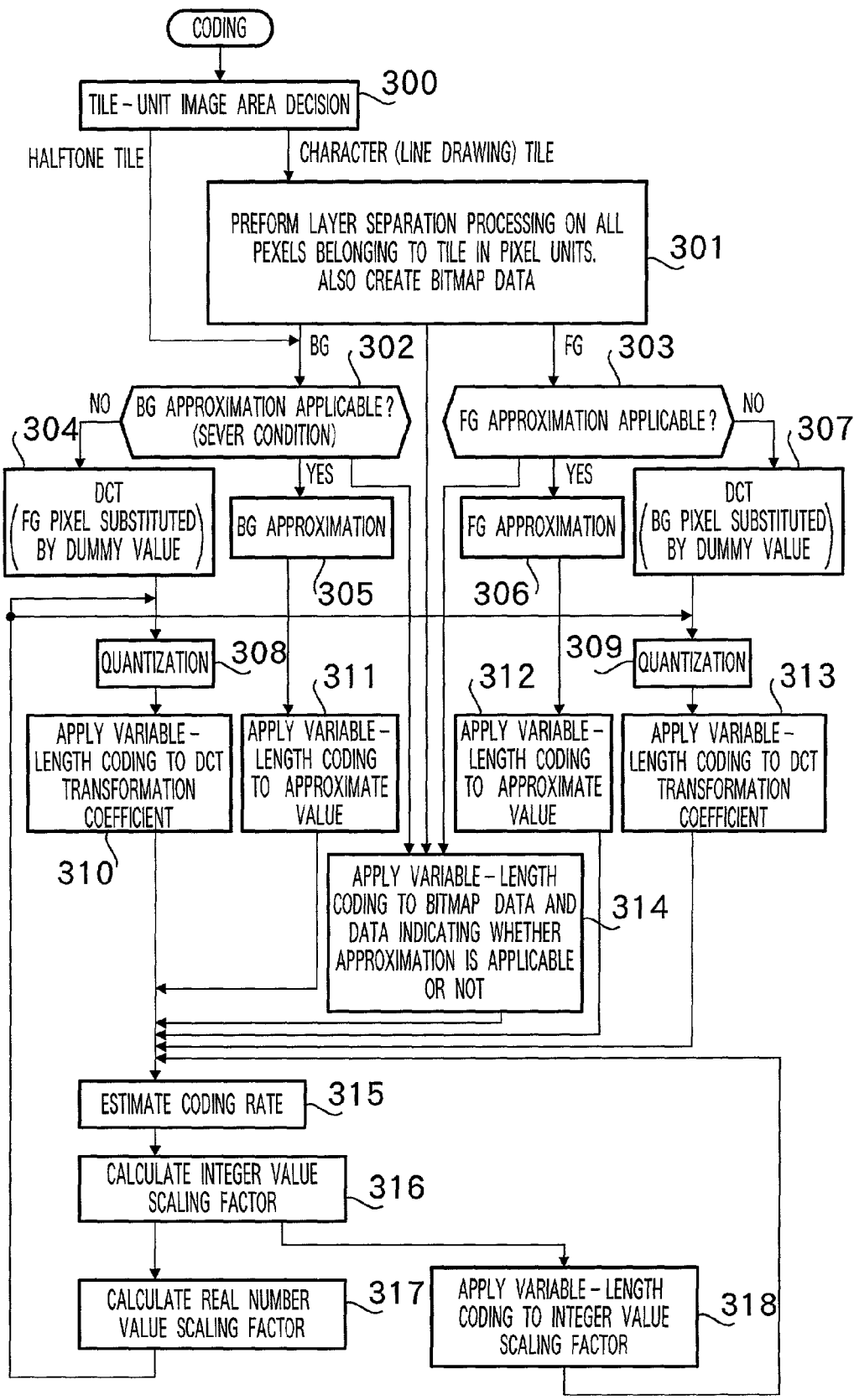
FIG. 16 is a flow chart illustrating a main operation of the MFP in FIG. 11.

FIG. 16 summarizes the features of the operation of the apparatus in FIG. 11.

First, image area decision in tile (macro block) units is performed to group the image into photographic tiles and character (line drawing) tiles (step 300).

Then, layer separation is performed on character (line drawing) tiles based on brightness distributions of all pixels included in the tiles to separate the tiles into FG and BG. At the same time, bitmap data to indicate to which of FG and BG each pixel belongs is created (step 301).

Then, for each layer (BG and FG) it is decided whether approximation processing is applicable or not (steps 302 and 303).

Approximation processing is the processing by which brightness of all pixels that belong to a layer is approximated with one brightness value. Here, FG (foreground) is completely black and not conspicuous even after approximation, and therefore it is decided whether approximation processing is applicable or not under more relaxed determination conditions.

In contrast, since the BG (background) includes an important component of the photographic section of character edges, special care is required as to losing such an important component due to approximation processing. Thus, it is decided whether approximation processing is applicable or not under stricter conditions.

When approximation processing is possible, approximation processing is carried out (steps 305 and 306) and when approximation processing is not possible, DCT (discrete cosine transformation) is performed as in the case of JPEG (steps 304 and 307). Here, DCT is performed using a block of 8 pixels×8 pixels (micro block) shown in FIG. 13A.

For example, when it is decided that most pixels in one block belong to the BG and pixels decided to belong to FG are exceptionally included, DCT is carried out with the gradation level of those pixels set to 255 (white).

A dummy value of "255" is set to prevent the boundary edges of the BG area from becoming sharp because the BG (background) is whitish. That is, when a spatial frequency increases, a quantization error also increases and the original BG image may be more easily damaged due to influences of the error during decoding and a dummy value of "255" is set to prevent this.

Then, a DCT coefficient is quantized (steps 308 and 309). The width of the quantization step at this time is adaptively changed through negative feedback control.

The width of the quantization step is changed by changing the value of a parameter called "scaling factor".

Then, the quantized value of the DCT coefficient and FG/BG approximate values are coded with a variable-length code with high compressibility (steps 310 to 313).

At the same time, the flag indicating whether approximation processing is applicable to the BG and FG or not is also coded (step 314). The coded data is stored in code memory 4006 in FIG. 1.

On the other hand, the coding rate is estimated (step 315) and a scaling factor is generated so that the estimated value is controlled to fall within a predetermined range.

There are two kinds of scaling factor; an integer value and real number value. First, a simple scaling factor with an integer value is generated (step 316) and that scaling factor with an integer value is subjected to variable-length coding (step 318).

On the other hand, a scaling factor with a real number value is calculated from the scaling factor with an integer value based on a predetermined relational expression (step 317), and the width of the quantization step is controlled using the scaling factor with a real number value to adjust the amount of coding.

These are the features of operations of the apparatus in FIG. 11.

Then, each component of the apparatus in FIG. 11 will be explained below more specifically. Since decoding is deduced as a reverse calculation of coding, only coding will be explained below.

As shown in FIG. 11, the main components of the apparatus of the present invention are layer separation/approximation processing section 2100, arithmetic coder 1001, rate estimator 3000 and control section 1007 that controls the entire coder. Necessary timing signals are supplied to each section from control section 1007.

Arithmetic coder 1001 further comprises numerical context generator 1002, bitmap context generator 1003 and arithmetic coding calculator 1004.

Memory 1006 stores flag information indicating attributes of tiles.

Input signals for layer separation/approximation processing section 2100 include multi-valued images and scaling factor (scaling factor with a real number value) $\beta_i$ of the quantizer.

In this embodiment, suppose the gradation value is 256-level and one pixel is expressed with 8 bits. Output signals include a quantized value of the orthogonal transformation coefficient, level information, flag information, numerical information such as a scaling factor of the quantizer and bitmap data.

The numerical data is input to numerical context generator 1002 where coding symbols for arithmetic coding and context identification signals (CTXID) are created.

Likewise, bitmap data is also input to bitmap context generator 1003 where coding symbols and context identification signals are created. Arithmetic coding calculator 1004 carries out coding calculations using estimated values of probability of symbols based on this information and outputs coded data.

Rate estimator 3000 estimates a coding rate from the amount of image coded so far and amount of coded data.

A scaling factor to determine the width of quantization is calculated based on the estimated value. The width of quantization is determined by uniformly scaling the width of quantization predetermined for each frequency component with scaling factor $\beta_i$.

The scaling factor is obtained by calculating scaling factor with an integer value $\alpha_i$ first and then converting $\alpha_i$ to real number value $\beta_i$ in one-to-one correspondence. It is $\beta_i$ that is supplied to the quantizer and it is $\alpha_i$ that is coded.

This embodiment will be explained in detail below centered on layer separation/approximation processing section 2100 and rate estimator 3000.

Figure 17:
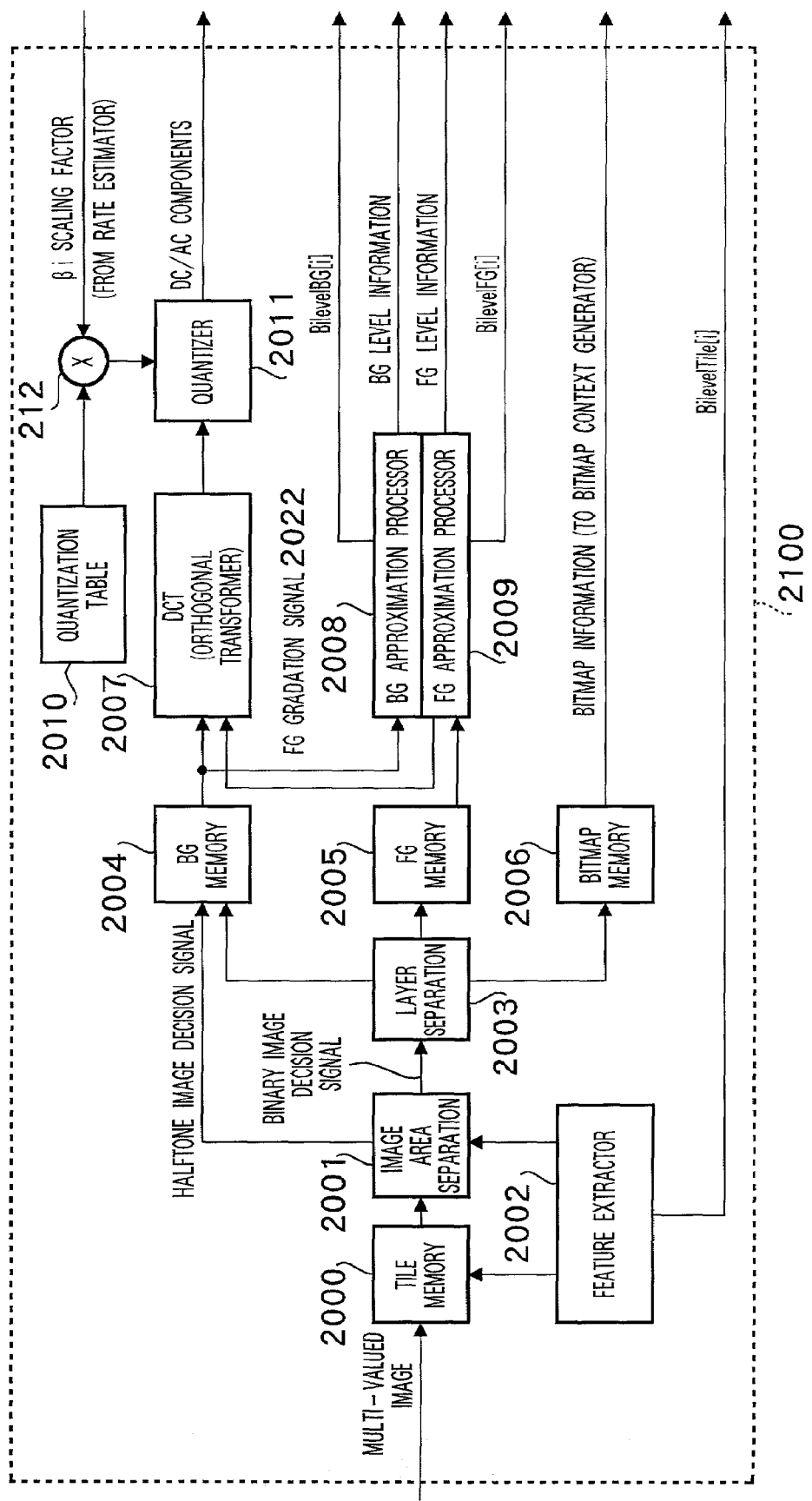
FIG. 17 is a block diagram showing a configuration of a layer separation/approximation processing section.

FIG. 17 is a block diagram showing a configuration of layer separation/approximation processing section 2100.

The processing in this section is broadly grouped into image area separation of tile images, layer separation of tile images decided to be bi-level images, approximation processing of a signal separated into layers, orthogonal transformation by DCT and quantization processing.

A multi-valued image is covered with a tile of a predetermined size as shown in FIG. 15B. The shape of the tile is assumed to be a square for simplicity, but exceptionally a rectangle determined by the tile size and the size of the image at the right end and bottom end of the image.

As described above, the size of one tile is 32 pixels×32 pixels in this embodiment.

One tile is further divided into blocks. A block is a unit of transformation and coding and has a size of 8 pixels×8 pixels. DCT is performed in units of this block, transformation coefficient is quantized and subjected to variable-length coding.

Tile images to be coded are input to tile memory 2000. Tile images are separated by image area based on the information of feature extractor 2002.

Image area separation decides tile by tile whether each tile image belongs to the bi-level image section or photographic image section.

When a target tile is a photographic image such as a photo, a photographic image decision signal is output, while the target tile is regarded as a bi-level image, a bi-level image decision signal is output. Image area separation is performed as follows.

Figure 18B:
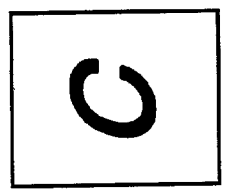
FIG. 18B illustrates an example of one tile image.
Figure 18A:
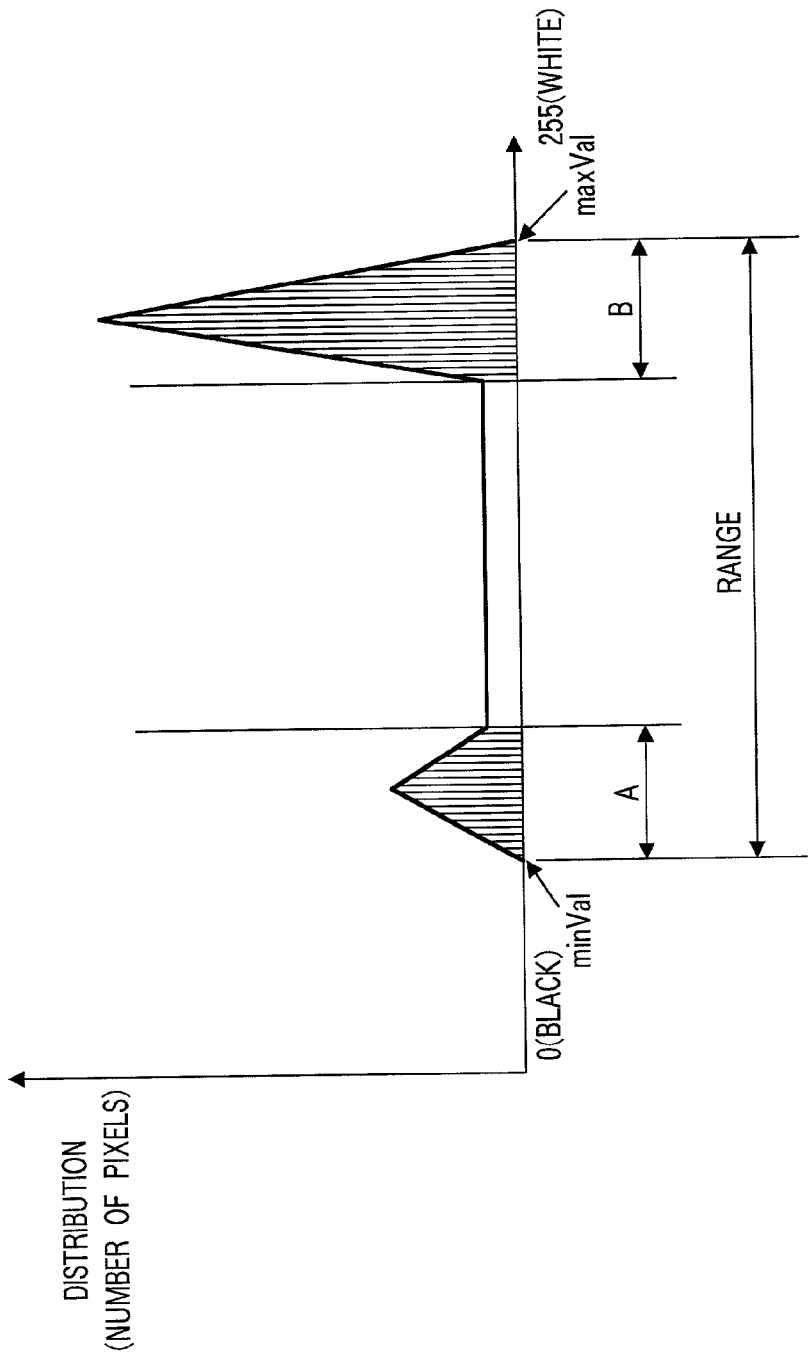
FIG. 18A illustrates a brightness histogram (used for image area decision of tiles) with one tile.

FIG. 18A and FIG. 18B illustrate image area separation processing.

For ease of understanding, suppose a character tile on which a character "C" is written as shown in FIG. 18B.

FIG. 18A illustrates a brightness histogram (probability distribution) of all pixels included in the character tile as shown in FIG. 18B and the horizontal axis denotes a brightness value and the vertical axis denotes frequency of occurrence.

A brightness value is expressed with 8 bits, "0" indicates black and "255" indicates white.

Such a brightness histogram is acquired by feature extractor 2002.

A bi-level image is characterized by ① having a wide range of distribution with peaks concentrated at both ends and ② being distributed within a narrow range.

These features are digitalized and these values are compared with a predetermined reference to decide a bi-level image tile. If the tile is not a bi-level image tile, the tile is then decided to be a photographic image tile.

When the number of pixels (peakNum) that belong to ranges "A" and "B" at both ends of the distribution shown in FIG. 18A is equal to or greater than a predetermined value (numTh) of the total number of pixels of the tile, it can be decided that the distribution is biased.

The width of area A or area B is one of threshold values determined from RANGE=maxVal−minVal. This width is assumed to be ⅛ of RANGE for both areas in this embodiment. Using these values, a first decision condition is expressed as shown in Expression (1) below. Bi-level decision condition 1

$$(\text{peakNum} > \text{numTh}) \&\& (\text{RANGE} > \text{rangeTh}) \quad (1)$$

where numTh is assumed to be ¾ of the number of tile pixels. rangeTh is a threshold to decide the extension of distribution and rangeTh=128. && is a logical multiplication.

In short, the above-described condition expresses a condition that the difference between maxVal and minVal is ½ or above of the dynamic range of gradation and ¾ or more of the total number of pixels is distributed at both ends ⅛ of the distribution. When these conditions are satisfied, the tile is decided to be a character tile (bi-level tile).

Furthermore, as a second decision condition, when the concentration distribution of the tile image is extremely limited and it is possible to approximate the concentration distribution with single gradation (when it is decided that there will be no problem with approximation), the image is decided to be a bi-level image.

That is, the tile is decided to be a character tile also when Expression (2) below is satisfied. Bi-level decision condition 2

$$\text{maxVal} - \text{minVal} < 3 \quad (2)$$

Therefore, the tile is decided to be a bi-level image tile when either Expression (1) or Expression (2) is satisfied.

It is also possible to tighten up or loosen the criteria by changing A and B indicating the width of distribution between both ends or numTh and rangeTh.

Furthermore, depending on the attribute of the already coded tile, when the surrounding area is a bi-level image tile, it is also possible to perform adaptation such as changing the threshold to make it easier to decide that the target tile is a bi-level image. Such processing can be easily implemented.

Feature extractor 2002 outputs BilevelTile(i) indicating the attribute of a tile (whether the tile is a bi-level tile or photographic tile). This signal identifies whether the ith tile is a bi-level image tile or photographic tile according to Expression (3) below.

The tile number is reset at the start of a stripe and counted up tile by tile in the stripe. The stripe refers to an oblong partial image made up of tile size×line width.

BilevelTile(i)=1 The ith tile is a photographic image tile.

$$\text{BilevelTile}(i) = 1 \text{ The ith tile is a bi-level image tile.} \quad (3)$$

Then, layer separation processing will be performed on a tile decided to be as a character tile (bi-level tile).

That is, a bi-level image signal is further separated into layer signals. Here, layer signals refer to a background signal (BG signal) and foreground signal (FG signal).

As described above, there are valuable photographic components around character edges. It is a great merit of layer separation over a character tile that photographic information of character edges can be saved in a natural mode by deciding the photographic components as a background (BG) based on the brightness distribution of all pixels included in one tile and separating it from the body of the character (foreground).

This embodiment separates the bi-level image signal into two layers, but more generally it is also possible to separate into two or more layers.

FIGS. 19A and 19B illustrate layer separation processing.

As shown in FIG. 19B, a character tile includes the body (B) of a character, photographic area (G) of edges and white area (W) of a background.

The layer separation processing distinguishes the (W+G) layer (background) from the B layer (foreground) pixel by pixel. The processing content is as follows.

This probability distribution differs from one tile to another.

As shown in FIG. 19A, a maximum value and minimum value of brightness are expressed as maxVal and minVal respectively. Here, FGth is defined as an intermediate value between maxVal and minVal.

That is, suppose a threshold that separates the foreground (FG) is FGth and the brightness value of pixel x is L(x), then layer separation is expressed as follows. L(x)>=FGth→x belongs to the BG (background) L(x)<FGth→x belongs to the FG (foreground)

According to the brightness distribution in FIG. 19A, brightness peak P1 corresponds to the white background (W) in FIG. 19B.

Then, area P3 next to brightness P1 (area enclosed by dotted line) corresponds to the gray area (G) of the character edges in FIG. 19B. Peak P2 corresponds to the body (B) of the character.

The background signal is stored in BG memory 2004 and the foreground signal is stored in FG memory 2005.

It is bitmap memory 2006 that stores information to identify the layer to which each pixel belongs.

From bitmap memory 2006, bitmap information is output. When the bitmap information is "1", this means that the pixel belongs to the foreground. Since the tile size is 32 pixels×32 pixels, bitmap memory 2006 has a memory capacity of 32 bits×32 bits. The capacities of BG memory 2004 and FG memory 2005 are the same as the capacity of tile memory 2000.

Then, it is decided whether approximation processing is applicable or not. Approximation processing is carried out to suppress an increase of entropy. Here, bi-level approximation processing of an FG signal and BG signal obtained by separating a bi-level image tile into layers will be explained.

Figure 20:
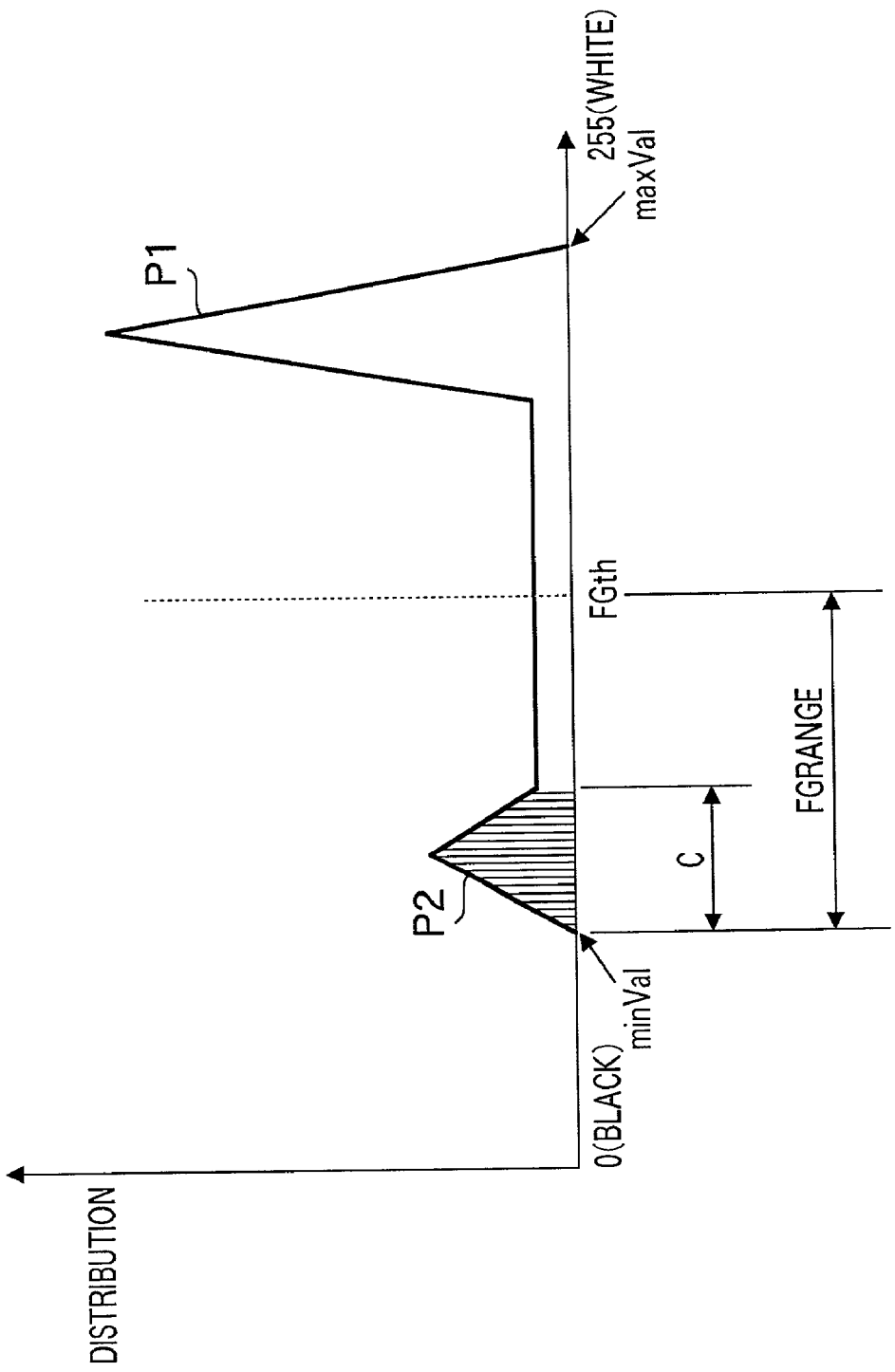
FIG. 20 illustrates processing of deciding whether bi-level approximation is applicable or not to an image in a layered tile.
Figure 21:
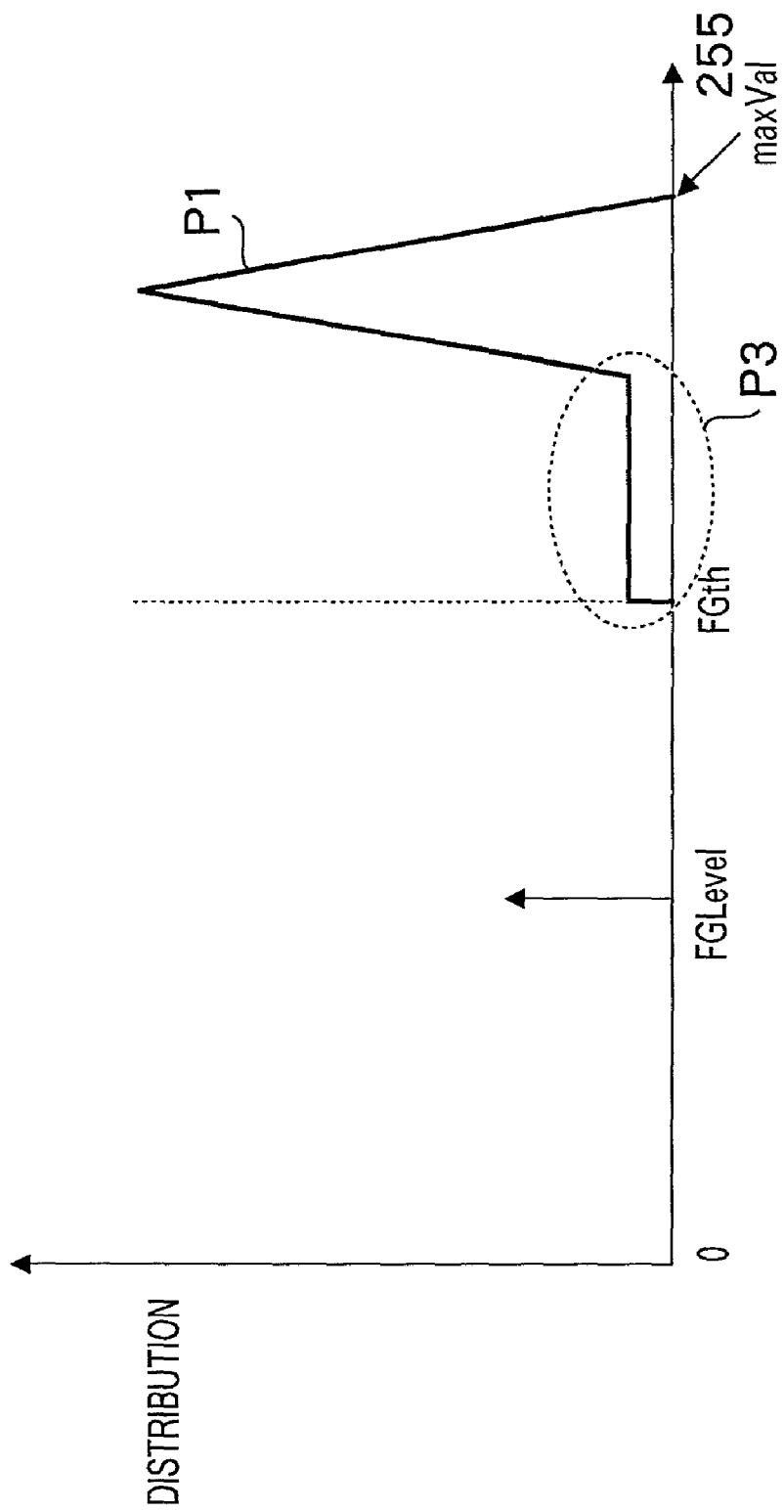
FIG. 21 illustrates a brightness distribution when bi-level approximation is performed on a foreground image (FG image)

Since the same basic concept applies to both FG and BG, FG will be explained as an example here. FIG. 20 and FIG. 21 illustrate approximation processing of FG.

As in the case of image layer separation, whether bi-level approximation is applicable or not is also decided by features of the shape of a histogram.

As already explained, threshold FGth that separates FG and BG is an intermediate value between minVal and maxVal.

Suppose FGRANGE that indicates the range of FG is a difference between FGth and minVal in FIG. 20. The approximation condition for FG is as follows.

FG approximation condition: FGpeakNum>FGnumTh    (4)

Here, suppose FGpeakNum is the number of pixels that fit in area c in FIG. 20 and area width c is ½ of FGRANGE. FGnumTh is a decision threshold and assumed to be ½ of the total number of pixels of FG.

That is, when ½ of the total number of pixels or more is distributed concentrated on area C, it is decided that bi-level approximation is possible.

This is a relatively relaxed condition. As explained before, in the case of FG, no photographic component such as BG is included and even if a small brightness change occurs, that does not have any important influence on the human visual system (that is, an approximation variation of FG is believed to be less conspicuous than a BG variation), and therefore it is decided whether bi-level approximation is applicable or not under relatively relaxed conditions.

The severity of decision can be adjusted by the width of area c and FGnumTh. Furthermore, adaptation according to the ambient condition is easy. As the rate of approximation processing increases, compressibility also improves.

Once it is decided that bi-level approximation is applicable to FG (foreground), the FG distribution is approximated with one level signal FGlevel as shown in FIG. 21. FGlevel is assumed to be an average value of FG pixel values.

That is, an average value is calculated from the "sum total of (brightness level×number of pixels)/total number of pixels" included in area C in FIG. 20 and this is regarded as a typical value of FG. This FGlevel (FG level information) is subjected to arithmetic coding.

On the other hand, when it is decided that bi-level approximation is not applicable to FG, the FG signal is subjected to DCT transform coding as in the case of a photographic tile.

With regard to BG, it is also decided from unbalanced distribution whether bi-level approximation is applicable or not based on the same concept, but the criteria are by far severer than those for FG. When the BG distribution is extremely unbalanced, BG is approximated with a single level signal BGlevel.

In the case of the brightness distribution in FIG. 21, while a concentration on peak P1 is observed as to the background (BG), there is a non-negligible photographic area (P3 area enclosed by dotted line: photographic area of character edges), and therefore it is decided that bi-level approximation is not applicable.

In the case where bi-level approximation is applicable to BG, approximate value BGlevel is assumed to be the brightness value (peak value) of an area where the highest concentration of pixels is observed (that is, peak).

That is, BGlevel is assumed to be a peak value of the BG distribution so that variations are not conspicuous. When it is decided that bi-level approximation is not applicable to BG, the BG signal is subjected to DCT coding as in the case of a photographic tile.

Once it is decided whether bi-level approximation is applicable or not or approximation processing is performed, a decision result and a signal indicating the binary level are generated accordingly.

Output signals from approximation processor 2008 include BG level information and flag information BilevelBG(i). When the background signal can be approximated with a single gradation value, the BG level information is a signal indicating that value. When bi-level approximation is not applicable, the content of the BG memory is sent to DCT section 2007 and coded. Flag information BilevelBG(i) is a flag that indicates whether bi-level approximation is applicable or not to the background (BG) signal. The meaning of the flag is as follows.

BilevelBG(i)=1 Bi-level approximation is applicable to BG signal of ith tile.

BilevelBG(i)=0 Bi-level approximation is not applicable to BG signal of ith tile.

The same applies to the FG level information that expresses the approximation processing result of the FG memory and BilevelFG(i) and the meaning of the flag is as follows. When bi-level approximation is not applicable to the FG signal, FG gradation signal 2022 which is the content of the FG memory is subjected to DCT.

BilevelFG(i)=1 Bi-level approximation is applicable to FG signal of ith tile.

BilevelFG(i)=0 Bi-level approximation is not applicable to FG signal of ith tile.

As shown above, the FG signal and BG signal to which bi-level approximation is not applicable are converted to frequency components by DCT (orthogonal transforming means) 2007.

A frequency component consists of one DC component and 63 AC components.

Here, quantization table 2010 stores quantization step widths for each frequency. These quantization step widths are scaled with scaling factor $\beta i$ and quantized by quantizer 2011.

Suppose the (p, q) components subjected to DCT are Up and q and the corresponding quantization widths are Qp and q. This embodiment defines a quantization calculation as follows. round(x) denotes rounding of x to the nearest integer and floor(x) denotes a maximum integer not exceeding x.

round(Up, q/floor (Qp, q/$\beta i$)), (p, q=0 . . . 7)

where floor (Qp, q/$\beta i$) denotes a quantization step width. With large $\beta i$, the step width is small and the quantization error is small, and therefore the image quality improves. At the same time, the amount of coding increases.

To subject a single tile image to DCT coding, DCT coding for each block (micro block) is repeated in the order indicated by the arrows.

As shown above, layer separation/approximation processing section 1000 expresses each tile image appropriately with an orthogonal transformation coefficient, level information and bitmap information according to features such as characters and photos. This information is coded by the arithmetic coder that follows with high efficiency without any information loss.

The BG level signal and FG level signal indicating the bi-level approximation result, quantized DCT coefficient, flag BilevelTile[i] indicating whether the tile is a bi-level image tile or photographic image tile, bitmap information indicating whether each pixel belongs to BG or FG, flag information BilevelFG[i] and BilevelBG[i] indicating whether bi-level approximation is applicable or not and a scaling factor with an integer value which will be explained in detail later are compressed efficiently by arithmetic coder 1001.

The operation of the overall coding processing described above is summarized in FIG. 22 to FIG. 24.

Figure 22:
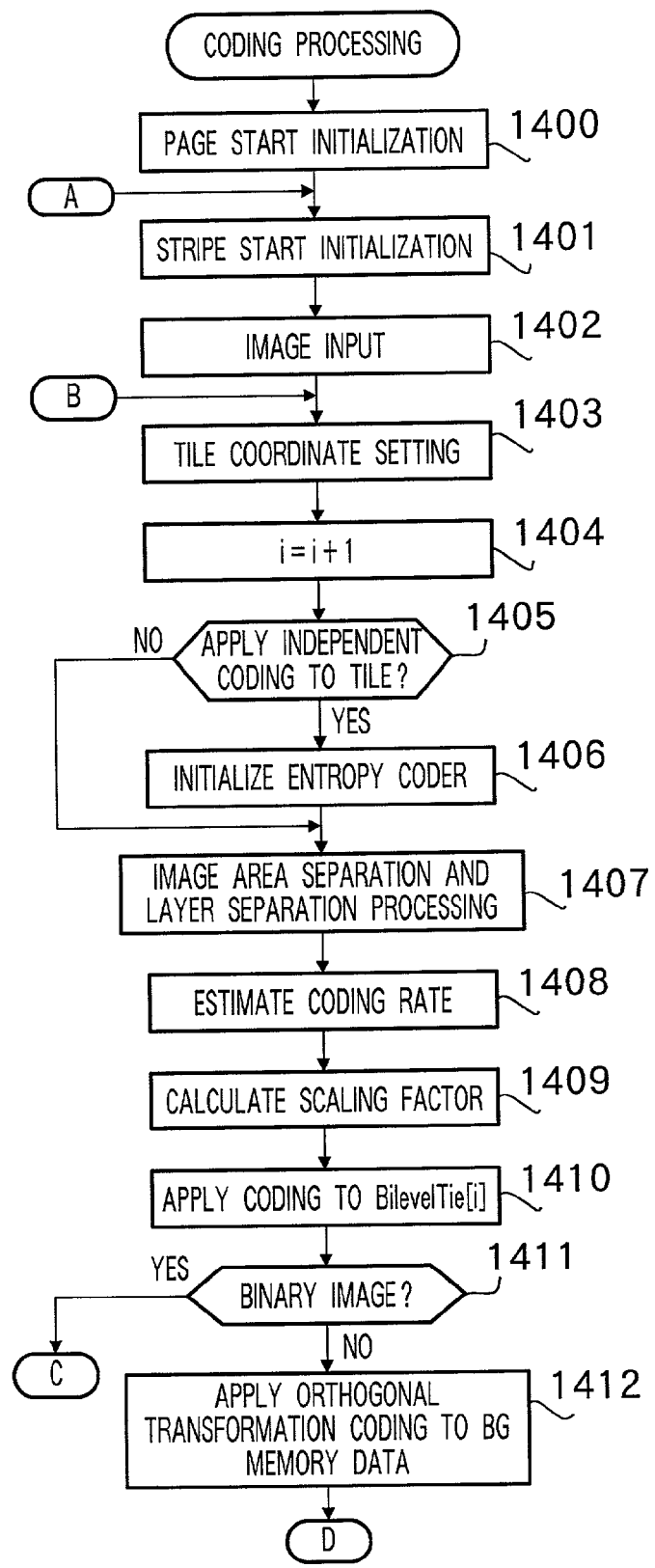
FIG. 22 is a flow chart showing a procedure of coding processing.

First, FIG. 22 will be explained.

That is, process 1400 and process 1401 correspond to initialization such as a reset of a counter. In process 1402, an image is input to a line memory. FIG. 1 does not show any memory for this purpose, but suppose there is a memory equivalent to one stripe or so.

In process 1403, a tile to be coded is selected. The tile can be specified with coordinates at the top left of the tile. In process 1404, the number to identify the tile inside the stripe is updated.

This counter is reset in process 1401. In process 1405, an operating mode as to whether the tile is to be coded independently or not is selected. When the tile is coded independently, it is possible to reconstruct the tile image during decoding in the order different from the order during coding. When coding is performed independently, the coder is initialized in process 1406.

Since arithmetic coding is used, clearance of the context area or initialization of the coding calculation register corresponds to this initialization. Process 1407 corresponds to image area separation and layer separation processing on one tile image.

Figure 36:
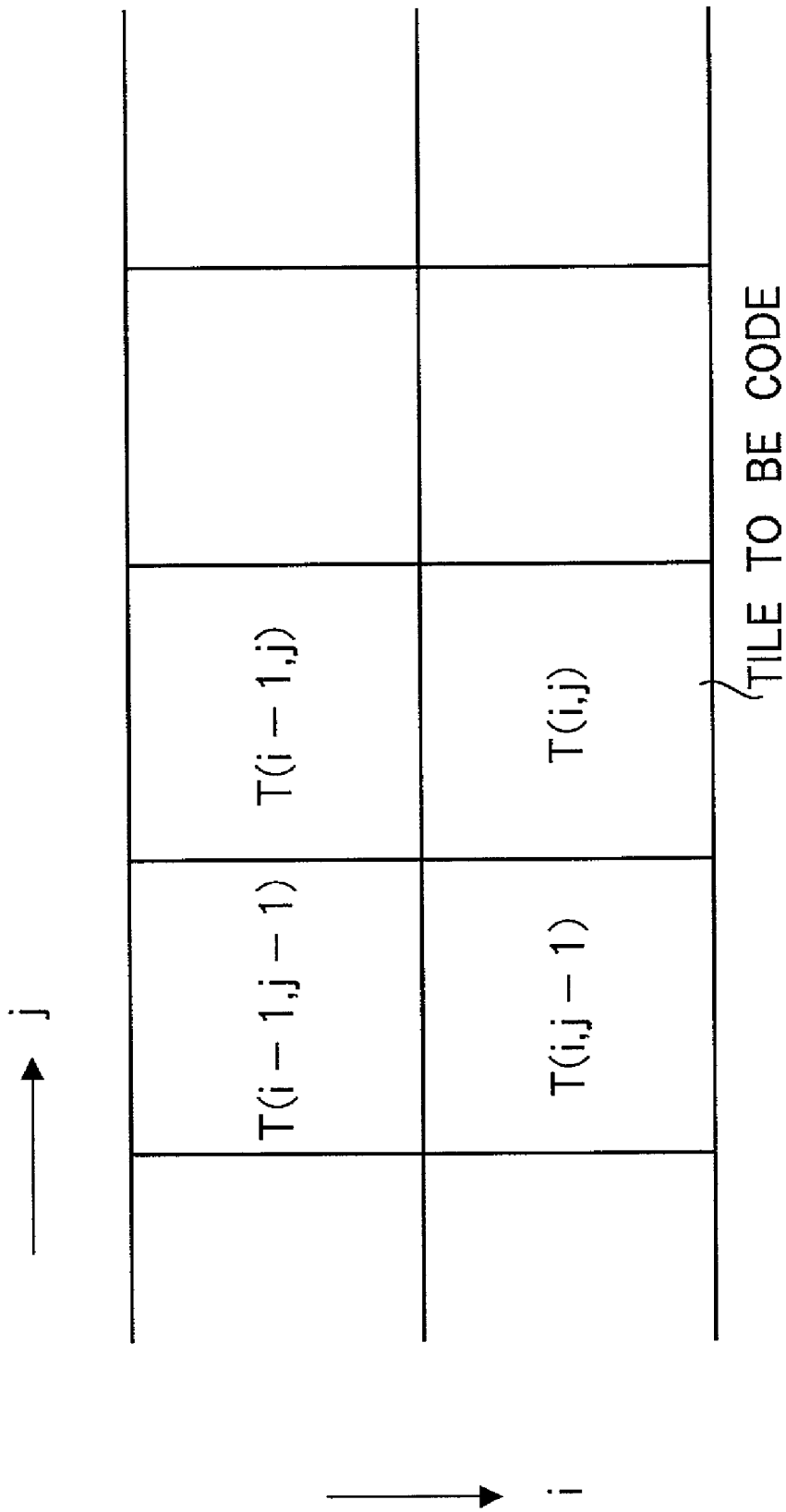
FIG. 36 illustrates generation of a context when various kinds of flag information are subjected to arithmetic coding.

Process 1408 and process 1409 correspond to rate estimation. These will be explained in detail later. In process 1410, flag BilevelTile(i) indicating the image area separation result is coded. For coding, a context is created with reference to flags of peripheral tiles. FIG. 36 shows this process.

As shown in FIG. 36, T(i, j) corresponds to a tile to be coded and indicates that the tile is located at row i and column j.

From the values of the flags of three peripheral tiles, a context is created and coded. The 8 flag information pieces of the immediately preceding stripe are stored in memory 1006 in FIG. 11. Other flag information pieces are also coded in the same way.

If the case where the result of the decision in process 1411 shows that the tile is a bi-level image tile, the process moves on to label c and layer separation coding is performed. In the case of a photographic image tile, the content of the BG memory is subjected to orthogonal transformation coding in process 1412.

Tile image data is written in the BG memory in process 1407. Then, the process moves on to label D, where depending on a decision on the end of the stripe or the end of the page, the process ends or the above processing is repeated until the process ends.

Figure 23:
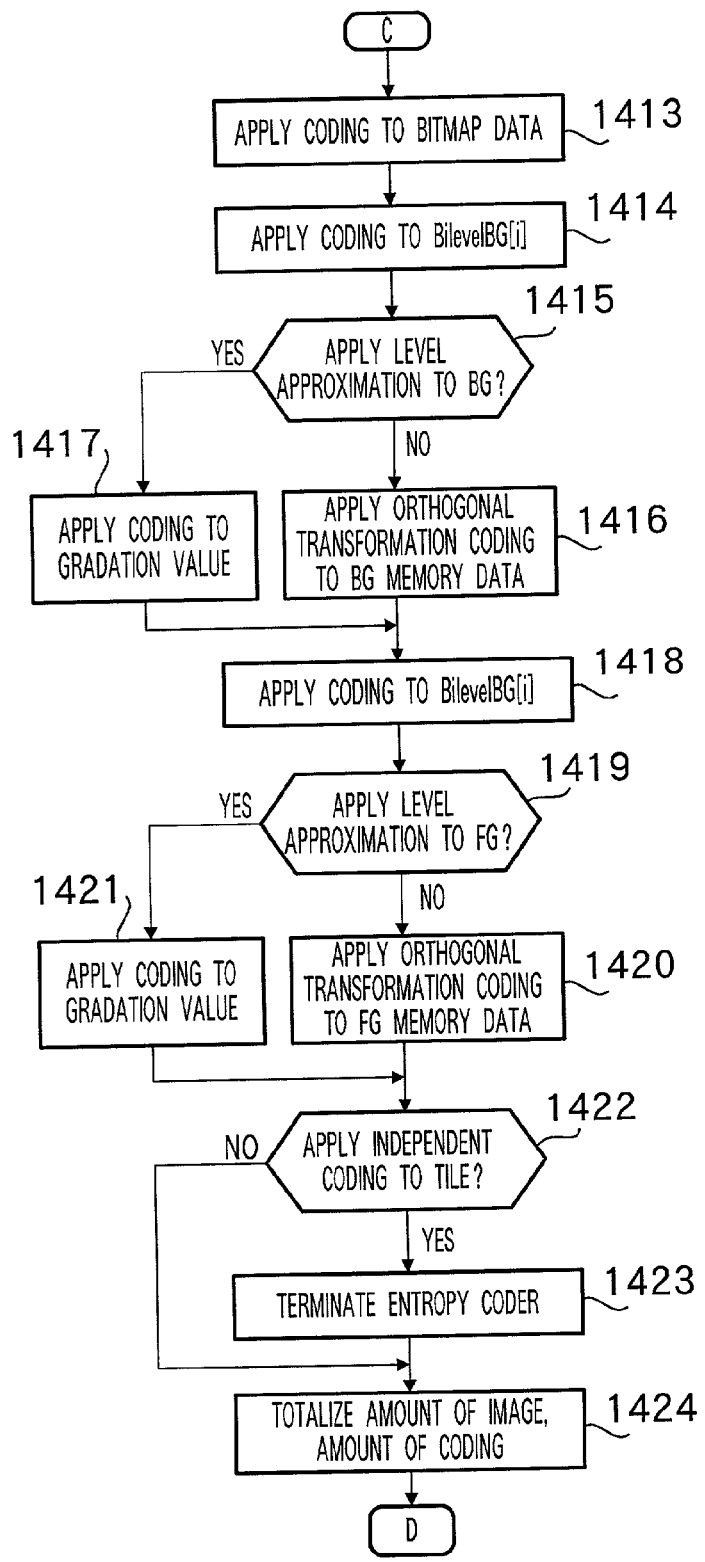
FIG. 23 is a flow chart showing a procedure of coding processing.
Figure 24:
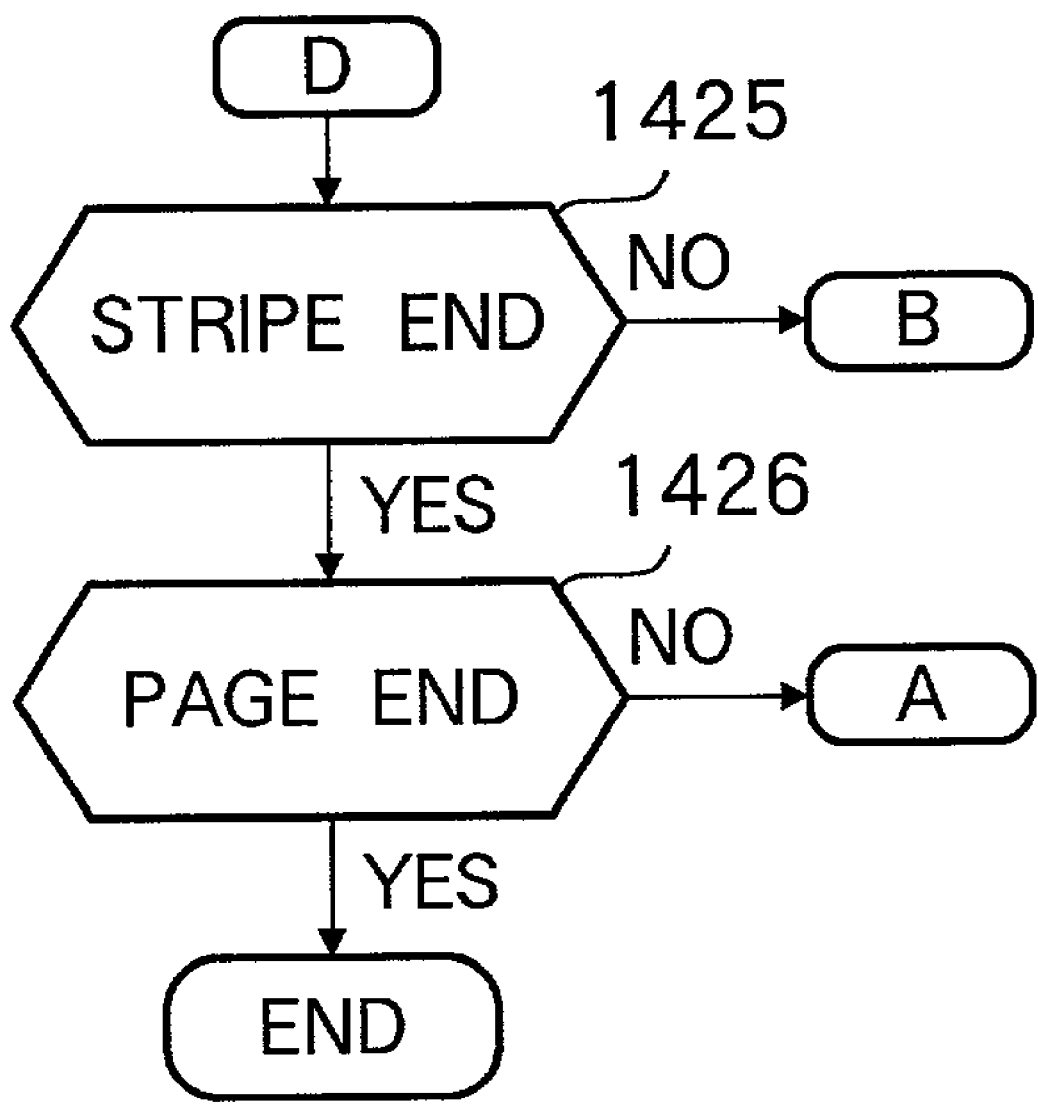
FIG. 24 is a flow chart showing a procedure of coding processing.

Next, FIG. 23 will be explained.

In the case of a bi-level image tile, bitmap data is coded in process 1413. The bitmap data is coded according to a system similar to JBIG.

Figure 37:
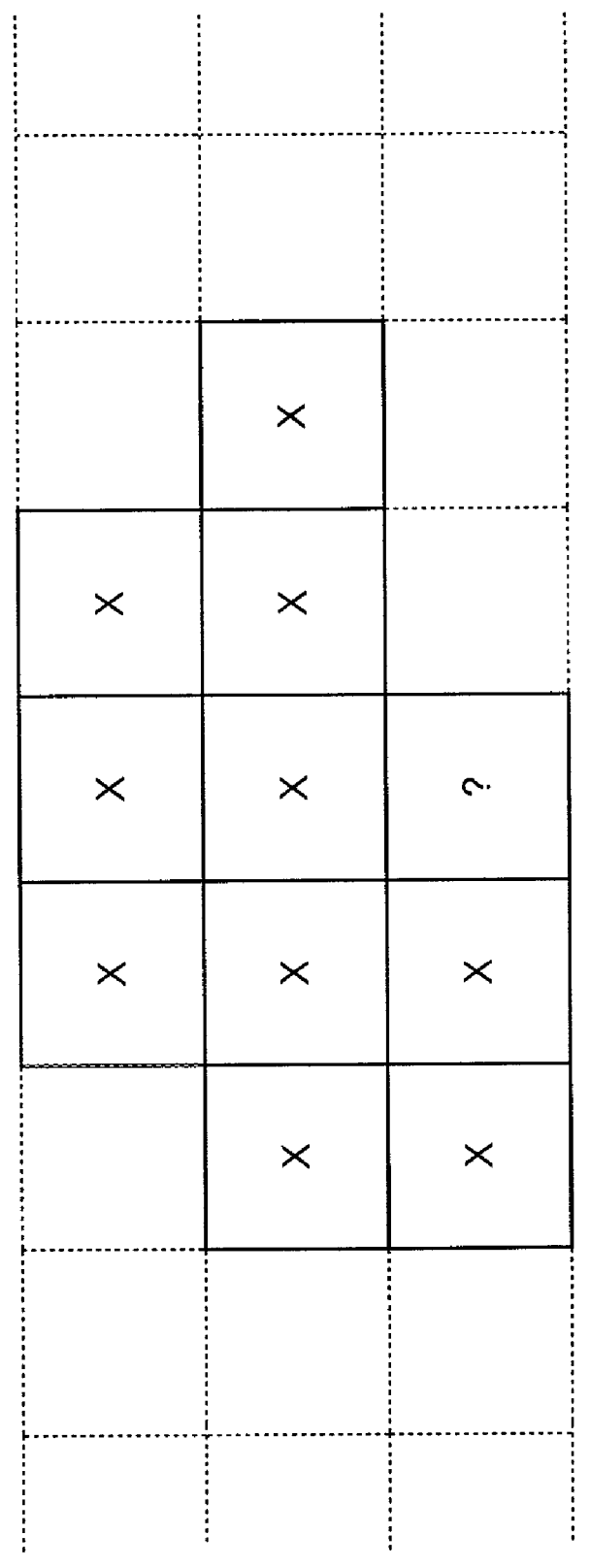

FIG. 37 shows an array of reference pixels to code a bitmap. As in the case of JBIG, the question mark represents a pixel to be coded and "x" is presenting 10 pixels are reference pixels.

For every 1024 contexts made by reference pixels, arithmetic coding is performed based on coding symbols, coding symbol predicted values and probability estimated values. Suppose the functions necessary for arithmetic coding are included in arithmetic coding calculator 1004.

In process 1414, flag BilevelBG(i) indicating whether bi-level approximation is applicable or not to the background image is coded. When bi-level approximation is applicable, level information is coded in process 1417. At this time, when the tile is coded independently, the level itself is coded or a difference from the BG level value of the preceding tile is coded otherwise.

When bi-level approximation is not applicable, the BG data is subjected to orthogonal transformation coding in process 1416. Processes 1418 to 1421 are similar to the processes on FG.

Process 1422 and process 1423 correspond to decision on termination processing of the coder. At this point, coding of one tile is completed.

In process 1424, the amount of image and the amount of coding are totalized and preparations for rate estimation of the next tile are made. The above-described processes are repeated until processing of one stripe is completed and processing of the stripe is repeated until processing of one page is completed. Coding processing is performed in this way.

As described above, the present invention divides a multi-valued image to be coded into tiles (macro blocks) and decides whether each tile is a bi-level image (character image) or a photographic image from a statistical amount using a histogram, etc. formed with brightness values.

A photographic image tile is coded using orthogonal transformation by DCT which is similar to JPEG. On the other hand, a bi-level image tile is further separated into layers of a background image, foreground image and bitmap image.

Layer separation calculates a threshold from the histogram and groups pixels having higher brightness than the threshold under the background image and other pixels under the foreground image.

Information indicating to which of the background and foreground each pixel belongs is required for every pixel of a tile image and this information is the bitmap image.

Then, it is decided according to separate criteria whether bi-level image approximation is applicable or not to the background image and foreground image.

If bi-level image approximation is applicable, the foreground image or background image is expressed with a single brightness value. Otherwise, the image is subjected to orthogonal transformation coding as in the case of a photographic tile image.

When bi-level image tiles and photographic image tiles are mixed, if bi-level approximation is not applicable to the background image, the image is regarded as a photographic image and therefore continuity of the background image quality is maintained so that variations are less conspicuous.

In comparison with a background image, a foreground image (image with high concentration) is rougher and its concentration variation is less conspicuous even after approximation and it is possible to increase compressibility by increasing the degree of approximation.

Information that expresses the image tile by tile is an orthogonal transformation coefficient or approximated brightness value or bitmap information. This information is transformed to a coding data string by high efficiency variable-length coding. To improve the image quality by comparing with a same coding rate, high performance variable-length coding is required.

The present invention uses arithmetic codes for variable-length coding. With a binary document image in particular, the image information can be integrated into bitmap information.

The present invention codes bitmap information using a method similar to JBIG. Furthermore, since a photographic image such as a photo is coded like JPEG, a document image can be coded with an amount of coding similar to JBIG and a photographic image can be coded with an amount of coding similar to JPEG.

In the case of a document image in particular, this system achieves compressibility several times higher than compression according to JPEG.

Then, negative feedback control of a coding rate will be explained.

The rate estimator suppresses the amount of coded data within a predetermined range and at the same time controls the quantizer so that the image quality can be optimized at the coding rate.

This embodiment assumes that a multi-valued image of 8 bits per pixel is compressed to 1 bit/pixel or so. Layer separation/approximation processing section 1000 separates the image into photographic information and other information such as bitmap.

Since this embodiment performs rate control by means of the quantization step width, the control target is a photographic component extracted from the tile image.

A complicated character image can also be coded to 1 bit/pixel or smaller through JBIG-like compression.

Figure 25:
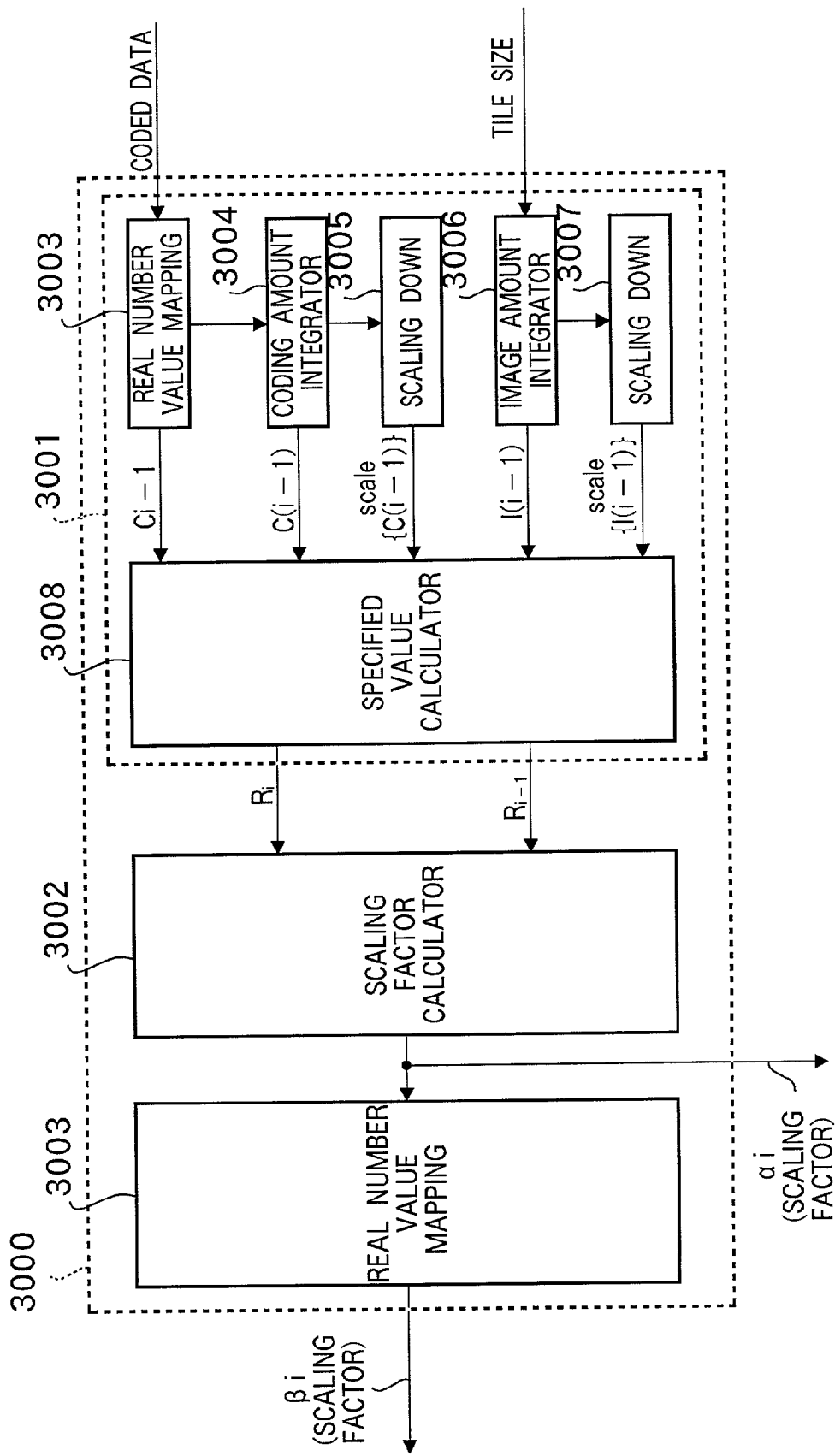
FIG. 25 illustrates a configuration of a coding rate estimator.

FIG. 25 is a block diagram of a rate estimator.

The rate estimator is constructed of three blocks, that is, coding rate estimator 3000, scaling factor calculator 3001 and real number value mapping 3002.

Operations of the coding rate estimator, scaling factor calculator and real number value mapping will be explained in this order.

Figure 26:
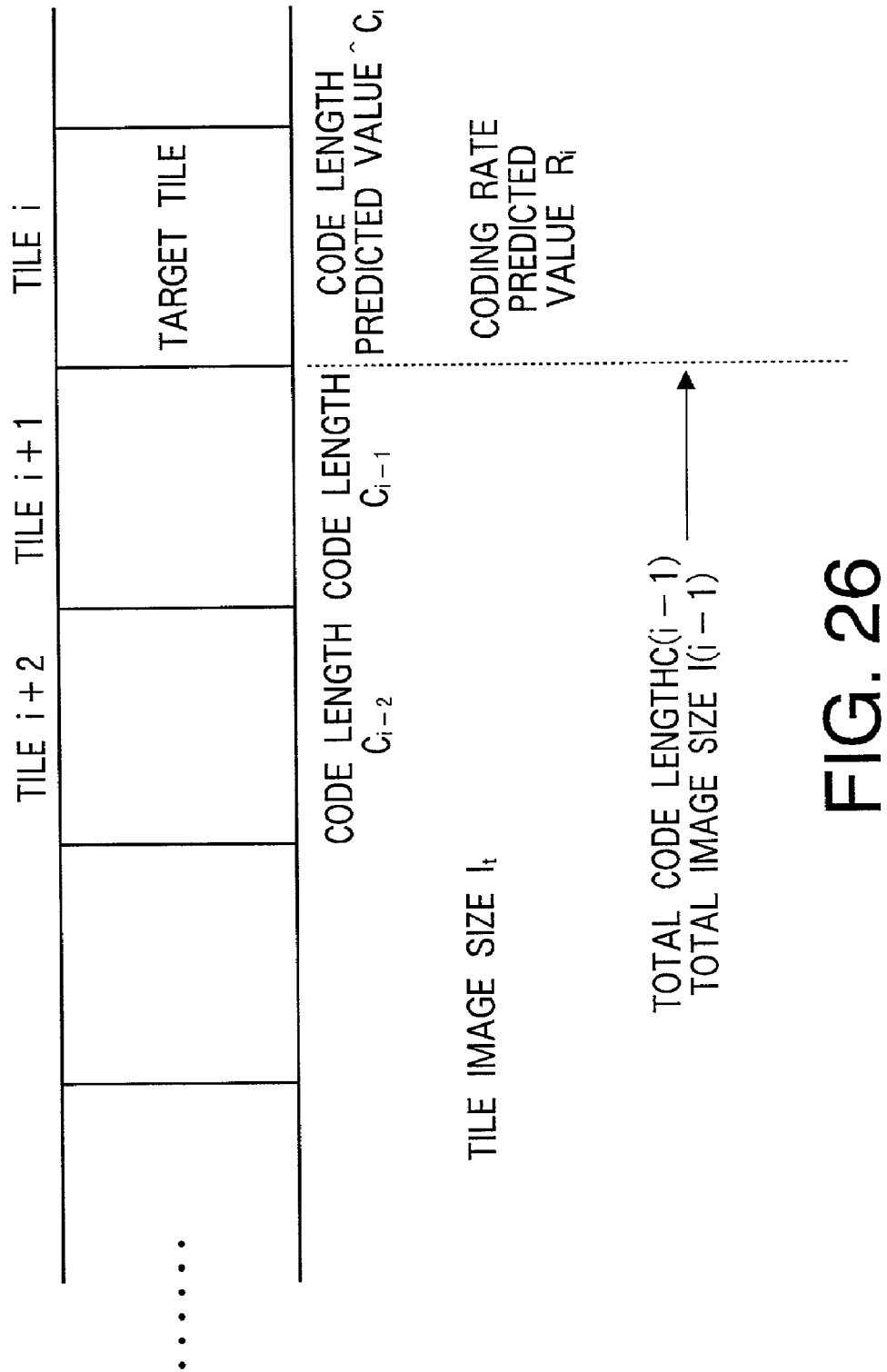
FIG. 26 illustrates contents of coding rate estimation processing.

First, symbols to be used in the following explanations will be defined as shown in FIG. 26. That is, suppose the tile to be coded now is the ith tile.

Suppose the tiles up to the (i−1)th tile are already coded.

Suppose the length of a code output from the (i−1)th tile is $c_{i-1}$. The amounts of coding of the (i−2)th and (i−3)th tile are also expressed in the same way.

The code length of tiles from the start of the page to the (i−1)th tile and the total value of image sizes are expressed as c(i−1) and I(i−1) respectively.

The unit of the amount of coding is a byte and the unit of the amount of image is the number of pixels.

Furthermore, suppose the image size (number of pixels) of one tile is It.

Based on this information, the amount of coding of the ith tile and coding rate are predicted.

Predicted values are distinguished with "^" attached and expressed as $\hat{C}_i$—1, $\hat{R}_i$−1, etc.

Figure 27:
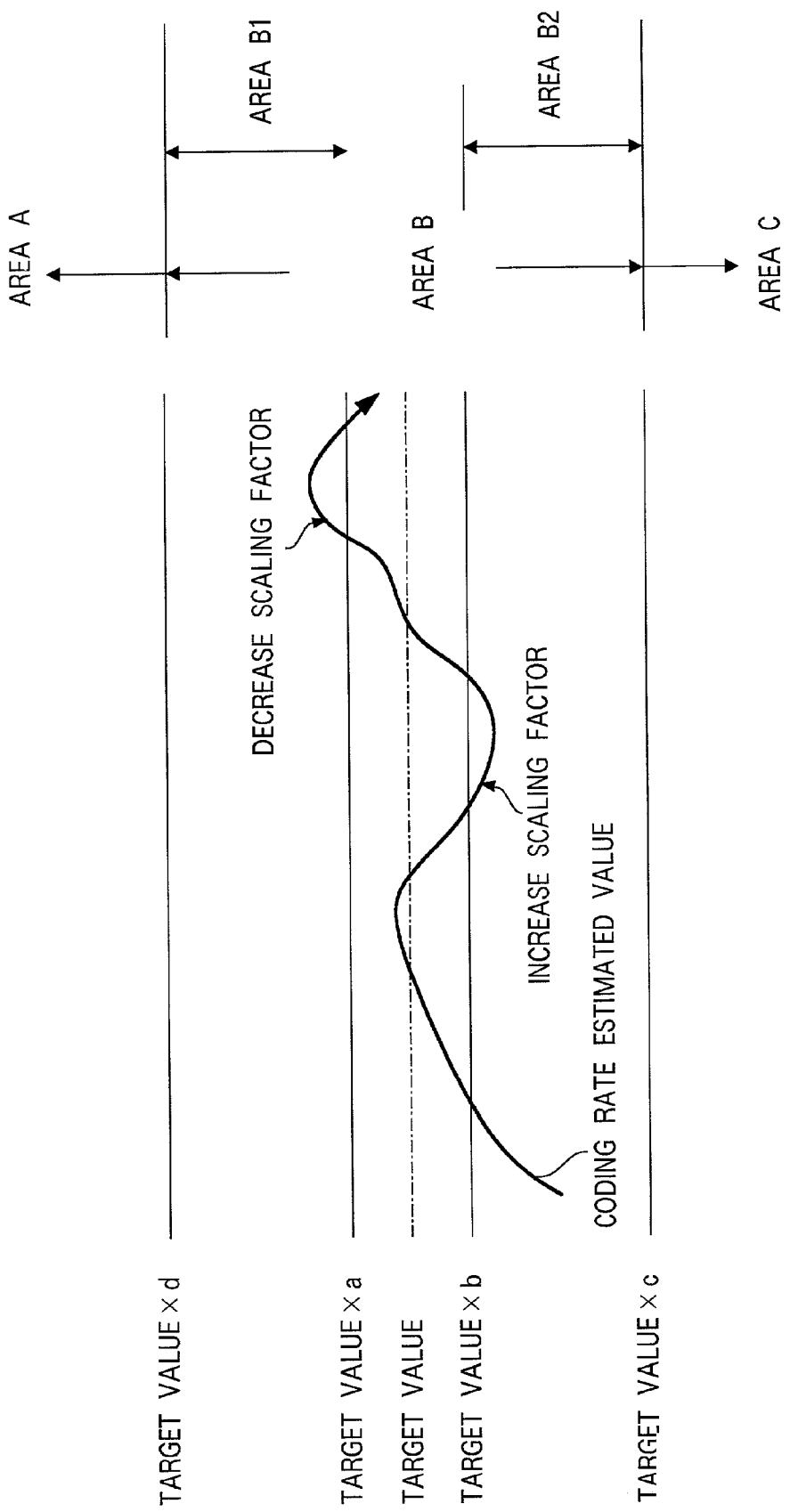
FIG. 27 illustrates a relationship between a variation of the coding rate and increment/decrement of the scaling factor.

FIG. 27 illustrates coding rate estimated values and increments/decrements of a scaling factor.

Suppose parameters given to the rate estimator are a target value of the coding rate, a times the target value as a parameter to define a predetermined range centered on the target value (hereinafter referred to as "target value×a"), likewise target value×b, target value×c and target value×d. Here, symbol "×" is a multiplication operator.

This embodiment assumes a=1.03, b=0.97, c=0.9, d=1.1.

As shown on the right side of FIG. 27, the area from target value×d above is area A, the area from target value×c below is area C, the area between target value×c and target value×d is area B. The inside of area B is divided into area B1 and area B2 as illustrated in the figure.

When the coding rate estimated value is smaller than a target value and exists in area C, the scaling factor is increased a great deal. On the contrary, when the coding rate is in area A, the scaling factor is decreased a great deal. Thus, converging to a target value is hastened.

In area B1 and area B2 near the target value, the scaling factor is adaptively changed according to a change of the rate estimated value.

Between area B1 and area B2 near the target value, the scaling factor is not changed.

By doing so, the coding rate changes less and stabilizes near the target value. The coding rate naturally locally changes depending on the complexity of images.

The scaling factor is controlled as shown above to quickly respond to local changes of the image and stabilize estimation in areas where changes to the image are small.

Figure 28:
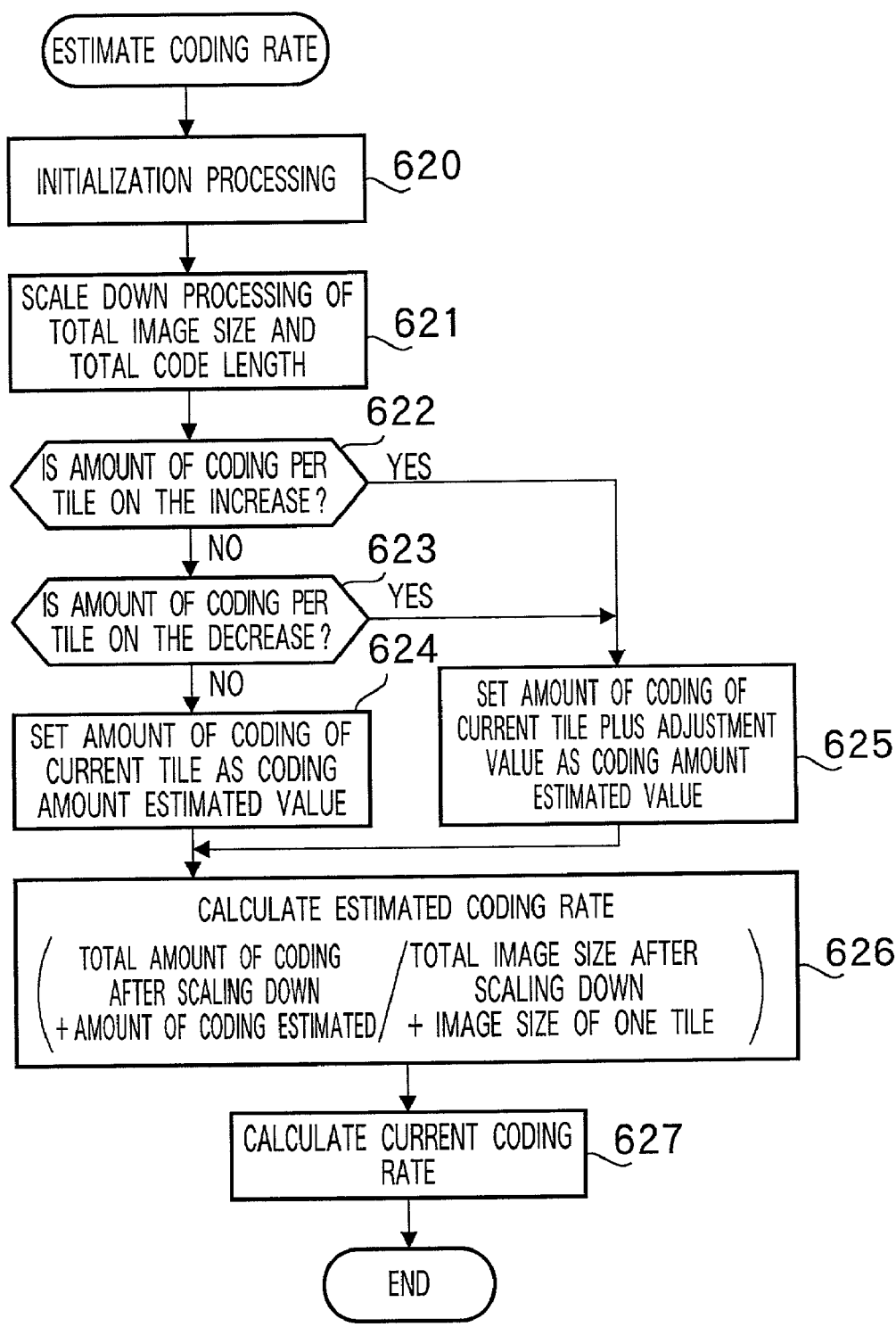
FIG. 28 is a flow chart showing an outline of a procedure of coding rate estimation processing.

An overview of the coding rate estimation procedure is as shown in FIG. 28. That is, after initialization processing (step 620), the total image size and total code length are reduced and the decrease in the estimated sensitivity due to an increase of the amount of coding is corrected (step 621).

Then, it is decided whether the amount of coding per tile tends to increase or not, or whether the amount of coding per tile tends to decrease or not (steps 622 and 623).

When the amount of coding per tile tends to increase, the amount of coding of the current tile is regarded as an estimated value of the amount of coding (step 624) and when the amount of coding per tile tends to decrease, the amount of coding of the current tile plus an adjustment value is regarded as an estimated value of the amount of coding (step 625).

Then, an estimate value of the coding rate is calculated using a predetermined method (step 626) and the current coding rate is calculated (step 627) and this completes one process.

With regard to estimation of the coding rate, there are two kinds of coding rate estimation value $\hat{R}i$ of the ith tile and these are calculated as follows.

$$\hat{R}i = 8*(\text{scale}\{c(i-1)\} + \hat{C}i)/(\text{scale}\{I(i-1)\} + It) \quad (5)$$

$$\hat{R}i(=Ri-1) = 8*C(i-1)/I(i-1) \quad (6)$$

where symbol * in Expression (5) denotes a multiplication, scale$\{c(i-1)\}$ and scale$\{I(i-1)\}$ denote values obtained by proportionally scaling down products of the code length by the amount of image, $C(i-1)$ and $I(i-1)$ so that a ratio $C(i-1)/I(i-1)$ is maintained.

That is, a relationship scale$\{c(i-1)\}$/scale$\{I(i-1)\}$=$c(i-1)/I(i-1)$ is set up. Of these two kinds of estimated value, Expression (5) is used in area B in FIG. 15 and Expression (6) is an estimated value used in area A and area C in FIG. 15. Expression (6) is the very coding rate at the time at which coding of the (i−1)th tile is completed.

This embodiment scales down scale$\{I(i-1)\}$ so as to fall within the range of the following expression so that scale$\{I(i-1)\}$ becomes almost equivalent to the number of pixels in the tile.

$$It < \text{scale}\{I(i-1)\} <= 2*It \quad (7)$$

An estimated value is set as shown in Expression (5) for the following reason (reason for performing scaling down of the amount of coding).

When an estimated value is tentatively defined as shown in Expression (8) below, the total amount of image $I(i-1)$ and total amount of coding $C(i-1)$ increase monotonously as the coding advances and it is more difficult to detect a change of $\hat{C}i$.

$$\hat{R}i = 8*(C(i-1) + \hat{C}i)/(I(i-1) + It) \quad (8)$$

That is, to prevent the sensitivity from becoming dull with time, scaling down is performed while maintaining the ratio of total amount of image $I(i-1)$ and total amount of coding $C(i-1)$.

This is the estimated value of Expression (5). The estimated value of Expression (5) contains elements of both the total value and an estimated value at each moment.

In this way, this embodiment achieves stabilization of an estimated value together with sensitivity to local variations of the image.

Where the image quality is uniform, estimation becomes accurate and where there is a violent local variation, the variation can be quickly detected.

Figure 29:
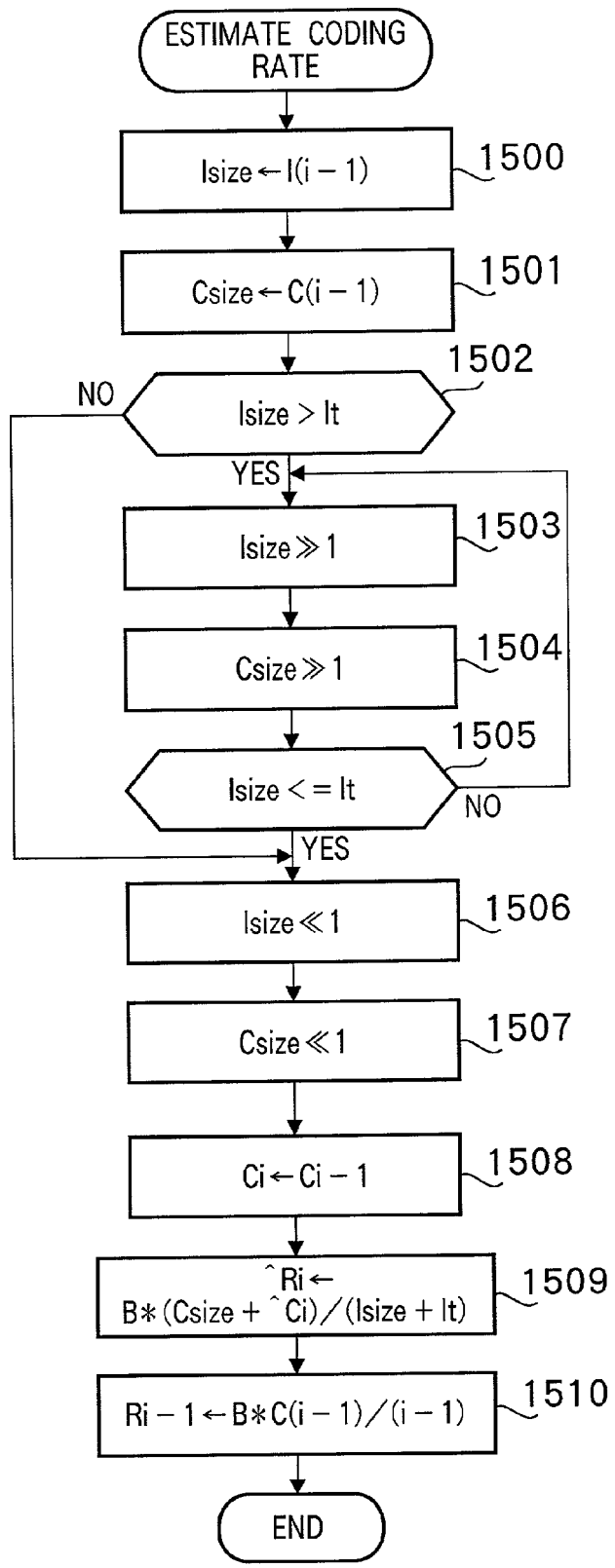
FIG. 29 is a flow chart showing a specific example of the procedure of coding rate estimation processing.

FIG. 29 expresses the above-described coding rate estimation operation with a flow chart.

In the flow chart, variables Isize and Csize are used which denote an amount of image and amount of coding respectively.

In process 1500 and process 1501, the total amount of image and total amount of coding are assigned to these variables. Process 1503 through process 1507 are the processes to calculate scale$\{I(i-1)\}$ and scale$\{C(i-1)\}$.

In process 1508, the amount of coding of the ith tile is predicted with the amount of coding of the immediately preceding tile. This is an example and it is also possible to use a more advanced time series prediction technique.

In process 1509 and process 1510, calculations in Expression (5) and Expression (6) are executed.

Next, an operation of scaling factor calculation will be explained.

As already explained in association with FIG. 27, a scaling factor is determined according to a difference between the coding rate predicted value and target value expressed by Expression (5) and Expression (6). The quantization step width is changed by this scaling factor and the amount of coding is thereby adjusted.

The predetermined range of the coding rate is area B in FIG. 27 and especially suppose the coding rate is controlled to fall within the range between target value×b near the target value and target value×a.

"Integer value scaling factor $\alpha i$" is designed to take a value −256 to +255. This value is mapped (one-to-one correspondence) to the "real number value scaling factor".

When the integer value scaling factor is changed by a small margin, the coding rate also changes by a small margin and when the integer value scaling factor is changed by a large margin, the coding rate also changes by a large margin.

Since the complexity of the image data changes from one location to another, the variation speed of the coding rate has been adapted by letting variation $\delta\alpha i$ of the scaling factor change according to the complexity of the image.

Figure 30A:
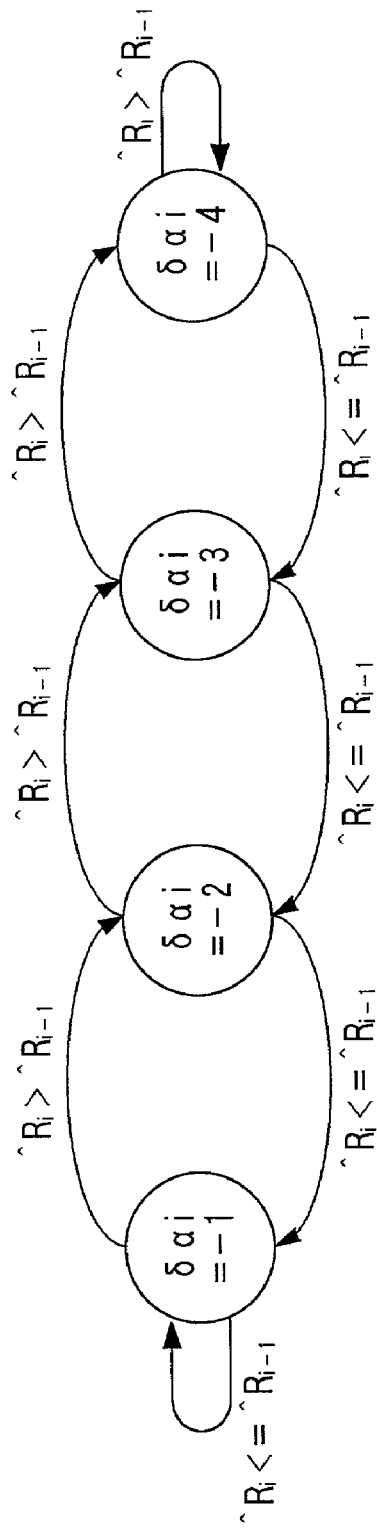
FIG. 30A illustrates a state transition of a scaling factor when a coding rate estimated value is in area B1 of FIG. 27.
Figure 30B:
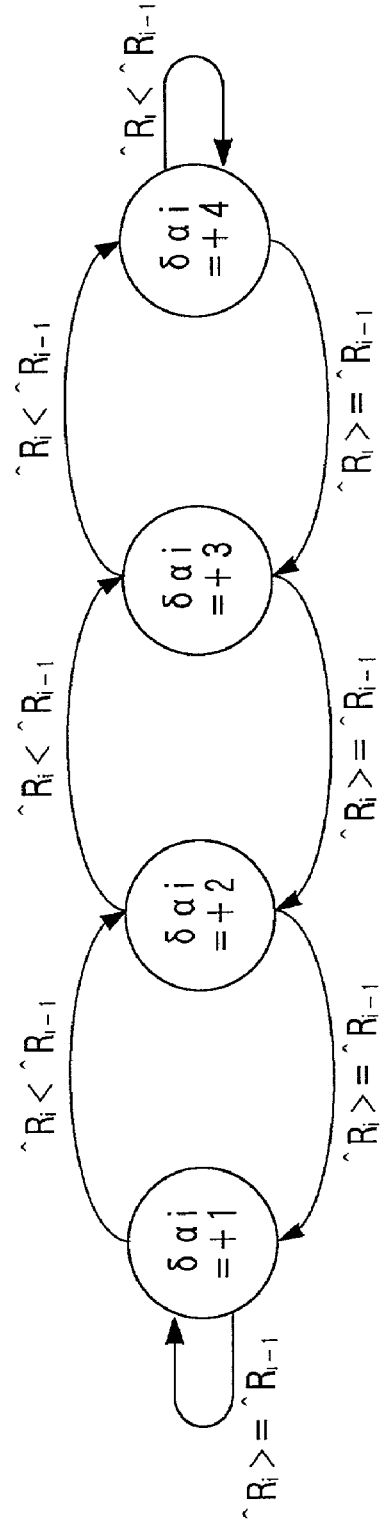
FIG. 30B illustrates a state transition of a scaling factor when a coding rate estimated value is in area B2 of FIG. 27.

A variation of the complexity of the image is detected from a change in the rate estimated value. FIG. 30A and FIG. 30B are state transition diagrams of $\delta\alpha i$ (amount of change of $\alpha i$ in one update) applicable to area B1 and area B2 in FIG. 27.

The same concept applies to both figures, and therefore FIG. 30A will be explained.

Since a coding rate predicted value exceeds a target value in area B1, $\alpha i$ must be reduced.

As shown in FIG. 30A, variation value $\delta\alpha i$ of the scaling factor takes four values of −1, −2, −3 and −4 and is determined by the status transition according to $\hat{R}i$.

For example, when $\delta\alpha i=-1$, if $\hat{R}i>\hat{R}i-1$, the image is assumed to change in a complicated direction, and therefore the image transitions to a state of $\delta\alpha i=-2$ with the variation of the scaling factor increased.

$\delta\alpha i$ is clamped with −1 and −4. Thus, by providing a plurality of values of $\delta\alpha i$ and allowing a state transition of the values, it is possible to easily adapt the variation speed of the coding rate.

As shown in FIG. 30B, control in area B2 is the same. This case is different from area B1 in that the scaling factor is changed in an incremental direction.

Figure 31:
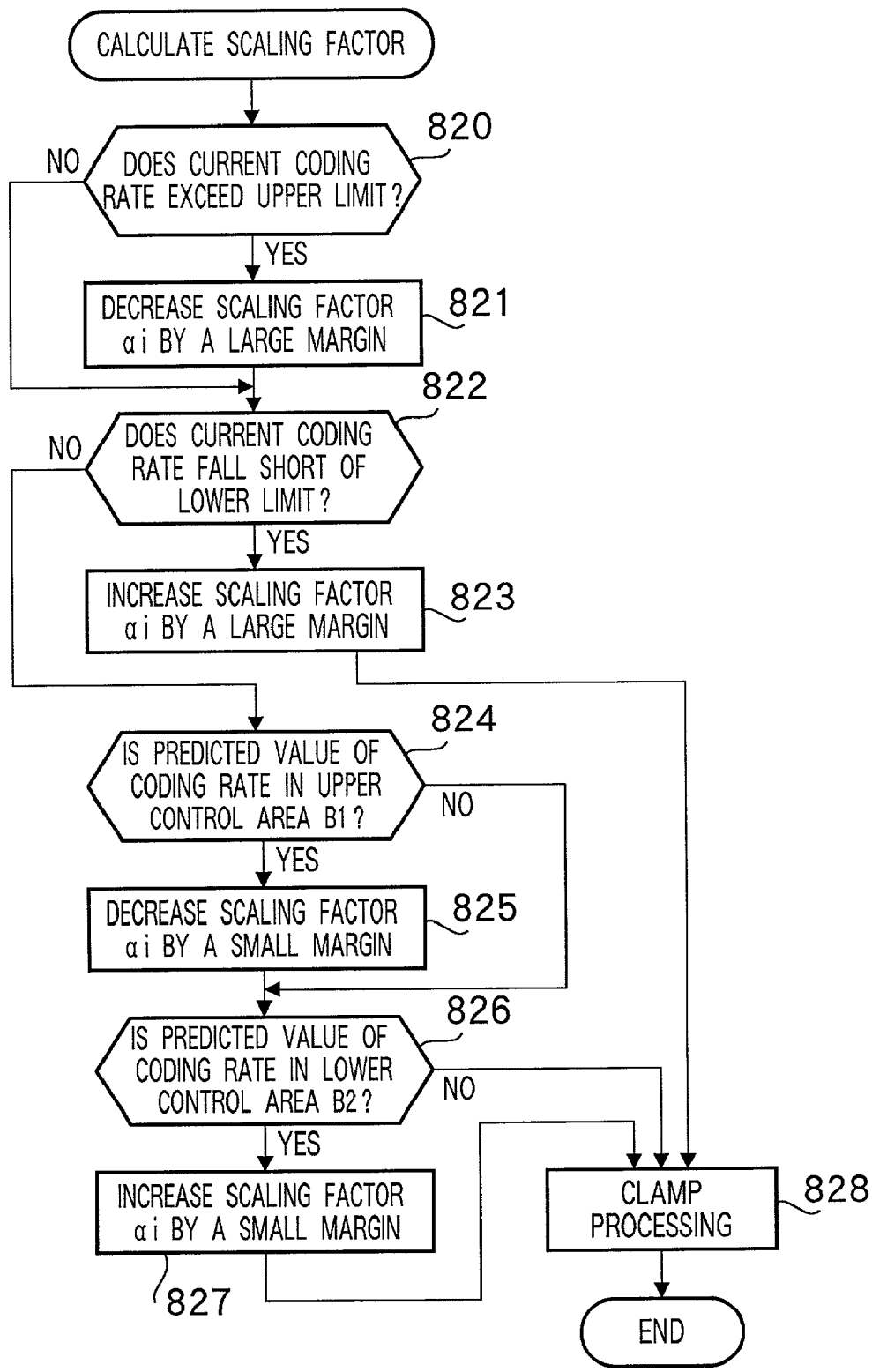
FIG. 31 is a flow chart showing an overview of a scaling factor calculation procedure.

An overview of the scaling factor calculation processing described above is as shown in FIG. 31.

First, it is decided whether the current coding rate exceeds an upper limit or not (step 820), and if the current coding rate exceeds the upper limit, scaling factor $\alpha i$ is reduced by a large margin (however step by step).

It is decided whether the current coding rate falls short of a lower limit (step 822) and if the current coding rate falls short of the lower limit, scaling factors $\alpha i$ is increased by a large margin (however step by step).

If the result of the decision in step 822 shows that the current coding rate does not fall short of the lower limit, it is then decided whether the predicted value of the coding rate is within upper limit control area B1 or not (step 824), and if the predicted value of the coding rate is within upper limit control area B1, scaling factor $\alpha i$ is reduced by a small margin (however step by step) (step 825).

Furthermore, it is decided whether the predicted value of the coding rate is within lower control area B2 or not (step 826), and if the predicted value of the coding rate is within lower control area B2, scaling factor αi is increased by a small margin (however step by step) (step 828).

Figure 32:
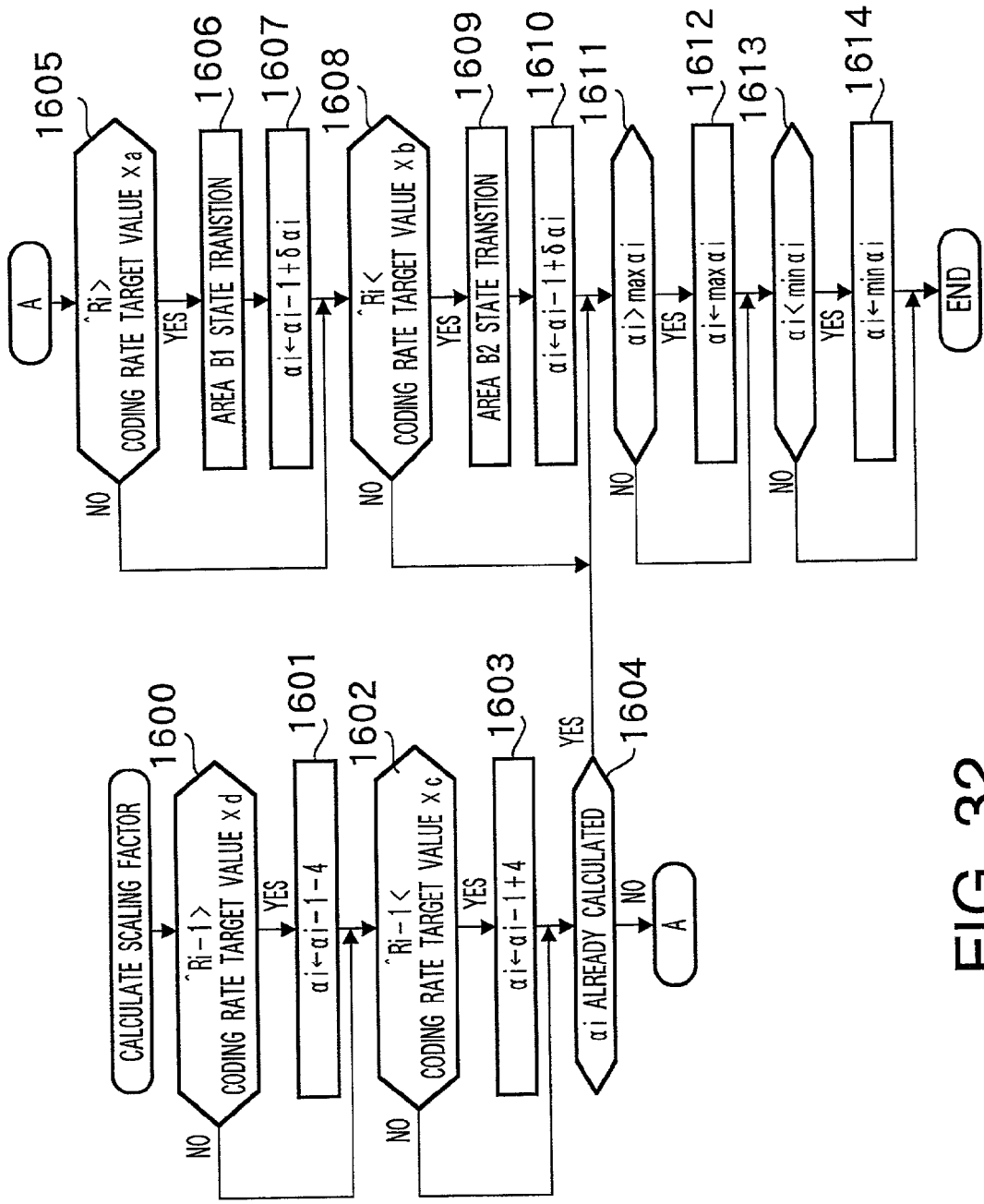
FIG. 32 is a flow chart showing a specific example of the scaling factor calculation procedure.

FIG. 32 shows a specific processing flow.

Process 1600 and process 1601 show the case where coding rate estimated value Ri−1 is within area A and "4" as a maximum value of δαi is subtracted so that the coding rate falls quickly.

Likewise, process 1602 and process 1603 show the case where coding rate estimated value Ri−1 is within area C and in this case, "4" as a maximum value of δαi is added so that the coding rate increases quickly.

Process 1604 decides whether αi is already determined by process 1601 or process 1603.

If αi is already determined, the process moves on to process 1611 and clamp processing of αi is performed.

maxαi of process 1611 is a maximum value of αi and is "255". minαi of process 1613 is a minimum value and denotes "−256".

Process 1605 through process 1607 correspond to processes to determine δαi in area B1.

Likewise, process 1608 through process 1610 correspond to processes to determined δαi in area B2.

Then, mapping from integer value scaling factor αi to real number value scaling factor βi will be explained.

First, a relationship between a scaling factor and a coding rate will be explained.

In the case of orthogonal transformation coding such as DCT, it is known that the step width of a quantizer and entropy Hq of the quantizer output signal can be approximated with the following relational expression based on a rate distortion theory.

$$Hq=(1/L\delta)\log e\Pi(\in j\delta j2/\Delta j2) \qquad (9)$$

where, L denotes the number of sub-bands. In the case of DCT with a block size of 8 pixels and 8 pixels, a block is divided into 64 sub-bands, and therefore the block size in this embodiment is L=64.

Δj denotes the quantization step width of sub-band j.

δj2 denotes signal energy of sub-band j, ∈j denotes a constant determined for each sub-band j. δ is a constant and Π denotes calculation of products from sub-band j=0 to j=L−1.

When Δj is scaled with scaling factor β, the quantization step width is floor(Δj/β), but this is a nonlinear function and difficult to handle, and is therefore approximated with a continuous function as Δj/β. Expression (13) is then expressed as follows.

$$Hq=(1/L\delta)\log e\Pi(\in j\delta j2\beta2/\Delta j2) \qquad (10)$$

When applied to this embodiment, Δj is the quantization step width set in a quantization table and β is a scaling factor with a real number value.

Hq expresses entropy after quantization, but can be coded with a number of bits extremely close to this entropy by arithmetic coding, and therefore Hq expresses the amount of coding.

As is apparent from Expression (10), a variation of the coding rate corresponding to a variation of β is differentiation of Hq with respect to β and is expressed as follows.

$$dHq/d\beta=2/\delta\beta \qquad (11)$$

As is clear from this expression, it is known that the variation of the coding rate is approximately inversely proportional to scaling factor βi.

In this embodiment, real number value scaling factor βi is calculated by 1:1 mapping from integer value scaling factor αi. At this time, it is desirable to perform mapping in such a way that a variation of the coding rate can be kept almost constant irrespective of the value of αi.

This is because, as already explained, the coding rate variation speed according to the complexity of an image is adapted by applying state transition to δαi when αi is calculated.

Since the rate variation with respect to βi is proportional to the inverse number of βi, a variation of βi with respect to αi is set to be a mapping function proportional to variable αi, that is, the variation of βi with respect to αi is set so that differentiation of βi with respect to αi, that is, dβi/αi becomes a linear function.

Figure 33:
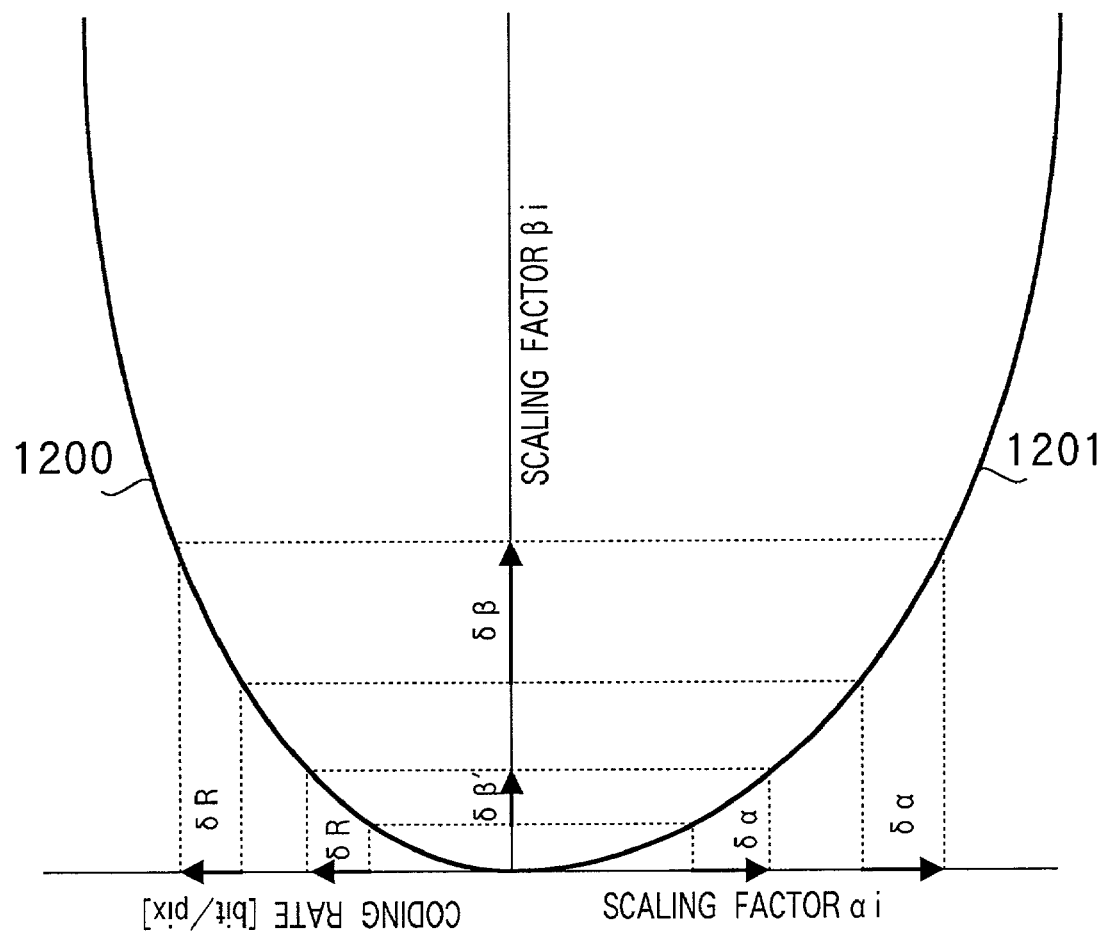
FIG. 33 illustrates a mutual relationship between the coding rate, scaling factor $\beta i$ with a real number value and scaling factor $\alpha i$ of an integer value.

FIG. 33 shows this relationship.

Function 1200 expresses a relationship between βi and the coding rate and function 1201 indicates the correspondence between αi and βi. This makes variation δR of the coding rate with respect to variation δα of αi, almost constant irrespective of the value of αi.

That is, in FIG. 33, suppose the coding rate is changed by δR.

Variation δα of integer value scaling factor α with respect to this is δR is constant regardless of the range in which α is (however, the variation width of scaling factor β with a real number value corresponding thereto varies depending on the range in which β is (δβ and δβ" in FIG. 21)).

Thus, by simply adjusting the scaling factor (α) with an integer value according to the variation with of the coding rate without considering the position of the scaling factor (α) with an integer value, it is possible to generate a scaling factor (β) with an appropriate real number value accordingly, which makes adjustment quite simple.

It would be extremely complicated to directly calculate a scaling factor with a real number corresponding to the variation of the coding rate without using the above-described method.

The range of real number value scaling factor βi is experimentally set to 0.3 to approximately 8.0 and the following expression is used as a mapping function. The mapping function can be determined likewise also when mapping is performed to a range of different βi.

$$\beta i=0.00003\ (\alpha i+256)2+0.3 \qquad (12)$$

It is possible to find a relationship between αi and βi from this expression and set that relationship in ROM (lookup table system). This makes it possible to generate a real number value scaling factor by only accessing ROM and render complicated calculations unnecessary.

That is, mutual relationships between the coding rate, the scaling factor (α) with an integer value and the scaling factor (β) with a real number value so that the differentiation value of the function (f1) to generate the scaling factor (β) with a real number value from the scaling factor (α) with an integer value is a reverse number of the differentiation value of the function (f2) indicating the relationship of the scaling factor (β) with a real number value with respect to the coding rate.

Thus, by simply adjusting the scaling factor (α) with an integer value according to the variation width of the coding rate without considering the position of the scaling factor (α) with an integer value, it is possible to automatically generate a scaling factor (β) with an appropriate real number value, which makes adjustment quite simple.

That is, using a technique of converting an integer value to a real number value and thereby coding the integer value, the amount of coding is reduced and a mutual relationship between the coding rate, integer value and real number value is optimized. This makes it possible to automatically generate a real number value scaling factor to compensate for a variation in the coding rate without complicated calculations.

As described above, the present invention performs feedback control over the quantization step width tile by tile so that the coding rate falls within a predetermined range.

Coding rate control consists of finding an estimated value of the coding rate based on the sizes of images and the amount of coding processed so far prior to coding of each tile and calculating a scaling factor to determine a quantization step width so that the estimated value falls within a predetermined range.

For the scaling factor, the correspondence between an integer value and real number value is found and only scaling factors with integer values are coded to reduce the amount of coding.

On the other hand, the correspondence between integer values and real number values is set so as to have a relationship as shown in FIG. 33.

When a scaling factor is calculated, this makes the rate variation speed adaptable to the complexity of an image.

With respect to partial image decoding, it is possible to reset the variable-length coder for each tile and handle the partial image as if it were an independent image.

The coding performance of the present invention described above is verified with a simulation.

That is, according to the coding system of the present invention, since valuable information is saved more accurately than the conventional art using tile-by-tile image area decision and layering in tiles, it is apparent that the quality of reproduced images of characters in particular will improve.

However, in coding processing, not only the quality of the reproduced image but also high compressibility are extremely important elements. That is, it is important to the present invention what kind of influence an increase in the amount of information caused by layering has on the compressibility.

Therefore, the following simulation will examine the amount of coding (compressibility) in the system of the present invention.

Figure 34:
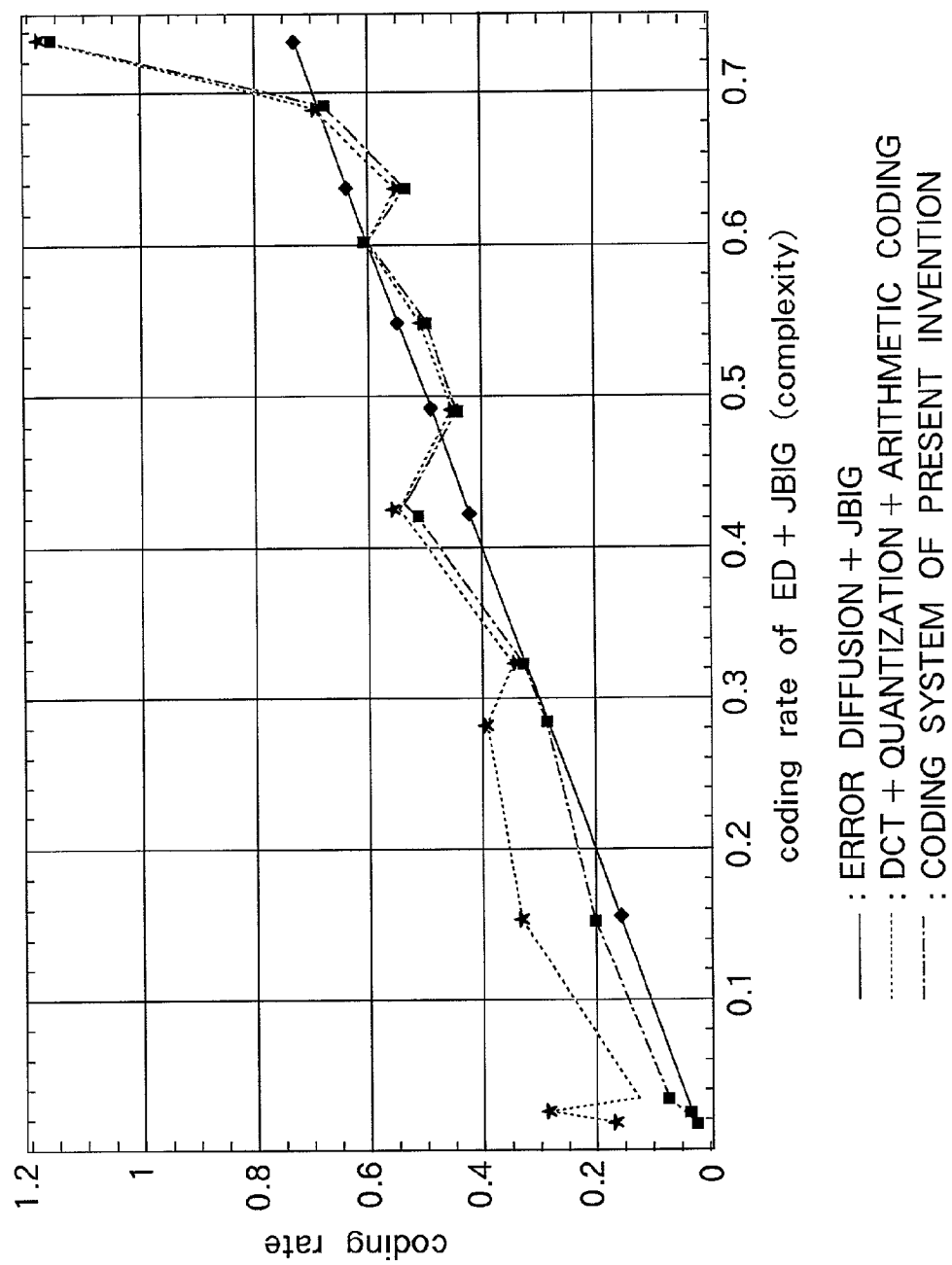
FIG. 34 illustrates compression performance according to the coding system of the present invention compared to compression performance according to other coding systems.

FIG. 34 shows a comparison of compression performance among various systems.

Three types of systems are compared; ① system according to the present invention (single-dot dashed line), ② error diffusion+JBIG (solid line) and ③ DCT+quantization+arithmetic coding (dotted line).

The compression targets are mixed images (images made up of character images, photographic images and a mixture of characters and photos).

The error diffusion+JBIG is a standard compression system of a composite machine using a binary printer. This system provides extremely high efficiency for document images.

The DCT+quantization+arithmetic coding is presented here as a comparison target representative of JPEG-like orthogonal transformation coding. The horizontal axis in FIG. 34 denotes a coding rate of error diffusion+JBIG and measures the complexity of an image by the code length.

In FIG. 34, the left area corresponds to a document image, right area corresponds to a photo image and the intermediate area shows various mixed images. The vertical axis shows the coding rates of the above-described three systems. Dotted line shows DCT+quantization+arithmetic coding, single-dot dashed line shows the system according to the present invention and solid line shows error diffusion+JBIG. This means that as a line comes closer to the solid line, the amount of coding comes closer to that of error diffusion+JBIG (that is, high compressibility of character images in particular).

The DCT+quantization+arithmetic coding provides coding efficiency 8 times greater than that of the error diffusion+JBIG when applied to document images.

This system is almost the same as the error diffusion+JBIG and has even greater compressibility than the error diffusion+JBIG in some images.

It is also known that this system has a smaller amount of coding than the DCT+quantization+arithmetic coding also for a mixed image and photographic image.

Figure 35:
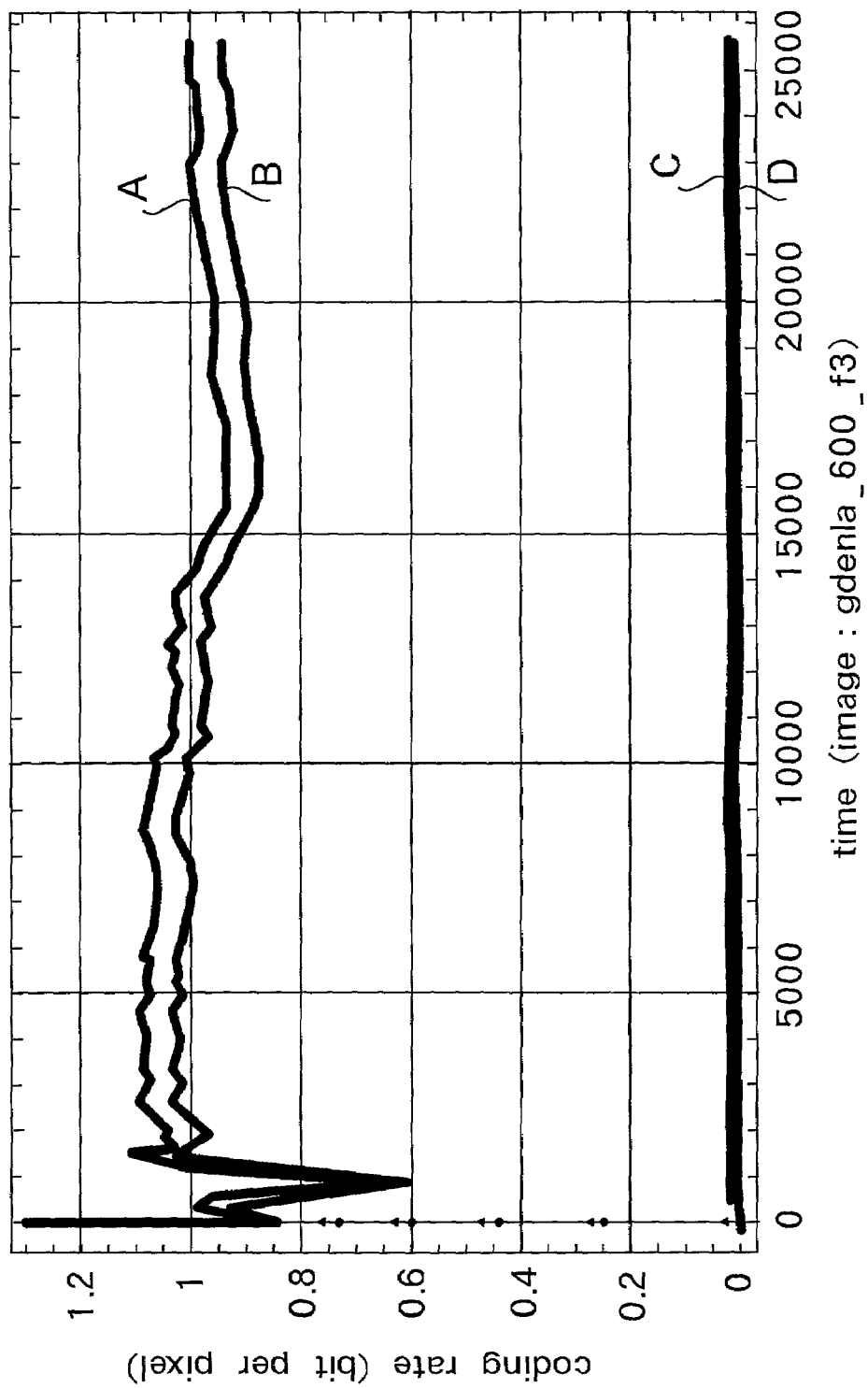
FIG. 35 is a characteristic diagram showing variation suppression effects of coding rate negative feedback control according to the present invention.

FIG. 35 shows effects of feedback control over the coding rate.

The test image used is No. 1 chart (mixture of characters and photo) of the Image Electronics Society.

The horizontal axis expresses tile numbers and is the same as the time. The vertical axis expresses coding rates. The predetermined range is set to a range of ±10% centered on 1.0 bit/pixel.

In the figure, characteristic "A" denotes an overall coding rate, characteristic "B" denotes a time variation of the coding rate of BG information. Though characteristics "C" and "D" overlap with each other, they denote bitmap information and FG information respectively.

All characteristics are stable. The final coding rate is 1.003 bits/pixel.

It is observed that the coding rates are controlled within a predetermined range.

As shown above, the present invention uses image area decision in tile (macro block) units, layering in tiles and approximation processing together and performs negative feedback control over the coding rate and thereby seeks an ultimate image quality regardless of the type of the image. On the other hand, its high efficiency compression makes it possible to reduce the amount of coding and exploit the performance of the apparatus to the full to realize realistic and stable coding processing.

The present invention is not limited to the above described embodiments, and various variations and modifications may be possible without departing from the scope of the present invention.

This application is based on the Japanese Patent Application No. 2001-047068 filed on Feb. 22, 2001 entire content of which is expressly incorporated by reference herein.

What is claimed is:

1. An image coding method comprising:
    deciding the type of an image in tile units and deciding the type of each tile according to the image type deciding result;
    grouping all pixels included in a predetermined type of tile into pixels belonging to a first layer and pixels belonging to a second layer pixel by pixel; and
    performing different kinds of signal processing on the pixels belonging to said first layer and the pixels belonging to said second layer and then coding the processed signals.

2. An image coding method comprising:
    deciding whether each tile of an input image is a character image or a photographic image and grouping each tile into a character tile or photographic tile according to the deciding result;

grouping all pixels that belong to the character tile into pixels belonging to a foreground and pixels belonging to a background pixel by pixel;

deciding which of first signal processing suitable for compression of photographic images or second signal processing suitable for compression of bi-level images should be applied to each of the pixels belonging to the character tile pixel by pixel with reference to the result of grouping all pixels and performing either the first or second signal processing on brightness information of each pixel according to the decision; and performing variable-length coding on information resulting from the first or second signal processing.

3. The image coding method according to claim 2, wherein the first signal processing comprises orthogonal transformation and quantization processing, and the second signal processing comprises approximation processing that approximates brightness values of a plurality of pixels with a single typical value and the variable-length coding comprises arithmetic coding.

4. An image coding method comprising:

deciding whether each tile of an input image is a character image or a photographic image and grouping each tile as a character tile or a photographic tile according to the deciding result;

grouping all pixels included in the character tile into pixels belonging to a foreground and pixels belonging to a background pixel by pixel and acquiring bitmap information indicating whether each pixel belongs to the foreground or background;

deciding whether or not it is possible to apply approximation processing which approximates brightness values of all pixels belonging to the foreground of the character tile or brightness values of all pixels belonging to the background with one typical value;

deciding whether or not it is possible to apply approximation processing which approximates brightness values of all pixels included in the photographic tile with one typical value;

applying orthogonal transformation and quantization processing to brightness information of all pixels of the photographic tile to which approximation processing is not applicable and to brightness information of all pixels in the character tile to which approximation processing is not applicable; and applying variable-length coding to information indicating whether the approximation processing is applicable or not to information of an approximate value indicating the result of the approximation processing, to information on the brightness resulting from the orthogonal transformation and quantization processing and the bitmap information.

5. The image coding method according to claim 4, further comprising predicting a coding rate when the variable-length coding is applied to the next tile and adaptively changing the quantization step width in the quantization processing based on the predicted value so that the coding rate falls within a predetermined range.

6. The image coding method according to claim 4, further comprising predicting a coding rate when the next tile is subjected to the variable-length coding, generating a scaling factor ($\alpha$) with an integer value to adaptively change the quantization step width in the quantization processing based on the predicted value so that the coding rate falls within a predetermined range, generating a scaling factor ($\beta$) with a real number value having a one-to-one correspondence with the scaling factor ($\alpha$) and changing the quantization step width in the quantization processing using the scaling factor ($\beta$).

7. The image coding method according to claim 6, wherein a correlation between a coding rate, the integer value scaling factor ($\alpha$) and the real number value scaling factor ($\beta$) is determined so that a differentiation value of a function (f1) to generate the real number value scaling factor ($\beta$) from the integer value scaling factor ($\alpha$) becomes the inverse of a function (f2) indicating a relationship of the real number value scaling factor ($\beta$) with said the coding rate.

8. An image coding apparatus comprising:

an image area decider that groups an input image into character image tiles and photographic image tiles;

a layering section that groups each pixel into one of a plurality of predetermined layers based on the brightness level of each pixel included in at least one tile among character image tiles or photographic image tiles and generates bitmap information indicating the layer in which each pixel is included;

an approximation processor that decides, based on brightness information of said input image, whether or not it is possible to approximate a plurality of image brightness values with one typical value in tile units or using said layer as a unit and performs approximation processing when approximation is possible;

an orthogonal transformation/quantization section that performs orthogonal transformation and quantization on brightness information for which bi-level approximation is not possible; and a coder that applies variable-length coding to data of the approximate value resulting from the approximation processing, data resulting from said orthogonal transformation and quantization, said bitmap information indicating the layer to which each pixel in said tile belongs and information indicating whether or not approximation processing is possible.

9. The image coding apparatus according to claim 8, further comprising a coding rate controller that predicts a coding rate based on the amount of image already coded and adaptively decides the quantization step width used in the quantization processing by said orthogonal transformation/quantization section based on the predicted value so that the coding rate falls within a predetermined range.

10. The image coding apparatus according to claim 9, wherein said coding rate controller predicts a coding rate, generates an integer value scaling factor ($\alpha$) to adaptively change said quantization step width in said quantization processing based on the predicted value so that the coding rate falls within a predetermined range, generates a scaling factor ($\beta$) with a real number value having a one-to-one correspondence with the integer value scaling factor ($\alpha$) and inputs the real number value scaling factor ($\beta$) to said orthogonal transformation/quantization section.

11. The image coding apparatus according to claim 10, wherein a correlation between a coding rate, the integer value scaling factor ($\alpha$) and the real number value scaling factor ($\beta$) is predetermined so that a differentiation value of a function (f1) to generate the real number value scaling factor ($\beta$) from the integer value scaling factor ($\alpha$) is the inverse of a function (f2) indicating a relationship of said real number value scaling factor ($\beta$) with said coding rate.

12. A coding rate control apparatus comprising:

a coding rate estimator that divides a multi-valued image into tiles of a predetermined size and estimates the coding rate of the tile based on the amount of image already coded when coding is performed after signal processing including quantization processing;

a first scaling factor generator that generates an integer value scaling factor ($\alpha$) to adaptively change the quantization step width in said quantization processing according to the coding rate estimation result; and a second scaling factor generator that generates a scaling factor ($\beta$) with a real number value having a one-to-one correspondence with the integer value scaling factor ($\alpha$) and supplies the real number value scaling factor ($\beta$) to a quantizer that performs said quantization processing.

13. The coding rate control apparatus according to claim 12, wherein a correlation between a coding rate, the integer value scaling factor ($\alpha$) and said the real number value scaling factor ($\beta$) is predetermined so that a differentiation value of a function (f1) to generate the real number value scaling factor ($\beta$) from said the integer value scaling factor ($\alpha$) becomes the inverse of a function (f2) indicating a relationship of said the real number value scaling factor ($\beta$) with said coding rate.

* * * * *